United States Patent
Yamazaki et al.

(10) Patent No.: US 12,218,247 B2
(45) Date of Patent: Feb. 4, 2025

(54) SEMICONDUCTOR DEVICE AND MANUFACTURING METHOD OF THE SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Ryota Hodo, Kanagawa (JP); Tetsuya Kakehata, Kanagawa (JP); Shinya Sasagawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 462 days.

(21) Appl. No.: 17/606,830

(22) PCT Filed: Apr. 27, 2020

(86) PCT No.: PCT/IB2020/053912
§ 371 (c)(1),
(2) Date: Oct. 27, 2021

(87) PCT Pub. No.: WO2020/229914
PCT Pub. Date: Nov. 19, 2020

(65) Prior Publication Data
US 2022/0216341 A1    Jul. 7, 2022

(30) Foreign Application Priority Data
May 10, 2019    (JP) .................. 2019-089646

(51) Int. Cl.
*H01L 29/786*    (2006.01)
*H01L 21/311*    (2006.01)
(Continued)

(52) U.S. Cl.
CPC .... *H01L 29/7869* (2013.01); *H01L 21/31116* (2013.01); *H01L 21/3212* (2013.01); *H01L 21/8221* (2013.01); *H01L 29/66742* (2013.01)

(58) Field of Classification Search
CPC .......... H01L 29/7869; H01L 21/31116; H01L 21/3212; H01L 29/66742; H01L 21/8221;
(Continued)

(56) References Cited

U.S. PATENT DOCUMENTS 8,455,868 B2    6/2013    Yamazaki et al.
8,547,771 B2    10/2013   Koyama
(Continued)

FOREIGN PATENT DOCUMENTS

CN    107710392 A    2/2018
CN    110402497 A    11/2019
(Continued)

OTHER PUBLICATIONS

International Search Report (Application No. PCT/IB2020/053912) Dated Aug. 4, 2020.
(Continued)

*Primary Examiner* — Yara B Green
*Assistant Examiner* — Akhee Sarker-Nag
(74) *Attorney, Agent, or Firm* — NIXON PEABODY LLP; Jeffrey L. Costellia

(57) ABSTRACT

A transistor with a high on-state current and a semiconductor device with high productivity are provided. Included are a first oxide, a second oxide, a third oxide, and a fourth oxide over a first insulator; a first conductor over the third oxide; a second conductor over the fourth oxide; a second insulator over the first conductor; a third insulator over the second conductor; a fifth oxide positioned over the second oxide and between the third oxide and the fourth oxide; a sixth oxide over the fifth oxide; a fourth insulator over the sixth
(Continued)

oxide; a third conductor over the fourth insulator; and a fifth insulator over the first insulator to the third insulator. The fifth oxide includes a region in contact with the second oxide to the fourth oxide and the first insulator. The sixth oxide includes a region in contact with the fifth oxide, the first conductor, and the second conductor. The fourth insulator includes a region in contact with at least the sixth oxide, the third conductor, and the fifth insulator.

4 Claims, 36 Drawing Sheets

(51) Int. Cl.
*H01L 21/321* (2006.01)
*H01L 21/465* (2006.01)
*H01L 21/66* (2006.01)
*H01L 21/822* (2006.01)
*H01L 27/06* (2006.01)
*H01L 27/12* (2006.01)
*H01L 29/66* (2006.01)
*H10B 12/00* (2023.01)
*H10B 41/70* (2023.01)

(58) Field of Classification Search
CPC ............. H01L 27/0629; H01L 27/0688; H01L 27/1207; H01L 21/465; H01L 27/105; H01L 29/78648; H10B 12/00; H10B 41/70; H10B 99/00
See application file for complete search history.

(56) References Cited

U.S. PATENT DOCUMENTS

| | | | |
|---|---|---|---|
| 9,893,192 B2 | 2/2018 | Tanaka et al. | |
| 9,954,003 B2 | 4/2018 | Matsuda et al. | |
| 10,693,013 B2 | 6/2020 | Toriumi et al. | |
| 10,727,355 B2 | 7/2020 | Yamazaki | |
| 2011/0156027 A1 | 6/2011 | Yamazaki et al. | |
| 2012/0032730 A1 | 2/2012 | Koyama | |
| 2014/0110708 A1 | 4/2014 | Koezuka et al. | |
| 2014/0319516 A1* | 10/2014 | Tanaka | H01L 29/78618 257/43 |
| 2015/0263175 A1 | 9/2015 | Koyama | |
| 2016/0240684 A1* | 8/2016 | Yamazaki | H01L 27/1225 |
| 2016/0260838 A1* | 9/2016 | Yamazaki | H01L 29/78603 |
| 2016/0300952 A1* | 10/2016 | Toriumi | H01L 27/1225 |
| 2017/0025548 A1* | 1/2017 | Yamazaki | H01L 27/14616 |
| 2017/0236842 A1 | 8/2017 | Matsuda et al. | |
| 2020/0006567 A1* | 1/2020 | Endo | H01L 21/02483 |
| 2020/0357925 A1 | 11/2020 | Toriumi et al. | |
| 2021/0159342 A1 | 5/2021 | Asami | |

FOREIGN PATENT DOCUMENTS

| | | |
|---|---|---|
| JP | 2011-151383 A | 8/2011 |
| JP | 2012-257187 A | 12/2012 |
| JP | 2014-225656 A | 12/2014 |
| JP | 2016-167595 A | 9/2016 |
| JP | 2016-201541 A | 12/2016 |
| JP | 2017-147445 A | 8/2017 |
| KR | 2017-0096956 A | 8/2017 |
| KR | 2017-0137125 A | 12/2017 |
| KR | 2019-0129891 A | 11/2019 |
| TW | 201705490 | 2/2017 |
| WO | WO-2016/166628 | 10/2016 |
| WO | WO-2016/166635 | 10/2016 |
| WO | WO-2018/150295 | 8/2018 |
| WO | WO-2018/178793 | 10/2018 |

OTHER PUBLICATIONS

Written Opinion (Application No. PCT/IB2020/053912) Dated Aug. 4, 2020.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

* cited by examiner

FIG. 2A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 2B
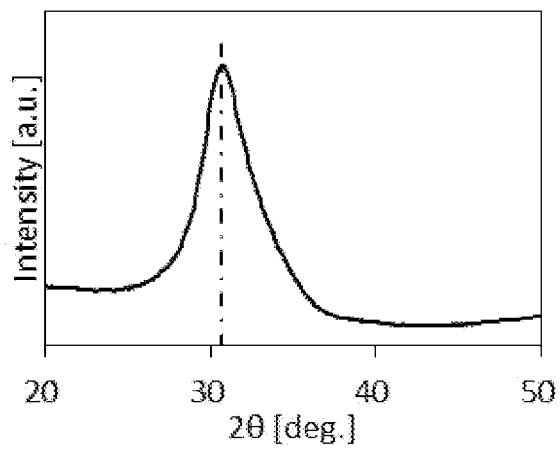
FIG. 2C
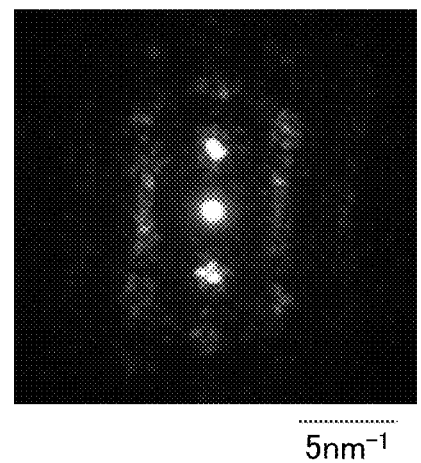

205
230a,230b,243B,242B,271B

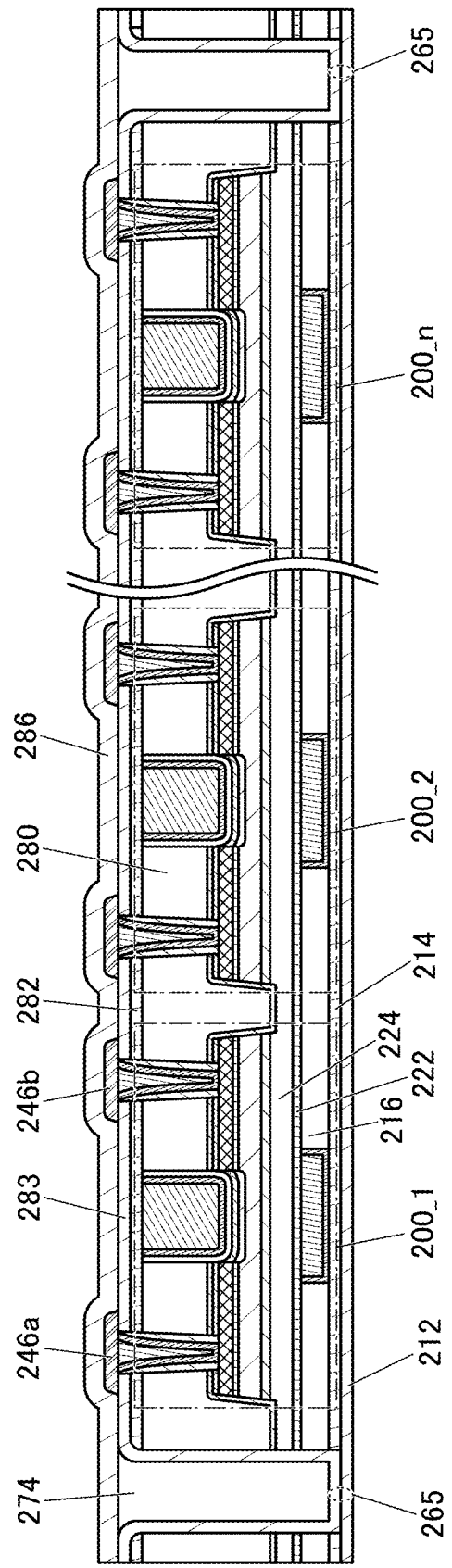
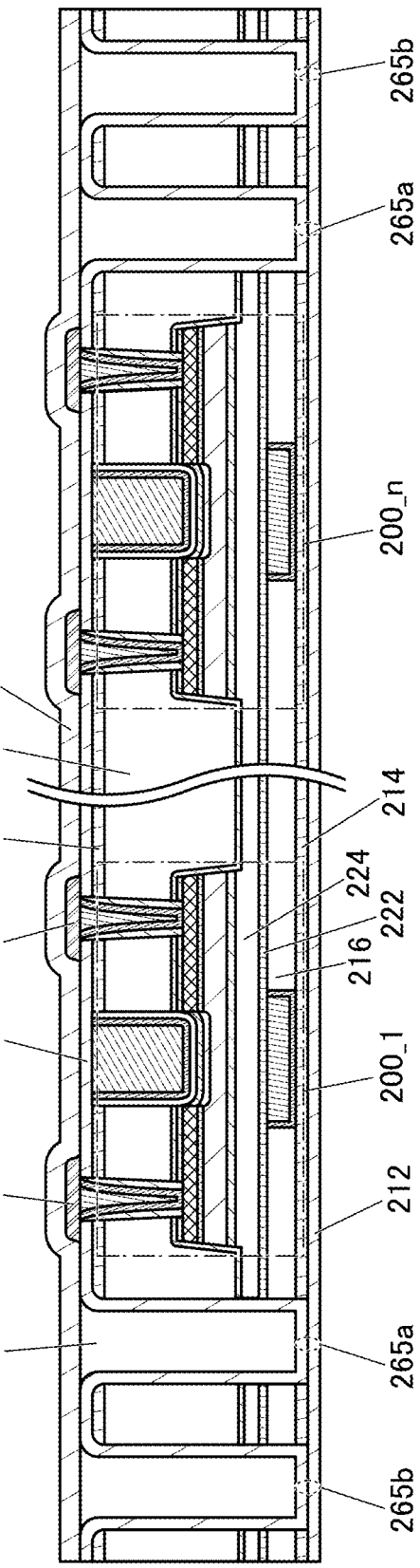

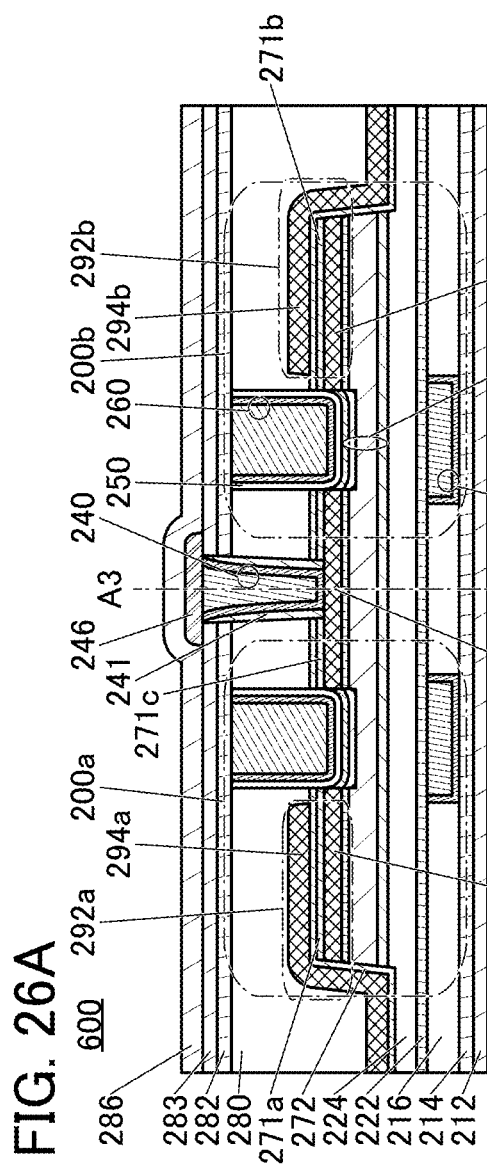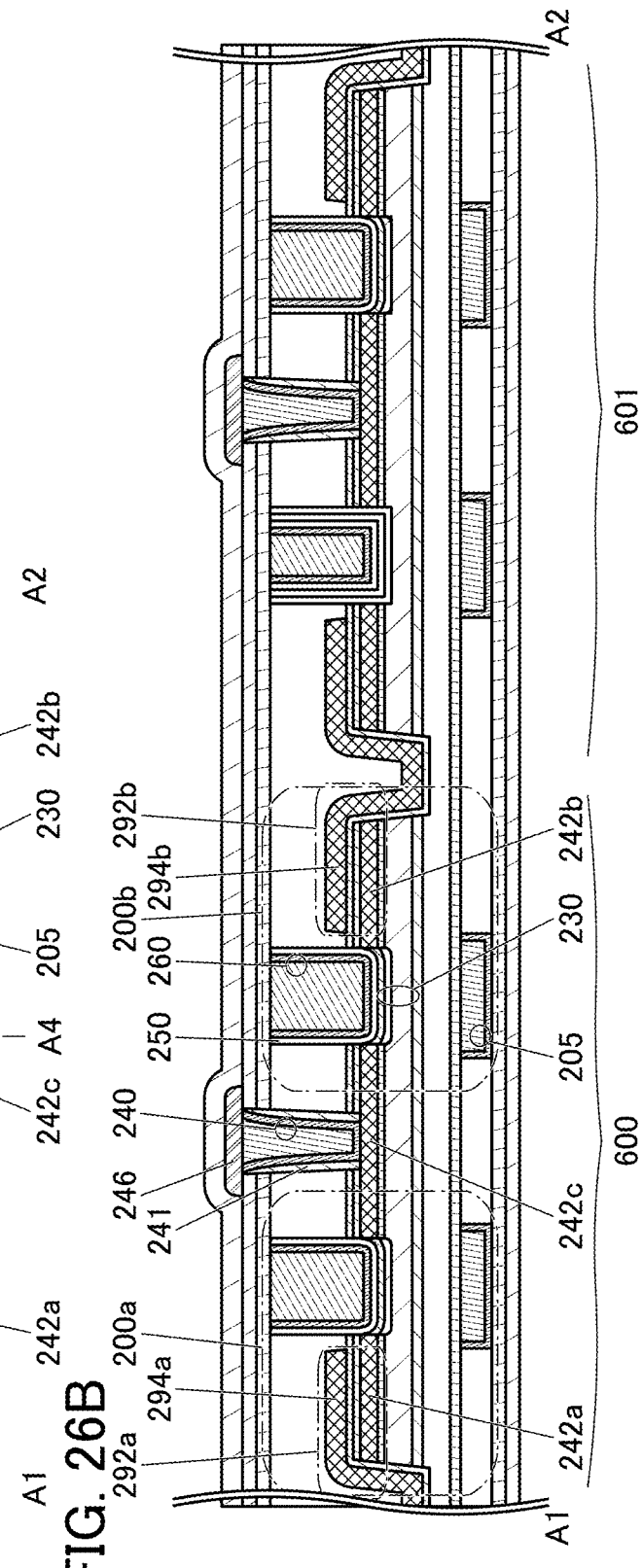

5100

5102
5101

5200

5202
5201
5203

5300

5301
5304
5303
5302
5306 5305

5400

5402

5500

5501
5502

5502

5504

5703 5704 5701
5702

5800

5801
5802
5803

SEMICONDUCTOR DEVICE AND MANUFACTURING METHOD OF THE SEMICONDUCTOR DEVICE

TECHNICAL FIELD

One embodiment of the present invention relates to a transistor, a semiconductor device, and an electronic device. Another embodiment of the present invention relates to a method of manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

An object of one embodiment of the present invention is to provide a semiconductor device in which variation of transistor characteristics is small. Another object of one embodiment of the present invention is to provide a semiconductor device having favorable reliability. Another object of one embodiment of the present invention is to provide a semiconductor device having favorable electrical characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not have to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a first insulator; a first oxide over the first insulator; a second oxide over the first oxide; a third oxide and a fourth oxide over the second oxide; a first conductor over the third oxide; a second conductor over the fourth oxide; a second insulator over the first conductor; a third insulator over the second conductor; a fifth oxide that is over the second oxide and is positioned between the third oxide and the fourth oxide; a sixth oxide over the fifth oxide; a fourth insulator over the sixth oxide; a third conductor over the fourth insulator; and a fifth insulator over the first insulator to the third insulator. The fifth oxide includes a region in contact with the second oxide to the fourth oxide and the first insulator. The sixth oxide includes a region in contact with the fifth oxide, the first conductor, and the second conductor. The fourth insulator includes a region in contact with the sixth oxide, the third conductor, and the fifth insulator.

In the above, it is preferable that the first oxide to the sixth oxide each include In, an element M (M is Al, Ga, Y, or Sn), and Zn, that the first oxide, the third oxide, the fourth oxide, and the sixth oxide each include a region having a higher concentration of the element M than the second oxide, and that the first oxide, the third oxide, the fourth oxide, and the sixth oxide each include a region having a higher concentration of the element M than the fifth oxide.

In the above, it is preferable that the second insulator, the third insulator, and the fifth insulator each include either one of aluminum and hafnium.

One embodiment of the present invention is a method for manufacturing a semiconductor device, including the steps of depositing a first insulator; depositing a first oxide film, a second oxide film, and a third oxide film in this order over the first insulator; performing first heat treatment; depositing a first conductive film, a first insulating film, and a second conductive film in this order over the third oxide film; processing the first oxide film, the second oxide film, the third oxide film, the first conductive film, the first insulating film, and the second conductive film into island shapes to form a first oxide, a second oxide, a first oxide layer, a first conductive layer, a first insulating layer, and a second conductive layer; removing the second conductive layer; depositing a fifth insulator over the first insulator, the first oxide, the second oxide, the first oxide layer, the first conductive layer, and the first insulating layer; depositing a sixth insulator over the fifth insulator; forming an opening reaching the second oxide in the first oxide layer, the first conductive layer, the first insulating layer, the fifth insulator, and the sixth insulator; through the formation of the opening, forming a third oxide and a fourth oxide from the first oxide layer, forming a first conductor and a second conductor from the first conductive layer, and forming a seventh insulator and an eighth insulator from the first insulating layer; performing second heat treatment; depositing a fourth oxide film over the sixth insulator and in the opening; depositing a fifth oxide film over the fourth oxide film; removing, by a dry etching method, the fourth oxide film and the fifth oxide film deposited on side surfaces of the fifth insulator to the eighth insulator in the opening; removing the fourth oxide film and the fifth oxide film over the sixth insulator; forming a fifth oxide and a sixth oxide by leaving the fourth oxide film and the fifth oxide film on a bottom portion of the opening; depositing a second insulating film over the sixth oxide and the sixth insulator; depositing a third conductive film over the second insulating film; and forming a ninth insulator and a third conductor in the opening by polishing the third conductive film and the second insulating film by a CMP method until the sixth insulator is reached.

In the above, the dry etching method is preferably performed at a pressure of higher than or equal to 66.5 Pa.

Effect of the Invention

According to one embodiment of the present invention, a semiconductor device in which variation of transistor characteristics is small can be provided. Alternatively, according to one embodiment of the present invention, a semiconductor device having favorable reliability can be provided. Alternatively, according to one embodiment of the present invention, a semiconductor device having favorable electrical characteristics can be provided. Alternatively, according to one embodiment of the present invention, a semiconductor device with a high on-state current can be provided. Alternatively, according to one embodiment of the present invention, a semiconductor device that can be miniaturized or highly integrated can be provided. Alternatively, according to one embodiment of the present invention, a semiconductor device with low power consumption can be provided.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 2A is a table showing classifications of crystal structures of IGZO. FIG. 2B is a graph showing an XRD spectrum of a CAAC-IGZO film. FIG. 2C is an image showing a nanobeam electron diffraction pattern of the CAAC-IGZO film.

FIG. 22A and FIG. 22B are cross-sectional views of semiconductor devices of embodiments of the present invention.

FIG. 26A and FIG. 26B are cross-sectional views of semiconductor devices of embodiments of the present invention.

MODE FOR CARRYING OUT THE INVENTION

Figure 1A:
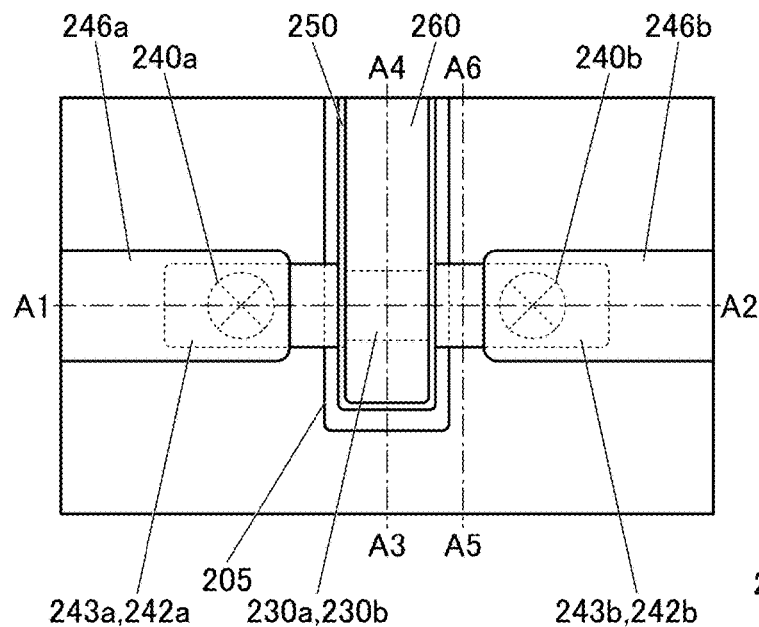
FIG. 1A is a top view of a semiconductor device of one embodiment of the present invention.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "under", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

The channel width refers to, for example, the length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

In this embodiment, an example of a semiconductor device including a transistor 200 of one embodiment of the present invention and a manufacturing method thereof are described using FIG. 1A to FIG. 19D.

Structure Example of Semiconductor Device

A structure of a semiconductor device including the transistor 200 is described using FIG. 1. FIG. 1A to FIG. 1D are a top view and cross-sectional views of a semiconductor device including the transistor 200. FIG. 1A is a top view of the semiconductor device. FIG. 1B to FIG. 1D are cross-sectional views of the semiconductor device. Here, FIG. 1B is a cross-sectional view of a portion indicated by dashed-dotted line A1-A2 in FIG. 1A, and is a cross-sectional view in the channel length direction of the transistor 200. FIG. 1C is a cross-sectional view of a portion indicated by dashed-dotted line A3-A4 in FIG. 1A, and is a cross-sectional view in the channel width direction of the transistor 200. FIG. 1D is a cross-sectional view of a portion indicated by dashed-dotted line A5-A6 in FIG. 1A. Note that for clarity of the drawing, some components are not illustrated in the top view of FIG. 1A.

The semiconductor device of one embodiment of the present invention includes an insulator 212 over a substrate (not shown), an insulator 214 over the insulator 212, the transistor 200 over the insulator 214, an insulator 280 over the transistor 200, an insulator 282 over the insulator 280, and an insulator 283 over the insulator 282. The insulator 212, the insulator 214, the insulator 280, the insulator 282, and the insulator 283 function as interlayer films. A conductor 240 (a conductor 240a and a conductor 240b) that is electrically connected to a conductor 242 (a conductor 242a and a conductor 242b) included in the transistor 200 and functions as a plug is also included. Note that an insulator 241 (an insulator 241a and an insulator 241b) is provided in contact with the side surfaces of the conductor 240 functioning as a plug. A conductor 246 (a conductor 246a and a conductor 246b) that is electrically connected to the conductor 240 and functions as a wiring is provided over the insulator 283 and the conductor 240. An insulator 286 is provided over the conductor 246 and the insulator 283.

The insulator 241a is provided in contact with the inner wall of an opening in the insulator 280, the insulator 282, and the insulator 283; a first conductor of the conductor 240a is provided in contact with the side surface of the insulator 241a; and a second conductor of the conductor 240a is provided on the inner side thereof. The insulator 241b is provided in contact with the inner wall of an opening in the insulator 280, the insulator 282, and the insulator 283; a first conductor of the conductor 240b is provided in contact with the side surface of the insulator 241b; and a second conductor of the conductor 240b is provided on the inner side thereof. A groove and a slit, for example, are included in the category of the opening. A region where an opening is formed is referred to as an opening portion in some cases. The level of the top surface of the conductor 240 and the level of the top surface of the insulator 283 in a region overlapping with the conductor 246 can be substantially the same. Note that although the transistor 200 has a structure in which the first conductor of the conductor 240 and the second conductor of the conductor 240 are stacked, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

[Transistor 200]

Figure 1C:
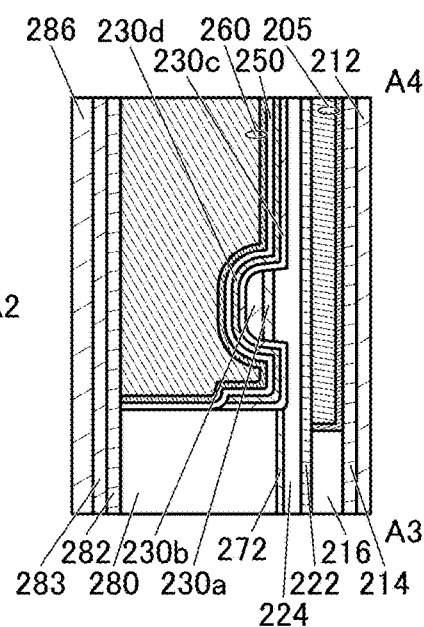
FIG. 1B to FIG. 1D are cross-sectional views of the semiconductor device of one embodiment of the present invention.
Figure 1B:
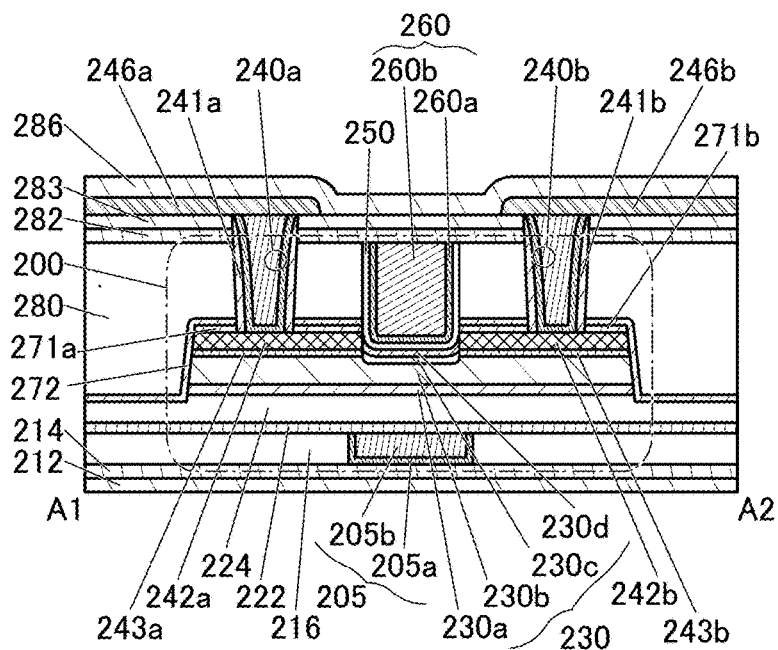
Figure 1D:
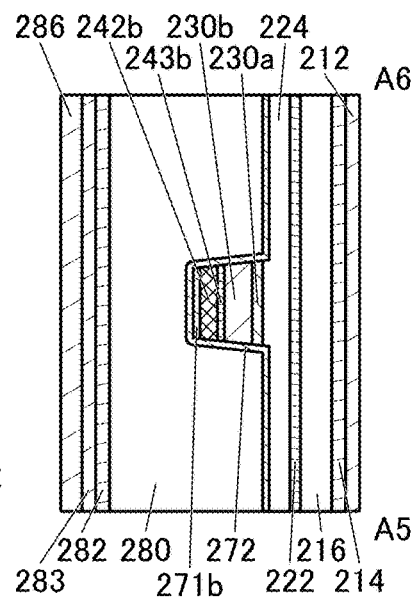

As illustrated in FIG. 1A to FIG. 1D, the transistor 200 includes an insulator 216 over the insulator 214; a conductor 205 (a conductor 205a and a conductor 205b) positioned to be embedded in the insulator 214 or parts of the insulator 214 and the insulator 216; an insulator 222 over the insulator 216 and the conductor 205; an insulator 224 over the insulator 222; an oxide 230a over the insulator 224; an oxide 230b over the oxide 230a; an oxide 243 (an oxide 243a and an oxide 243b) and an oxide 230c over the oxide 230b; the conductor 242a over the oxide 243a; an insulator 271a over the conductor 242a; the conductor 242b over the oxide 243b; an insulator 271b over the conductor 242b; an oxide 230d over the oxide 230c; an insulator 250 over the oxide 230d; a conductor 260 (a conductor 260a and a conductor 260b) that is positioned over the insulator 250 and overlaps with part of the oxide 230c; and an insulator 272 in contact with part of the insulator 224, the side surface of the oxide 230a, the side surface of the oxide 230b, the side surface of the oxide 243a, the side surface of the conductor 242a, the side surface of the insulator 271a, the top surface of the insulator 271a, the side surface of the insulator 271b, and the side surface of the conductor 242b. In addition, the oxide 230c is in contact with the side surface of the oxide 243a, the side surface of the oxide 243b, part of the top surface of the oxide 230b, part of the insulator 280, and part of the top surface of the insulator 224. The oxide 230d is in contact with the side surface of the conductor 242a, the side surface of the conductor 242b, and the top surface of the oxide 230c. Here, as illustrated in FIG. 1B and FIG. 1C, the top surface of the conductor 260 is positioned to be substantially aligned with the top surface of the insulator 250. The insulator 282 is in contact with the top surfaces of the conductor 260, the insulator 250, and the insulator 280.

Hereinafter, the insulator 271a and the insulator 271b are collectively referred to as an insulator 271, in some cases.

An opening reaching the oxide 230b is provided in the insulator 280, the insulator 272, and the insulator 271. The oxide 230c, the oxide 230d, the insulator 250, and the conductor 260 are positioned in the opening. The insulator 250 includes a region in contact with the side surface of the conductor 260 and a region in contact with the bottom surface of the conductor 260. The oxide 230c includes a region in contact with the oxide 230b and a region overlapping with the bottom surface of the conductor 260 with the oxide 230d and the insulator 250 therebetween.

The oxide 230 preferably includes the oxide 230a positioned over the insulator 224, the oxide 230b positioned over the oxide 230a, the oxide 230c that is positioned over the oxide 230b and is at least partly in contact with the oxide 230b, and the oxide 230d positioned over the oxide 230c. Including the oxide 230a below the oxide 230b makes it possible to inhibit diffusion of impurities into the oxide 230b from components formed below the oxide 230a. Moreover, including the oxide 230d over the oxide 230c makes it possible to inhibit diffusion of impurities into the oxide 230c from components formed above the oxide 230d.

Although a structure in which the oxide 230 has a four-layer stacked structure of the oxide 230a, the oxide 230b, the oxide 230c, and the oxide 230d in the transistor 200 is described, the present invention is not limited thereto. For example, the oxide 230 may be a single layer of the oxide 230b or has a two-layer structure of the oxide 230a and the oxide 230b, a two-layer structure of the oxide 230b and the oxide 230c, a three-layer structure of the oxide 230a, the oxide 230b, and the oxide 230c, or a stacked-layer structure including five or more layers. Alternatively, each of the oxide 230a, the oxide 230b, the oxide 230c, and the oxide 230d may have a stacked-layer structure.

Here, the conductor 260 functions as a first gate (also referred to as a top gate) electrode, and the conductor 205 functions as a second gate (also referred to as a back gate) electrode. The insulator 250 functions as a first gate insulator, and the insulator 224 functions as a second gate insulator. The conductor 242a functions as one of a source and a drain, and the conductor 242b functions as the other of the source and the drain. A region of the oxide 230 that overlaps with the conductor 260 at least partly functions as a channel formation region.

In the transistor 200, a metal oxide functioning as an oxide semiconductor (such a metal oxide is hereinafter also referred to as an oxide semiconductor) is preferably used for the oxide 230 (the oxide 230a, the oxide 230b, the oxide 230c, and the oxide 230d) including the channel formation region.

The metal oxide functioning as a semiconductor has a band gap of preferably 2 eV or higher, further preferably 2.5 eV or higher. With the use of a metal oxide having such a wide band gap, the off-state current of the transistor can be reduced.

For the oxide 230, for example, a metal oxide such as an In-M-Zn oxide including indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. An In—Ga oxide, an In—Zn oxide, or an indium oxide may be used for the oxide 230.

The atomic ratio of In to the element M in the metal oxide used for the oxide 230b or the oxide 230c is preferably greater than the atomic ratio of In to the metal element M in the metal oxide used for the oxide 230a or the oxide 230d.

The oxide 230a is positioned under the oxide 230b or the oxide 230c, whereby impurities and oxygen can be inhibited from being diffused into the oxide 230b or the oxide 230c from components formed under the oxide 230a.

The oxide 230d is positioned over the oxide 230b or the oxide 230c, whereby impurities can be inhibited from being diffused into the oxide 230b or the oxide 230c from components formed over the oxide 230d. When the oxide 230d is positioned over the oxide 230b or the oxide 230c, oxygen can be inhibited from diffusing upward from the oxide 230b or the oxide 230c.

When the oxide 230a to the oxide 230d contain a common element (as the main component) besides oxygen, the density of defect states at each interface between the oxide 230a, the oxide 230b, the oxide 230c, and the oxide 230d can be low. In that case, a main carrier path is the oxide 230b, the oxide 230c, or the vicinity thereof, for example, the interface between the oxide 230b and the oxide 230c. Since the density of defect states at the interface between the oxide 230b and the oxide 230c can be decreased, the influence of interface scattering on carrier conduction is small, and a high on-state current can be obtained.

The oxide 230b and the oxide 230c preferably have crystallinity. It is particularly preferable to use a CAAC-OS (c-axis aligned crystalline oxide semiconductor) for the oxide 230b and the oxide 230c. The oxide 230d may also have crystallinity.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

A crystal structure in which a clear crystal grain boundary (grain boundary) is observed is what is called a polycrystal structure. It is highly probable that the crystal grain boundary becomes a recombination center and traps carriers and thus decreases the on-state current or field-effect mobility of a transistor. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide having a dense structure with high crystallinity and a low amount of impurities or defects (oxygen vacancies $V_O$ and the like) as shown above. In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is unlikely to occur. Thus, a metal oxide including a CAAC-OS is physically stable. Therefore, the metal oxide including a CAAC-OS is resistant to heat and has high reliability.

In a cross-sectional view of the transistor in the channel length direction, it is preferable that a groove be provided in the oxide 230b and the oxide 230c be embedded in the groove. At this time, the oxide 230c is provided to cover the inner wall (the side surface and the bottom surface) of the groove. It is preferable that the thickness of the oxide 230c be approximately the same as the depth of the groove.

With such a structure, even when the opening in which the conductor 260 and the like are embedded is formed and a damaged region is formed on the surface of the oxide 230b at the bottom portion of the opening, the damaged region can be removed. This can inhibit poor electrical characteristics of the transistor 200 due to the damaged region.

FIG. 1 and the like show the structure in which the side surface of the opening in which the conductor 260 and the like are embedded is substantially perpendicular to the formation surface of the oxide 230b including the groove of the oxide 230b; this embodiment is not limited thereto. For example, the opening may have a U-shape with a bottom portion having a moderate curve. For example, the side surface of the opening may be tilted with respect to the formation surface of the oxide 230b.

As shown in FIG. 1C, a curved surface may be provided between the side surface of the oxide 230b and the top surface of the oxide 230b in a cross-sectional view of the transistor 200 in the channel width direction. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230b in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the groove with the insulator 250 and the conductor 260, which are formed in a later step. Furthermore, reduction in the length of the region that does not have the curved surface can be prevented, and decrease in the on-state current and mobility of the transistor 200 can be inhibited. Thus, a semiconductor device with favorable electrical characteristics can be provided.

The oxide 230 preferably has a stacked-layer structure of a plurality of oxide layers with different chemical compositions. Specifically, the atomic ratio of the element M to the metal element of the main component in the metal oxide used for the oxide 230a is preferably greater than the atomic ratio of the element M to the metal element of the main component in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a.

In order to make the oxide 230c serve as a main carrier path, the atomic ratio of indium to a metal element of a main component in the oxide 230c is preferably greater than the atomic ratio of indium to a metal element of a main component in the oxide 230b. When a metal oxide having a high content of indium is used for a channel formation region, the on-state current of the transistor can be increased. Accordingly, when the atomic ratio of indium to a metal element of a main component in the oxide 230c is greater than the atomic ratio of indium to a metal element of a main component in the oxide 230b, the oxide 230c can serve as a main carrier path.

The conduction band minimum of the oxide 230c is preferably farther from the vacuum level than the conduction band minimum of the oxide 230a and the oxide 230b. In other words, the electron affinity of the oxide 230c is preferably larger than the electron affinity of the oxide 230a and the oxide 230b. At this time, the oxide 230c serves as a main carrier path.

For the oxide 230c, specifically, a metal oxide with In:M:Zn=4:2:3 [atomic ratio] or a composition in the neighborhood thereof, In:M:Zn=5:1:3 [atomic ratio] or a composition in the neighborhood thereof, or In:M:Zn=10:1:3 [atomic ratio] or a composition in the neighborhood thereof, indium oxide, or the like may be used.

A shift voltage (Vsh) measured in +GBT (Gate Bias Temperature) stress test is given as a parameter to evaluate the reliability of a transistor. The shift voltage (Vsh) is defined as gate voltage (Vg) at which, in a drain current (Id)-gate voltage (Vg) curve of a transistor, the tangent at a point where the slope of the curve is the steepest intersects the straight line of Id=1 pA. Furthermore, the amount of change in Vsh is represented as ΔVsh.

The ΔVsh of a transistor under a +GBT stress test shifts in the negative direction with time in some cases. In other cases, the ΔVsh shows the behavior of changing in both the negative direction and the positive direction, instead of changing in the negative direction. Note that this behavior is sometimes referred to as jagged behavior of ΔVsh in +GBT stress tests in this specification and the like.

When the metal oxide containing the element M not as its main component or the metal oxide with a small ratio of the element M is used for the oxide 230c, ΔVsh can be reduced and jagged behavior of ΔVsh can be suppressed, for example, whereby the reliability of a transistor can be improved.

The oxide 230b and the oxide 230c are preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

In addition, a CAAC-OS is preferably used for the oxide 230c; the c-axis of a crystal included in the oxide 230c is preferably aligned in a direction substantially perpendicular to the formation surface or top surface of the oxide 230c. The CAAC-OS has a property of making oxygen move easily in the direction perpendicular to the c-axis. Thus, oxygen contained in the oxide 230c can be efficiently supplied to the oxide 230b.

The oxide 230d preferably contains at least one of the metal elements contained in the metal oxide used for the oxide 230c, and further preferably contains all of these metal elements. For example, it is preferable that an In-M-Zn oxide, an In—Zn oxide, or an indium oxide be used for the oxide 230c, and an In-M-Zn oxide, a M-Zn oxide, or an oxide of the element M be used for the oxide 230d. Accordingly, the density of defect states at the interface between the oxide 230c and the oxide 230d can be decreased.

The conduction band minimum of the oxide 230d is preferably closer to the vacuum level than the conduction band minimum of the oxide 230c. In other words, the electron affinity of the oxide 230d is preferably smaller than the electron affinity of the oxide 230c. In that case, a metal oxide that can be used for the oxide 230a or the oxide 230b is preferably used for the oxide 230d. At this time, the oxide 230c serves as a main carrier path.

Specifically, for the oxide 230c, a metal oxide with In:M:Zn=4:2:3 [atomic ratio] or a composition in the neighborhood thereof, In:M:Zn=5:1:3 [atomic ratio] or a composition in the neighborhood thereof, or In:M:Zn=10:1:3 [atomic ratio] or a composition in the neighborhood thereof, or an indium oxide can be used; for the oxide 230d, a metal oxide with In:M:Zn=1:3:4 [atomic ratio] or a composition in the neighborhood thereof, M:Zn=2:1 [atomic ratio] or a composition in the neighborhood thereof, or M:Zn=2:5

[atomic ratio] or a composition in the neighborhood thereof, or an oxide of the element M can be used.

The oxide 230d is preferably a metal oxide that inhibits diffusion or passage of oxygen more readily than the oxide 230c. Providing the oxide 230d between the insulator 250 and the oxide 230c can inhibit diffusion of oxygen contained in the insulator 280 into the insulator 250. Thus, the oxygen can be efficiently supplied to the oxide 230b through the oxide 230c.

When the atomic ratio of In to the metal element of the main component in the metal oxide used for the oxide 230d is smaller than the atomic ratio of In to the metal element of the main component in the metal oxide used for the oxide 230c, diffusion of In to the insulator 250 side can be inhibited. Since the insulator 250 functions as a gate insulator, the transistor exhibits poor characteristics when In enters the insulator 250 and the like. Thus, the oxide 230d provided between the oxide 230c and the insulator 250 allows the semiconductor device to have high reliability.

Here, the conduction band minimum gradually changes at junction portions of the oxide 230a, the oxide 230b, the oxide 230c, and the oxide 230d. In other words, the conduction band minimum at the junction portions of the oxide 230a, the oxide 230b, the oxide 230c, and the oxide 230d continuously changes or is continuously connected. To obtain this, the density of defect states in mixed layers formed at the interface between the oxide 230a and the oxide 230b, the interface between the oxide 230b and the oxide 230c, and the interface between the oxide 230c and the oxide 230d is preferably decreased.

Specifically, when the oxide 230a and the oxide 230b, the oxide 230b and the oxide 230c, and the oxide 230c and the oxide 230d contain the same element as a main component in addition to oxygen, a mixed layer with a low density of defect states can be formed. For example, in the case where the oxide 230b is an In-M-Zn oxide, an In-M-Zn oxide, an M-Zn oxide, an oxide of the element M, an In—Zn oxide, indium oxide, or the like may be used for the oxide 230a, the oxide 230c, and the oxide 230d.

Specifically, for the oxide 230a, a metal oxide with In:M:Zn=1:3:4 [atomic ratio] or a composition in the neighborhood thereof, or In:M:Zn=1:1:0.5 [atomic ratio] or a composition in the neighborhood thereof is used. For the oxide 230b, a metal oxide with In:M:Zn=1:1:1 [atomic ratio] or a composition in the neighborhood thereof, or In:M:Zn=4:2:3 [atomic ratio] or a composition in the neighborhood thereof is used. For the oxide 230c, a metal oxide with In:M:Zn=4:2:3 [atomic ratio] or a composition in the neighborhood thereof, In:M:Zn=5:1:3 [atomic ratio] or a composition in the neighborhood thereof, or In:M:Zn=10:1:3 [atomic ratio] or a composition in the neighborhood thereof, or indium oxide is used. Note that a composition in the neighborhood includes the range of ±30% of an intended atomic ratio. Gallium is preferably used as the element M. For the oxide 230d, a metal oxide with In:M:Zn=1:3:4 [atomic ratio] or a composition in the neighborhood thereof, M:Zn=2:1 [atomic ratio] or a composition in the neighborhood thereof, or M:Zn=2:5 [atomic ratio] or a composition in the neighborhood thereof, or an oxide of the element M is used.

When the metal oxide is deposited by a sputtering method, the above atomic ratio is not limited to the atomic ratio of the deposited metal oxide and may be the atomic ratio of a sputtering target used for depositing the metal oxide.

When the oxide 230a, the oxide 230b, the oxide 230c, and the oxide 230d have the above structure, the density of defect states at the interface between the oxide 230a and the oxide 230b, the interface between the oxide 230b and the oxide 230c, and the interface between the oxide 230c and the oxide 230d can be made low. Thus, the influence of interface scattering on carrier conduction is small, and the transistor 200 can have a high on-state current and excellent frequency characteristics.

The insulator 212, the insulator 214, the insulator 271, the insulator 272, the insulator 282, the insulator 283, and the insulator 286 preferably function as barrier insulating films, each of which inhibits diffusion of impurities such as water and hydrogen from the substrate side or above the transistor 200 into the transistor 200. Thus, for each of the insulator 212, the insulator 214, the insulator 271, the insulator 272, the insulator 282, the insulator 283, and the insulator 286, an insulating material which has a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material which has a function of inhibiting diffusion of oxygen (e.g., at least one of an oxygen atom, an oxygen molecule, and the like) (through which the above oxygen is less likely to pass).

Note that in this specification, a barrier insulating film refers to an insulating film having a barrier property. A barrier property in this specification means a function of inhibiting diffusion of a targeted substance (also referred to as having lower permeability). Alternatively, a barrier property in this specification means a function of trapping or fixing (also referred to as gettering) a targeted substance.

For example, it is preferable that the insulator 212, the insulator 283, and the insulator 286 be formed using silicon nitride or the like, and the insulator 214, the insulator 271, the insulator 272, and the insulator 282 be formed using aluminum oxide or the like. Accordingly, impurities such as water and hydrogen can be inhibited from being diffused into the transistor 200 side from the substrate side through the insulator 212 and the insulator 214. Alternatively, oxygen contained in the insulator 224 or the like can be inhibited from being diffused to the substrate side through the insulator 212 and the insulator 214. Impurities such as water and hydrogen can be inhibited from being diffused from the insulator 280, the conductor 246, and the like into the oxide 230. In this manner, the transistor 200 is preferably surrounded by the insulator 212, the insulator 214, the insulator 271, the insulator 272, the insulator 282, and the insulator 283 having a function of inhibiting diffusion of oxygen and impurities such as water and hydrogen.

The resistivities of the insulator 212, the insulator 283, and the insulator 286 are preferably low in some cases. For example, by setting the resistivities of the insulator 212, the insulator 283, and the insulator 286 to approximately $1\times10^{13}$ Ωkm, the insulator 212, the insulator 283, and the insulator 286 can sometimes reduce charge up of the conductor 205, the conductor 242, the conductor 260, or the conductor 246 in treatment using plasma or the like in the manufacturing process of a semiconductor device. The resistivities of the insulator 212, the insulator 283, and the insulator 286 are preferably higher than or equal to $1\times10^{10}$ Ωcm and lower than or equal to $1\times10^{15}$ Ωcm.

The insulator 216 and the insulator 280 preferably have a lower permittivity than the insulator 214. When a material with a low permittivity is used for an interlayer film, parasitic capacitance generated between wirings can be reduced. For the insulator 216 and the insulator 280, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 212, the insulator 214, and the insulator 216 are preferably deposited by a sputtering method. The insulator 212, the insulator 214, and the insulator 216 which are deposited by a sputtering method have low hydrogen concentrations in their films, which is preferable. The insulator 212, the insulator 214, and the insulator 216 are preferably deposited successively without being exposed to the air environment. The deposition without exposure to the air environment is preferable because impurities or moisture from the air environment can be prevented from attaching onto the insulator 212, the insulator 214, and the insulator 216, so that the interface between the insulator 212 and the insulator 214, the vicinity of the interface, the interface between the insulator 214 and the insulator 216, and the vicinity of the interface can be kept clean. An apparatus capable of successive deposition is described later.

As illustrated in FIG. 1B and FIG. 1C, the transistor 200 has a structure in which the oxide 230c and the oxide 230d are positioned only in the vicinity of the bottom portion of the opening provided in the insulator 280, the insulator 272, and the insulator 271.

The above structure can inhibit generation of a current leakage path between the adjacent transistors 200 in a semiconductor device in which the plurality of transistors 200 are positioned in the channel width direction. The following shows details.

By applying a negative potential to the conductor 205 functioning as a second gate electrode, generation of a parasitic channel in the oxide 230c and the oxide 230d can be inhibited in some cases. In particular, when the oxide 230c and the oxide 230d in the transistor 200 have the above structure, the distance between the conductor 205 and each of the oxide 230c and the oxide 230d is relatively short. Thus, the potential of the conductor 205 can sufficiently reach the whole oxide 230c and oxide 230d. Accordingly, the generation of the parasitic channel in the whole oxide 230c and oxide 230d can be inhibited. As a result, generation of a current leakage path between the adjacent transistors 200 can be inhibited.

Furthermore, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced.

The conductor 205 is positioned to overlap with the oxide 230 and the conductor 260. Furthermore, the conductor 205 is preferably provided to be embedded in the insulator 214 or parts of the insulator 214 and the insulator 216.

As shown in FIG. 1A, the conductor 205 is preferably provided to be larger than a region of the oxide 230a and the oxide 230b that does not overlap with the conductor 242a or the conductor 242b. As illustrated in FIG. 1C, it is particularly preferable that the conductor 205 extend to a region outside end portions of the oxide 230a and the oxide 230b that intersect with the channel width direction. That is, the conductor 205 and the conductor 260 preferably overlap with each other with the insulators therebetween on the outer side of the side surfaces of the oxide 230a and the oxide 230b in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a Surrounded channel (S-channel) structure.

In this specification and the like, the S-channel structure refers to a transistor structure in which a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

Furthermore, as shown in FIG. 1C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the conductor 205a and the conductor 205b are stacked as the conductor 205 is shown, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When a conductive material having a function of inhibiting diffusion of oxygen is used for the conductor 205a, the conductivity of the conductor 205b can be inhibited from being lowered because of oxidation. As a conductive material having a function of inhibiting diffusion of oxygen, for example, tantalum, tantalum nitride, ruthenium, or ruthenium oxide is preferably used. Thus, the conductor 205a is a single layer or a stack of the above conductive materials. For example, the conductor 205a may be a stack of tantalum, tantalum nitride, ruthenium, or ruthenium oxide and titanium or titanium nitride. Note that the conductor 205a may be formed by an ionization sputtering method described later.

Moreover, the conductor 205b is preferably formed using a conductive material containing tungsten, copper, or aluminum as its main component. Note that the conductor 205b is shown as a single layer but may have a stacked-layer structure, for example, a stack of the conductive material and titanium or titanium nitride.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

For the insulator 222, an insulator containing an oxide of one or both of aluminum and hafnium is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 222.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current might arise because of a thinner gate insulator. When a high-k material is used for the insulator functioning as a gate insulator, a gate potential during operation of the transistor can be reduced while the physical thickness of the gate insulator is maintained.

It is preferable that oxygen be released from the insulator 224 in contact with the oxide 230 by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating, in other words, an insulating material including an excess-oxygen region is preferably used. An oxide from which oxygen is released by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. For example, in the oxide 230, dehydrogenation can be performed when a reaction in which a bond of a defect where hydrogen enters an oxygen vacancy (VoH) is cut occurs, i.e., a reaction of "$V_OH \rightarrow V_O+H$" occurs. Part of hydrogen generated at this time is bonded to oxygen to be H$_2$O, and removed from the oxide 230 or an insulator in the vicinity of the oxide 230 in some cases. Part of hydrogen is diffused into or trapped by (also referred to as gettering) the conductor 242 in some cases.

For the microwave treatment, for example, an apparatus including a power supply that generates high-density plasma or an apparatus including a power supply that applies RF to the substrate side is suitably used. For example, the use of a gas containing oxygen and high-density plasma enables high-density oxygen radicals to be generated, and RF application to the substrate side allows the oxygen radicals generated by the high-density plasma to be efficiently introduced into the oxide 230 or an insulator in the vicinity of the oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 200, heat treatment is preferably performed with a surface of the oxide 230 exposed. The heat treatment is performed at higher than or equal to 100° C. and lower than or equal to 600° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 230 can promote a reaction in which oxygen vacancies in the oxide 230 are repaired with supplied oxygen, i.e., a reaction of "$V_O+O \rightarrow null$". Furthermore, hydrogen remaining in the oxide 230 reacts with supplied oxygen, so that the hydrogen can be removed as H$_2$O (dehydration). This can inhibit recombination of hydrogen remaining in the oxide 230 with oxygen vacancies and formation of VoH.

Note that the insulator 222 and the insulator 224 may have a stacked-layer structure of two or more layers. In such cases, without limitation to a stacked-layer structure formed of the same material, a stacked-layer structure formed of different materials may be employed.

The oxide 243 (the oxide 243a and the oxide 243b) may be provided over the oxide 230b.

The oxide 243 (the oxide 243a and the oxide 243b) preferably has a function of inhibiting passage of oxygen. The oxide 243 having a function of inhibiting passage of oxygen is preferably provided between the oxide 230b and the conductor 242 functioning as the source electrode and the drain electrode, in which case the electric resistance between the oxide 230b and the conductor 242 can be reduced. Such a structure improves the electrical characteristics of the transistor 200 and the reliability of the transistor 200. In the case where the electric resistance between the oxide 230b and the conductor 242 can be sufficiently reduced, the oxide 243 is not necessarily provided.

A metal oxide including the element M may be used for the oxide 243. In particular, aluminum, gallium, yttrium, or tin is preferably used as the element M. The concentration of the element M in the oxide 243 is preferably higher than that in the oxide 230b. Furthermore, gallium oxide may be used for the oxide 243. A metal oxide such as an In-M-Zn oxide may be used for the oxide 243. Specifically, the atomic ratio of the element M to In in the metal oxide used for the oxide 243 is preferably greater than the atomic ratio of the element M to In in the metal oxide used for the oxide 230b. The thickness of the oxide 243 is preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

Note that an oxide film to be the oxide 230a, an oxide film to be the oxide 230b, and an oxide film to be the oxide 243 are preferably deposited successively without being exposed to the air environment. Depositing these films without being exposed to the air environment can prevent impurities or moisture from the air environment from attaching onto the oxide film to be the oxide 230a, the oxide film to be the oxide 230b, and the oxide film to be the oxide 243; this can keep clean the interface between the oxide film to be the oxide 230a and the oxide film to be the oxide 230b, the vicinity of the interface, the interface between the oxide film to be the oxide 230b and the oxide film to be the oxide 243, and the vicinity of the interface, which is preferable. An apparatus capable of successive deposition is described later.

The conductor 242a is provided over the oxide 243a and the conductor 242b is provided over the oxide 243b. Each of the conductor 242a and the conductor 242b functions as a source electrode or a drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

When the oxide 243 is not provided, the contact between the conductor 242 and the oxide 230b or the oxide 230c may make oxygen in the oxide 230b or the oxide 230c diffuse into the conductor 242, resulting in oxidation of the conductor 242. It is highly possible that oxidation of the conductor 242 lowers the conductivity of the conductor 242. Note that diffusion of oxygen in the oxide 230b or the oxide 230c into the conductor 242 can be rephrased as absorption of oxygen in the oxide 230b or the oxide 230c by the conductor 242.

When oxygen in the oxide 230b or the oxide 230c is diffused into the conductor 242a and the conductor 242b, a layer is sometimes formed between the conductor 242a and the oxide 230b and between the conductor 242b and the oxide 230b, or between the conductor 242a and the oxide 230c and between the conductor 242b and the oxide 230c. The layer contains more oxygen than the conductor 242a or the conductor 242b does, and thus the layer is assumed to have an insulating property. In this case, a three-layer structure of the conductor 242a or the conductor 242b, the layer, and the oxide 230b or the oxide 230c can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that hydrogen contained in the oxide 230b, the oxide 230c, or the like is diffused into the conductor 242a or the conductor 242b in some cases. In particular, when a nitride containing tantalum is used for the conductor 242a and the conductor 242b, hydrogen contained in the oxide 230b, the oxide 230c, or the like is likely to be diffused into the conductor 242a or the conductor 242b, and the diffused hydrogen is bonded to nitrogen contained in the conductor 242a or the conductor 242b in some cases. That is, hydrogen contained in the oxide 230b, the oxide 230c, or the like is sometimes absorbed by the conductor 242a or the conductor 242b in some cases.

There is a curved surface between the side surface of the conductor 242 and the top surface of the conductor 242 in some cases. That is, an end portion of the side surface and an end portion of the top surface might be curved. The radius of curvature of the curved surface at an end portion of the conductor 242 is greater than or equal to 3 nm and less than or equal to 10 nm, preferably greater than or equal to 5 nm and less than or equal to 6 nm, for example. When the end portions are not angular, coverage with films in later deposition steps is improved.

The insulator 272 is provided to cover the side surfaces of the oxide 230a, the oxide 230b, the oxide 243, the conductor 242, and the insulator 271 and preferably functions as at least a barrier insulating film against oxygen. Thus, the insulator 272 preferably has a function of inhibiting oxygen diffusion. For example, the insulator 272 preferably has a function of further inhibiting diffusion of oxygen as compared to the insulator 280. For example, an insulator containing an oxide of one or both of aluminum and hafnium is preferably deposited as the insulator 272.

As the insulator 272 in particular, aluminum oxide or hafnium oxide is preferably deposited by a bias sputtering method in an oxygen-containing atmosphere. The bias sputtering method is a method in which sputtering is performed while RF power is applied to a substrate. The potential of the substrate applied with the RF power becomes a negative potential (bias potential) with respect to a plasma potential, and cations in plasma are accelerated by the bias potential and implanted into the substrate. The bias potential can be controlled by the amount of RF power applied to the substrate.

Therefore, aluminum oxide or hafnium oxide is deposited by the bias sputtering method in an oxygen-containing atmosphere, whereby oxygen can be implanted into the insulator 224. The amount of oxygen to be implanted into the insulator 224 can be controlled by adjusting the amount of RF power applied to the substrate, so that the optimal amount of oxygen can be implanted into the insulator 224.

The insulator 271 is provided in contact with the top surface of the conductor 242, and preferably functions as at least a barrier insulating film against oxygen like the insulator 272. Thus, the insulator 271 preferably has a function of inhibiting oxygen diffusion. For example, the insulator 271 preferably has a function of further inhibiting diffusion of oxygen as compared to the insulator 280. For example, an insulator containing an oxide of one or both of aluminum and hafnium is preferably deposited as the insulator 271. For another example, an insulator containing silicon nitride may be used for the insulator 271.

With such an insulator 271 and the insulator 272, the oxide 230*a*, the oxide 230*b*, the oxide 243, and the conductor 242 can be separated from the insulator 280. Thus, oxygen can be inhibited from being directly diffused from the insulator 280 into the oxide 230*a*, the oxide 230*b*, the oxide 243, and the conductor 242. Accordingly, a reduction in the carrier density in the source region and the drain region of the oxide 230 due to supply of excess oxygen to the source region and the drain region can be prevented. Furthermore, the conductor 242 can be inhibited from being excessively oxidized, so that an increase in the resistivity and a reduction in an on-state current can be inhibited.

The insulator 250 functions as a gate insulator. The insulator 250 is preferably in contact with the top surface of the oxide 230*d*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable.

Like the insulator 224, the insulator 250 is preferably formed using an insulator from which oxygen is released by heating. When an insulator from which oxygen is released by heating is provided as the insulator 250 in contact with the top surface of the oxide 230*d*, oxygen can be effectively supplied to the channel formation region of the oxide 230*b* through the oxide 230*d* and the oxide 230*c* and oxygen vacancies in the channel formation region of the oxide 230*b* can be reduced. Thus, a transistor that has stable electrical characteristics with small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is illustrated as a single layer in FIG. 1B and FIG. 1C, a stacked-layer structure of two or more layers may be employed. In the case where the insulator 250 has a stacked-layer structure including two layers, it is preferable that a lower layer of the insulator 250 be formed using an insulator from which oxygen is released by heating and an upper layer of the insulator 250 be formed using an insulator having a function of inhibiting diffusion of oxygen. With such a structure, oxygen contained in the lower layer of the insulator 250 can be inhibited from being diffused into the conductor 260. That is, a reduction in the amount of oxygen supplied to the oxide 230 can be inhibited. In addition, oxidation of the conductor 260 due to oxygen contained in the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative permittivity. The gate insulator having a stacked-layer structure of the lower layer of the insulator 250 and the upper layer of the insulator 250 can be thermally stable and can have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, for the upper layer of the insulator 250, a metal oxide containing one kind or two or more kinds selected from hafnium, aluminum, gallium, yttrium, zirconium, tungsten, titanium, tantalum, nickel, germanium, magnesium, and the like, or a metal oxide that can be used for the oxide 230 can be used. In particular, an insulator containing an oxide of one or both of aluminum and hafnium is preferably used.

Alternatively, the lower layer of the insulator 250 may be formed using an insulator having a function of inhibiting diffusion of oxygen. With such a structure, oxygen contained in the insulator 280 can be inhibited from being diffused into the conductor 260. That is, a reduction in the amount of oxygen supplied to the oxide 230 can be inhibited. Moreover, the lower layer of the insulator 250 is preferably formed using an insulator having a function of inhibiting passage of impurities such as water and hydrogen. With such a structure, impurities such as water and hydrogen contained in the insulator 280 can be inhibited from being diffused into the oxide 230. For example, the lower layer of the insulator 250 can be provided using a material similar to that for the insulator 222.

In the case where silicon oxide, silicon oxynitride, or the like is used for the upper layer of the insulator 250, the lower layer of the insulator 250 may be formed using an insulating material that is a high-k material having a high relative permittivity. The gate insulator having a stacked-layer structure of the lower layer of the insulator 250 and the upper layer of the insulator 250 can be thermally stable and can have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, for the lower layer of the insulator 250, a metal oxide containing one kind or two or more kinds selected from hafnium, aluminum, gallium, yttrium, zirconium, tungsten, titanium, tantalum, nickel, germanium, magnesium, and the like, or a metal oxide that can be used for the oxide 230 can be used. In particular, an insulator containing an oxide of one or both of aluminum and hafnium is preferably used.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, a reduction in the amount of oxygen supplied to the oxide 230 can be inhibited. Moreover, oxidation of the conductor 260 due to oxygen in the insulator 250 can be inhibited.

Note that, the metal oxide preferably has a function of part of the first gate electrode. For example, a metal oxide that can be used for the oxide 230 can be used as the metal oxide. In that case, when the conductor 260*a* is deposited by a sputtering method, the metal oxide can have a reduced electric resistance value to be a conductor. Such a conductor can be referred to as an OC (Oxide Conductor) electrode.

With the metal oxide, the on-state current of the transistor 200 can be increased without a reduction in the influence of the electric field from the conductor 260. Since a distance between the conductor 260 and the oxide 230 is kept by the physical thicknesses of the insulator 250 and the metal oxide, leakage current between the conductor 260 and the oxide 230 can be inhibited. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 functions as the first gate electrode of the transistor 200. The conductor 260 preferably includes the conductor 260*a* and the conductor 260*b* positioned over the conductor 260*a*. For example, the conductor 260*a* is preferably positioned to cover the bottom surface and the side surface of the conductor 260*b*. Moreover, as shown in FIG. 1B and FIG. 1C, the top surface of the conductor 260 is substantially level with the top surface of the insulator 250. Although the conductor 260 has a two-layer structure of the conductor 260*a* and the conductor 260*b* in FIG. 1B and FIG. 1C, the conductor 260 may have a single-layer structure or a stacked-layer structure of three or more layers.

For the conductor 260*a*, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260*a* has a function of inhibiting diffusion of oxygen, the conductivity of the conductor 260*b* can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260*b*. The conductor 260*b* may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be positioned certainly in a region between the conductor 242*a* and the conductor 242*b* without alignment.

As illustrated in FIG. 1C, in the channel width direction of the transistor 200, with reference to the bottom surface of the insulator 222, the level of the bottom surface of the conductor 260 in a region where the conductor 260 and the oxide 230*b* do not overlap with each other is preferably lower than the level of the bottom surface of the oxide 230*b*. When the conductor 260 functioning as the gate electrode covers the side surface and the top surface of the channel formation region of the oxide 230*b* with the insulator 250 and the like therebetween, the electric field of the conductor 260 is likely to act on the entire channel formation region of the oxide 230*b*. Thus, the on-state current of the transistor 200 can be increased and the frequency characteristics of the transistor 200 can be improved. When the bottom surface of the insulator 222 is a reference, the difference between the level of the bottom surface of the conductor 260 in a region where the oxide 230*a* and the oxide 230*b* and the conductor 260 do not overlap with each other and the level of the bottom surface of the oxide 230*b* is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 224, the oxide 230, the conductor 242, the insulator 271, and the insulator 272. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

The concentration of impurities such as water and hydrogen in the insulator 280 is preferably reduced. Moreover, the insulator 280 preferably has a low hydrogen concentration and includes an excess-oxygen region or excess oxygen, and may be provided using a material similar to that for the insulator 216, for example. The insulator 280 may have a stacked-layer structure of the above materials; for example, a stacked-layer structure of silicon oxide deposited by a sputtering method and silicon oxynitride deposited by a chemical vapor deposition (CVD) method to be stacked thereover can be employed. Furthermore, silicon nitride may be stacked thereover.

The insulator 282 or the insulator 283 preferably functions as a barrier insulating film that inhibits impurities such as water and hydrogen from diffusing into the insulator 280 from above. The insulator 282 or the insulator 283 preferably functions as a barrier insulating film that inhibits passage of oxygen. For the insulator 282 and the insulator 283, for example, an insulator such as aluminum oxide, silicon nitride, or silicon nitride oxide may be used. The insulator 282 may be formed using aluminum oxide that has a high blocking property against oxygen and the insulator 283 may be formed using silicon nitride that has a high blocking property against hydrogen, for example.

For the conductor 240*a* and the conductor 240*b*, a conductive material containing tungsten, copper, or aluminum as its main component is preferably used. The conductor 240*a* and the conductor 240*b* may each have a stacked-layer structure. Note that the conductor 240*a* and the conductor 240*b* each have a circular shape in the top view in FIG. 1A; however, the shapes of the conductors are not limited thereto. For example, in the top view, the conductor 240*a* and the conductor 240*b* may each have an almost circular shape such as an elliptical shape, a polygonal shape such as a quadrangular shape, or a polygonal shape such as a quadrangular shape with rounded corners.

In the case where the conductor 240 has a stacked-layer structure, a conductive material having a function of inhibiting passage of impurities such as water and hydrogen is preferably used for a conductor in contact with the insulator 283, the insulator 282, the insulator 280, and the insulator 271. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240a and the conductor 240b.

In the case where the conductor 240 has a stacked-layer structure, it is preferable to use, for the lower layer, a conductive material having a function of inhibiting passage of oxygen and impurities such as water and hydrogen. For example, tantalum, tantalum nitride, titanium, titanium nitride, ruthenium, or ruthenium oxide is preferably used. When the conductive material is used for the lower layer of the conductor 240, entry of impurities such as water and hydrogen diffused from the insulator 280 and the like into the oxide 230 through the conductor 240 can be further reduced. Furthermore, oxygen added to the insulator 280 can be prevented from being absorbed by the conductive material of the upper layer of the conductor 240. For the upper layer, a conductive material containing tungsten, copper, or aluminum as its main component is preferably used.

For the insulator 241a and the insulator 241b, for example, an insulator such as silicon nitride, aluminum oxide, or silicon nitride oxide may be used. Since the insulator 241a and the insulator 241b are provided in contact with the insulator 280, impurities such as water and hydrogen contained in the insulator 280 or the like can be inhibited from entering the oxide 230 through the conductor 240a and the conductor 240b. In particular, silicon nitride is suitable because of having a high blocking property against hydrogen. Furthermore, oxygen contained in the insulator 280 can be prevented from being absorbed by the conductor 240a and the conductor 240b.

The conductor 246 (the conductor 246a and the conductor 246b) functioning as a wiring may be provided in contact with the top surface of the conductor 240a and the top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and the conductive material, for example. Note that the conductor may be formed to be embedded in an opening provided in an insulator.

The insulator 286 is provided over the conductor 246 and the insulator 283. Accordingly, the top surface of the conductor 246 and the side surface of the conductor 246 are in contact with the insulator 286 and the bottom surface of the conductor 246 is in contact with the insulator 283. In other words, the conductor 246 can have a structure in which the conductor 246 is surrounded by the insulator 283 and the insulator 286. With such a structure, the passage of oxygen from the outside can be inhibited and the oxidation of the conductor 246 can be prevented. Furthermore, impurities such as water and hydrogen can be prevented from diffusing from the conductor 246 to the outside, which is preferable.

<Constituent Materials of Semiconductor Device>

Constituent materials that can be used for the semiconductor device will be described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a nitride of a metal and a substrate including an oxide of a metal. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low relative permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. For the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, for the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide, or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be filled.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

The oxide 230 is preferably formed using a metal oxide functioning as a semiconductor (an oxide semiconductor). A metal oxide that can be used for the oxide 230 of the present invention will be described below.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor will be described with reference to FIG. 2A. FIG. 2A is a diagram showing the classification of crystal structures of an oxide semiconductor, typically IGZO (a metal oxide containing In, Ga, and Zn).

As shown in FIG. 2A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (cloud-aligned composite) (excluding single crystal and poly crystal). Note that "Crystalline" excludes single crystal, poly crystal, and completely amorphous. "Crystal" includes single crystal and poly crystal.

Note that the structures in the thick frame in FIG. 2A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 2B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 2B and obtained by GIXD measurement is hereinafter simply referred to as an XRD spectrum. The CAAC-IGZO film in FIG. 2B has a composition in the vicinity of In:Ga:Zn=4:2:3 [atomic ratio]. The CAAC-IGZO film in FIG. 2B has a thickness of 500 nm.

As shown in FIG. 2B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 2B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 2C shows a diffraction pattern of the CAAC-IGZO film. FIG. 2C shows a diffraction pattern obtained by the NBED method in which an electron beam is incident in the direction parallel to the substrate. The CAAC-IGZO film in FIG. 2C has a composition in the vicinity of In:Ga:Zn=4:2:3 [atomic ratio]. In the nanobeam electron diffraction method, electron diffraction is performed with a probe diameter of 1 nm.

As shown in FIG. 2C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 2A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (µ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm', yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) can be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

Modification Example of Semiconductor Device

An example of the semiconductor device that is one embodiment of the present invention will be described below with reference to FIG. 3A to FIG. 3D.

Figure 3A:
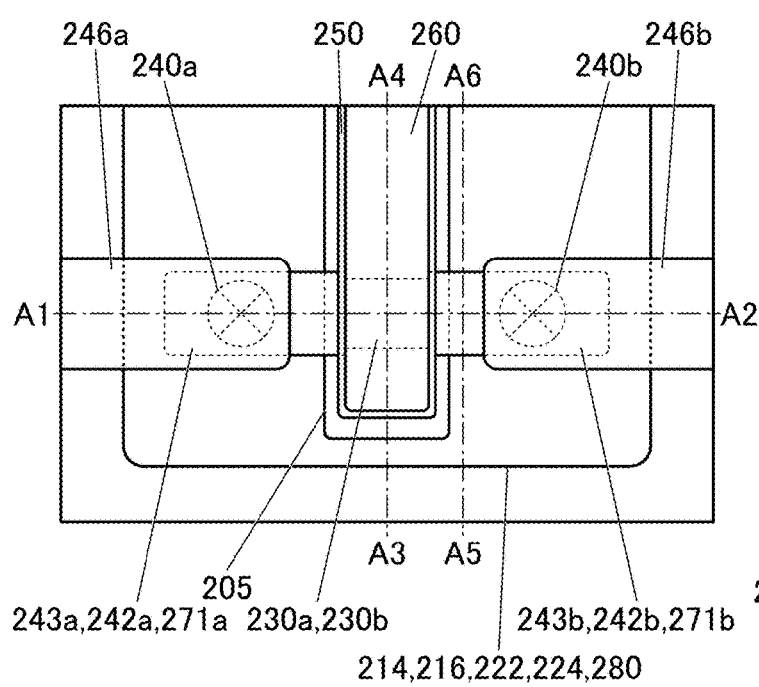
FIG. 3A is a top view of a semiconductor device of one embodiment of the present invention.
Figure 3C:
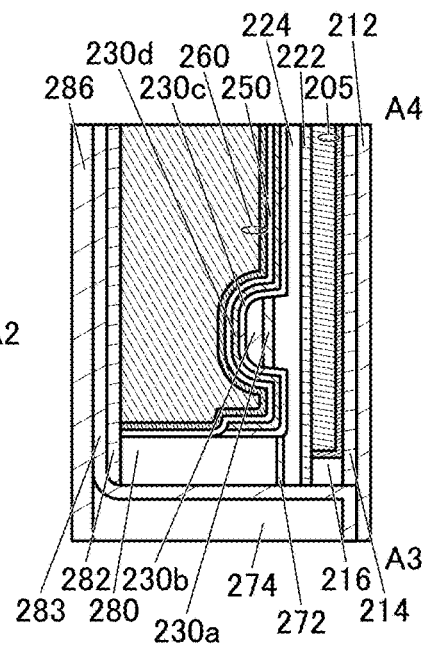
FIG. 3B to FIG. 3D are cross-sectional views of the semiconductor device of one embodiment of the present invention.
Figure 3B:
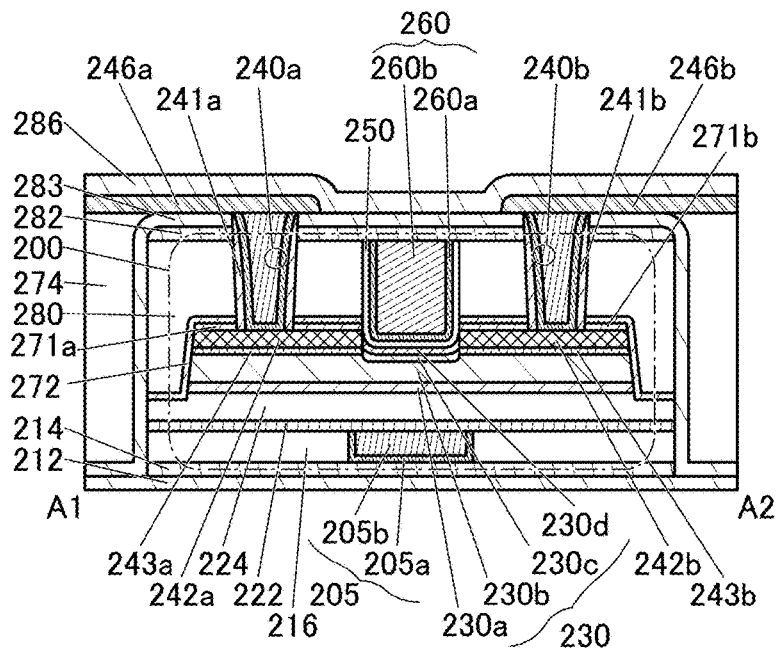
Figure 3D:
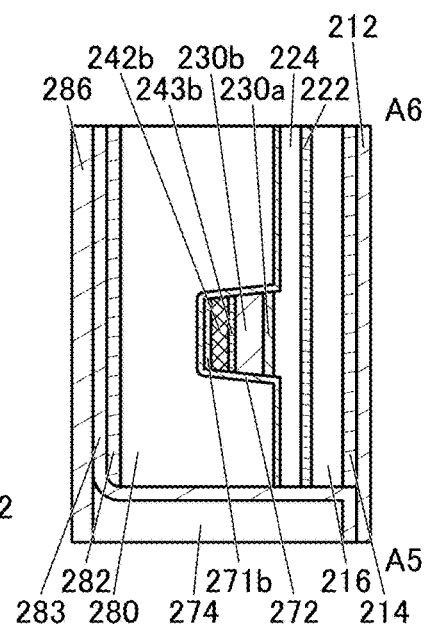
Figure 4A:
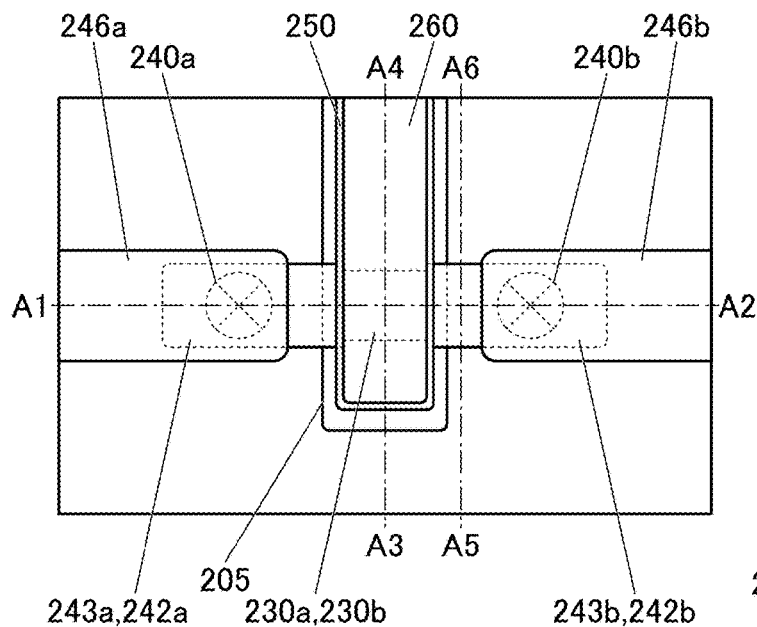
FIG. 4A is a top view of a semiconductor device of one embodiment of the present invention.
Figure 4C:
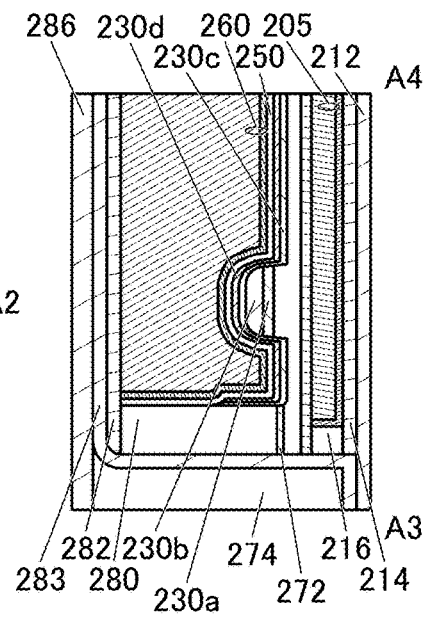
FIG. 4B to FIG. 4D are cross-sectional views of the semiconductor device of one embodiment of the present invention.
Figure 4B:
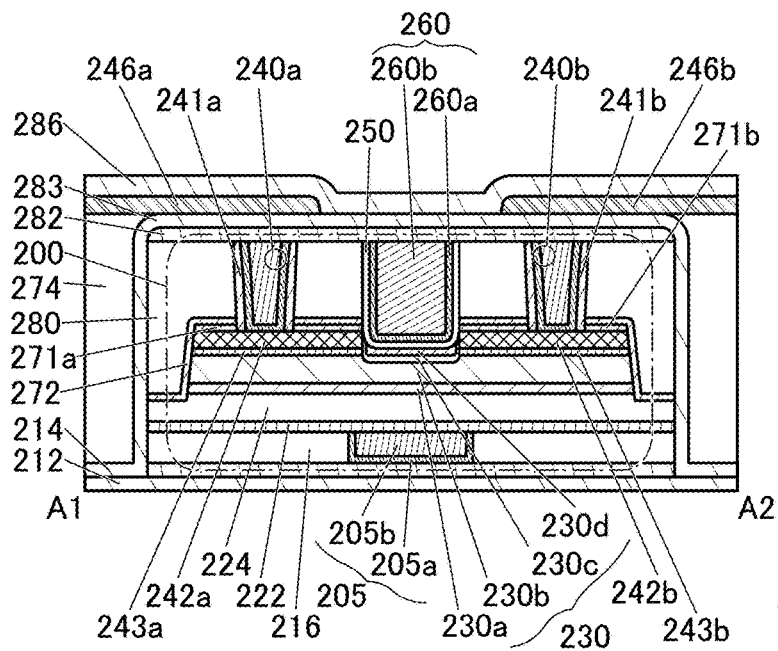
Figure 4D:
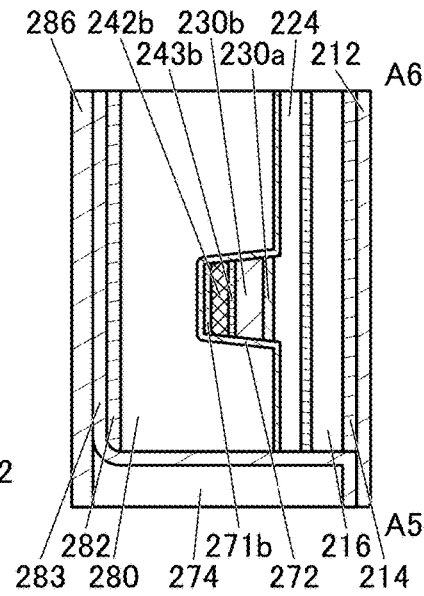
Figure 5A:
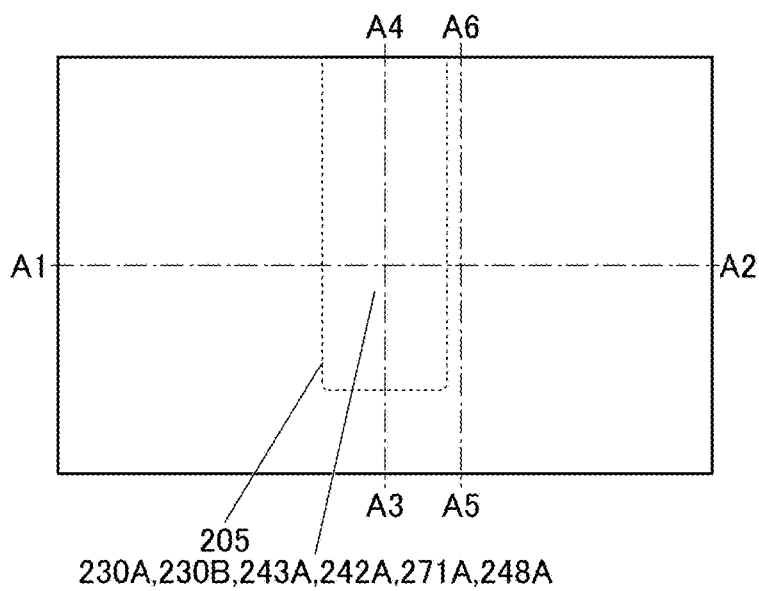
FIG. 5A is a top view illustrating a method for manufacturing a semiconductor device of one embodiment of the present invention.
Figure 5C:
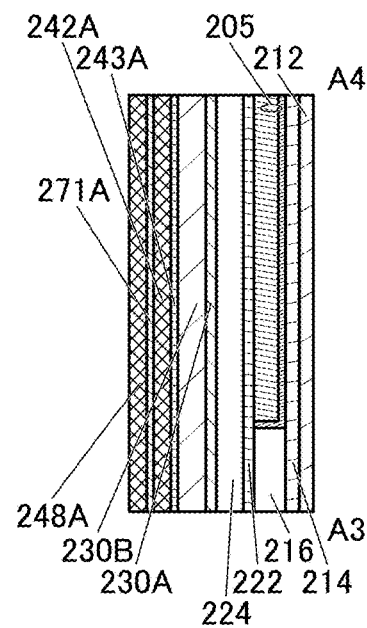
FIG. 5B to FIG. 5D are cross-sectional views illustrating the method for manufacturing a semiconductor device of one embodiment of the present invention.
Figure 5B:
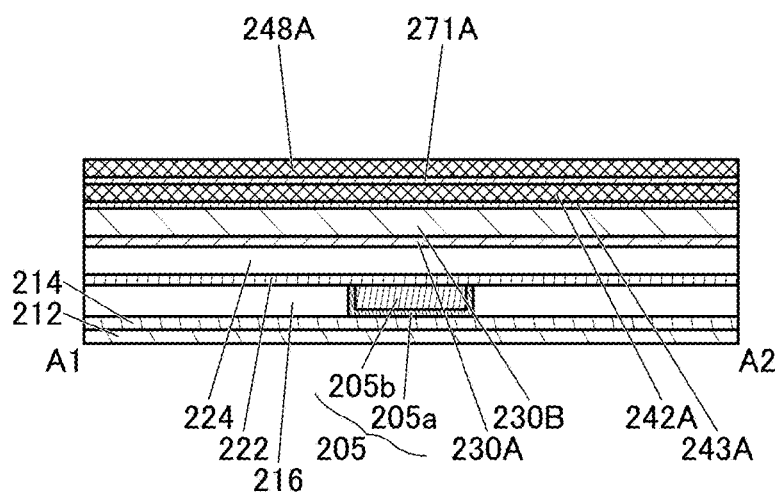
Figure 5D:
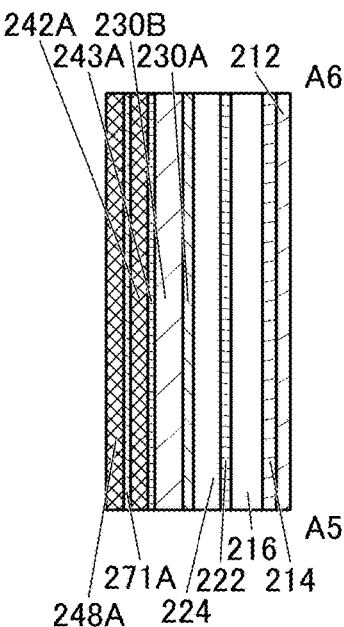

FIG. 3A is a top view of the semiconductor device. FIG. 3B is a cross-sectional view corresponding to a portion indicated by dashed-dotted line A1-A2 in FIG. 3A. FIG. 3C is a cross-sectional view corresponding to a portion indicated by dashed-dotted line A3-A4 in FIG. 3A. FIG. 3D is a cross-sectional view corresponding to a portion indicated by dashed-dotted line A5-A6 in FIG. 3A. Note that for clarity of the drawing, some components are not illustrated in the top view of FIG. 3A.

Note that in the semiconductor device illustrated in FIG. 3A to FIG. 3D, components having the same functions as the components included in the semiconductor device described in <Structure example of semiconductor device> are denoted by the same reference numerals. Note that the materials described in detail in <Structure example of semiconductor device> can also be used as constituent materials of the semiconductor device in this section.

The semiconductor device shown in FIG. 3A to FIG. 3D is a modification example of the semiconductor device shown in FIG. 1A to FIG. 1D. The semiconductor device in FIG. 3A to FIG. 3D is different from the semiconductor device in FIG. 1A to FIG. 1D in the shape of the insulator 283. An insulator 274 is included, which is also a difference.

In the semiconductor device shown in FIG. 3A to FIG. 3D, the insulator 214, the insulator 216, the insulator 222, the insulator 224, the insulator 272, the insulator 280, and the insulator 282 are patterned. The insulator 283 covers the insulator 214, the insulator 216, the insulator 222, the insulator 224, the insulator 272, the insulator 280, and the insulator 282. That is, the insulator 283 is in contact with the top surface and the side surface of the insulator 282 and the top surface of the insulator 212. Accordingly, the insulator 214, the insulator 216, the insulator 222, the insulator 224, the insulator 272, the insulator 280, and the insulator 282 in addition to the oxide 230 and the like are isolated from the outside by the insulator 283 and the insulator 212. In other words, the transistor 200 is located in a region sealed with the insulator 283 and the insulator 212.

For example, it is preferable that the insulator 214 and the insulator 282 be formed using a material having a function of trapping or fixing hydrogen, and the insulator 212 and the insulator 283 be formed using a material having a function of inhibiting the diffusion of hydrogen and oxygen. Typically, aluminum oxide can be used for the insulator 214 and the insulator 282. Moreover, typically, silicon nitride can be used for the insulator 212 and the insulator 283.

With the above structure, entry of hydrogen contained in a region outside the sealed region into the sealed region can be inhibited.

Although the transistor 200 having a structure in which the insulator 212 and the insulator 283 each have a single-layer structure is shown in FIG. 3A to FIG. 3D, the present invention is not limited thereto. For example, each of the insulators 212 and the insulator 283 may have a stacked-layer structure of two or more layers.

The insulator 274 functions as an interlayer film. The permittivity of the insulator 274 is preferably lower than that of the insulator 214. When a material with a low permittivity is used for an interlayer film, parasitic capacitance generated between wirings can be reduced. The insulator 274 can be provided using a material similar to that for the insulator 280, for example.

Alternatively, an insulator with reduced hydrogen is preferably used for the insulator 274. With the use of an insulator with reduced hydrogen, diffusion of hydrogen into the transistor 200 can be inhibited. For the insulator 274, an insulator may be formed by a sputtering method, for example. The hydrogen concentration in the insulator formed by a sputtering method is lower than the hydrogen concentration in an insulator formed by a CVD method, which is preferable.

<Manufacturing Method of Semiconductor Device>

Next, a method of manufacturing the semiconductor device that is one embodiment of the present invention and is illustrated in FIG. 3A to FIG. 3D is described with reference to FIG. 5A to FIG. 21D.

In FIG. 5A to FIG. 21D, A of each drawing is a top view. Moreover, B of each drawing is a cross-sectional view corresponding to a portion indicated by dashed-dotted line A1-A2 in A, and is also a cross-sectional view of the transistor 200 in the channel length direction. Furthermore, C of each drawing is a cross-sectional view corresponding to a portion indicated by dashed-dotted line A3-A4 in A, and is also a cross-sectional view of the transistor 200 in the channel width direction. Furthermore, D of each drawing is a cross-sectional view of a portion indicated by dashed-dotted line A5-A6 in A. Note that for simplification of the drawing, some components are not shown in the top view of A of each drawing.

First, a substrate (not shown) is prepared, and the insulator 212 is deposited over the substrate. The insulator 212 can be deposited by a sputtering method, a CVD method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method depending on a source gas to be used.

A high-quality film can be obtained at a relatively low temperature by a plasma enhanced CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD (Plasma Enhanced ALD) method, in which a reactant excited by plasma is used, and the like can be used.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. The use of plasma in a PEALD (Plasma Enhanced ALD) method is sometimes preferable because deposition at a lower temperature is possible. Note that a precursor used in an ALD method sometimes contains impurities such as carbon. Thus, in some cases, a film provided by an ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method and an ALD method, a film with a certain composition can be deposited depending on the flow rate ratio of the source gases. Moreover, for example, by a CVD method and an ALD method, a film whose composition is continuously changed can be deposited by changing the flow rate ratio of the source gases during the deposition. In the case where the film is deposited while the flow rate ratio of the source gases is changed, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 212, silicon nitride is formed by a sputtering method.

When an insulator through which copper is less likely to pass, such as silicon nitride, is used for the insulator 212 in such a manner, even in the case where a metal that is likely to diffuse, such as copper, is used for a conductor in a layer (not shown) below the insulator 212, diffusion of the metal into an upper portion through the insulator 212 can be inhibited. The use of an insulator through which impurities such as water and hydrogen are less likely to pass, such as silicon nitride, can inhibit diffusion of impurities such as water and hydrogen contained in a layer below the insulator 212.

Next, the insulator 214 is deposited over the insulator 212. The insulator 214 can be deposited by a sputtering method, a CVD method, an MBE method, a PLD method, an ALD method, or the like. In this embodiment, for the insulator 214, aluminum oxide is deposited by a sputtering method.

Furthermore, the hydrogen concentration in the insulator 214 is preferably lower than the hydrogen concentration in the insulator 212. When silicon nitride is deposited by a sputtering method for the insulator 212, silicon nitride having a low hydrogen concentration can be formed. When the insulator 214 is formed using aluminum oxide, the insulator 214 can have a lower hydrogen concentration than the insulator 212.

The transistor 200 is formed over the insulator 214 in a later step; it is preferable that a film adjacent to the transistor 200 have a relatively low hydrogen concentration and a film with a relatively high hydrogen concentration be positioned away from the transistor 200.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide or silicon oxynitride is deposited by a sputtering method.

The insulator 212, the insulator 214, and the insulator 216 are preferably deposited in a reduced pressure successively without being exposed to the air. The deposition without exposure to the air is preferable because impurities or moisture from the atmospheric environment can be prevented from attaching onto the insulator 212, the insulator 214, and the insulator 216, so that the interface between the insulator 212 and the insulator 214, the vicinity of the interface, the interface between the insulator 214 and the insulator 216, and the vicinity of the interface can be kept clean. For example, a multi-chamber deposition apparatus is used for the successive deposition. The successive deposition can reduce the manufacturing time of the semiconductor device, which is preferable.

Next, an opening reaching the insulator 214 is formed in the insulator 216. Wet etching can be used for the formation of the opening; however, dry etching is preferably used for microfabrication. As the insulator 214, it is preferable to select an insulator that functions as an etching stopper film used in forming a groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is deposited. The conductive film preferably includes a conductor that has a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, the conductive film to be the conductor 205a has a multilayer structure. First, tantalum nitride is deposited by a sputtering method, and titanium nitride is stacked over the tantalum nitride. When such metal nitrides are used for a lower layer of the conductor 205b, even in the case where a metal that is likely to diffuse, such as copper, is used for a conductive film to be the conductor 205b described below, outward diffusion of the metal from the conductor 205a can be inhibited.

Next, a conductive film to be the conductor 205b is deposited. The conductive film can be deposited by a plating method, a sputtering method, a CVD method, an MBE method, a PLD method, an ALD method, or the like. In this embodiment, for the conductive film to be the conductor 205b, a low-resistance conductive material such as copper is deposited.

Next, CMP treatment is performed, thereby removing part of the conductive film to be the conductor 205a and part of the conductive film to be the conductor 205b to expose the insulator 216. As a result, the conductor 205a and the conductor 205b remain only in the opening portion. Thus, the conductor 205 whose top surface is flat can be formed (see FIG. 5A to FIG. 5D). Note that the insulator 216 is partly removed by the CMP treatment in some cases.

Although the conductor 205 is embedded in the opening in the insulator 216 in the above description, this embodiment is not limited to this structure. For example, the surface of the conductor 205 may be exposed in the following manner: the conductor 205 is formed over the insulator 214, the insulator 216 is deposited over the conductor 205, and the insulator 216 is subjected to the CMP treatment so that the insulator 216 is partly removed.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the insulator 222 and the like as much as possible.

In this embodiment, as the heat treatment, after the deposition of the insulator 222, heat treatment at 400° C. for one hour is performed with a flow rate ratio of a nitrogen gas and an oxygen gas of 4 slm:1 slm. By the heat treatment, impurities such as water and hydrogen contained in the insulator 222 can be removed, for example. In the case where an oxide containing hafnium is used for the insulator 222, the heat treatment can improve the crystallinity of the insulator 222. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, for the insulator 224, silicon oxide or a silicon oxynitride film is deposited by an ALD method. The insulator 224 is preferably deposited by a deposition method using a gas in which hydrogen atoms are reduced or removed. Thus, the hydrogen concentration in the insulator 224 can be reduced. The hydrogen concentration in the insulator 224 is preferably reduced because the insulator 224 is in contact with the oxide 230*a* in a later step.

Here, plasma treatment containing oxygen may be performed under reduced pressure so that an excess-oxygen region can be formed in the insulator 224. For the plasma treatment containing oxygen, an apparatus including a power source for generating high-density plasma using a microwave is preferably used, for example. Alternatively, a power source for applying an RF (Radio Frequency) to the substrate side may be included. The use of high-density plasma enables high-density oxygen radicals to be generated, and RF application to the substrate side allows the oxygen radicals generated by the high-density plasma to be efficiently introduced into the insulator 224. Alternatively, after plasma treatment containing an inert gas is performed using this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment does not need to be performed.

Here, after aluminum oxide is deposited over the insulator 224 by a sputtering method, for example, CMP treatment may be performed until the insulator 224 is exposed. The CMP treatment can planarize and smooth the surface of the insulator 224. When the CMP treatment is performed on the aluminum oxide positioned over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can prevent deterioration in the coverage with an oxide deposited later and a decrease in the yield of the semiconductor device in some cases. The deposition of aluminum oxide over the insulator 224 by a sputtering method is preferred because oxygen can be added to the insulator 224.

Next, an oxide film 230A and an oxide film 230B are deposited in this order over the insulator 224 (see FIG. 5A to FIG. 5D).

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is being heated, the crystallinity of the oxide film can be improved.

In this embodiment, the oxide film 230A is deposited by a sputtering method using an oxide target with In:Ga:Zn=1:3:4 [atomic ratio]. In addition, the oxide film 230B is deposited by a sputtering method using an oxide target with In:Ga:Zn=4:2:4.1 [atomic ratio]. Note that each of the oxide films is preferably formed to have characteristics required for the oxide 230a and the oxide 230b by selecting the deposition conditions and the atomic ratios as appropriate.

Next, an oxide film 243A is deposited over the oxide film 230B (see FIG. 5A to FIG. 5D). The oxide film 243A can be deposited by a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is deposited by a sputtering method using an oxide target with In:Ga:Zn=1:3:4 [atomic ratio].

The oxide film 230A, the oxide film 230B, and the oxide film 243A are preferably deposited successively under reduced pressure without being exposed to the air environment. Depositing these films without being exposed to the air environment can prevent impurities or moisture from the air environment from attaching onto the oxide film 230A, the oxide film 230B, and the oxide film 243A; this can keep clean the interface between the oxide film 230A and the oxide film 230B, the vicinity of the interface, the interface between the oxide film 230B and the oxide film 243A, and the vicinity of the interface, which is preferable. For example, a multi-chamber deposition apparatus is used. The successive deposition can reduce the manufacturing time of the semiconductor device, which is preferable.

Next, heat treatment is preferably performed. The heat treatment is performed in a temperature range where the oxide film 230A, the oxide film 230B, and the oxide film 243A do not become polycrystals, i.e., at a temperature higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent entry of moisture or the like into the oxide film 230A, the oxide film 230B, the oxide film 243A, and the like as much as possible.

In this embodiment, the heat treatment is performed in such a manner that treatment is performed at 550° C. in a nitrogen atmosphere for one hour and then another treatment is successively performed at 550° C. in an oxygen atmosphere for one hour. By the heat treatment, impurities such as water and hydrogen in the oxide film 230A, the oxide film 230B, and the oxide film 243A can be removed, for example. Furthermore, the heat treatment improves the crystallinity of the oxide film 230B, thereby offering a dense structure with higher density. Thus, diffusion of oxygen or impurities in the oxide film 230B can be reduced.

Then, a conductive film 242A is deposited over the oxide film 243A (see FIG. 5A to FIG. 5D). The conductive film 242A can be deposited by a sputtering method, a CVD method, an MBE method, a PLD method, an ALD method, or the like. Note that heat treatment may be performed before the deposition of the conductive film 242A. This heat treatment may be performed under reduced pressure, and the conductive film 242A may be successively formed without exposure to the air. The treatment can remove moisture and hydrogen adsorbed onto the surface of the oxide film 243A and the like, and further can reduce the moisture concentration and the hydrogen concentration in the oxide film 230A, the oxide film 230B, and the oxide film 243A. The heat treatment is preferably performed at a temperature higher than or equal to 100° C. and lower than or equal to 400° C. In this embodiment, the heat treatment is performed at 200° C.

Next, an insulating film 271A is deposited over the conductive film 242A (see FIG. 5A to FIG. 5D). The insulating film 271A can be deposited by a sputtering method, a CVD method, an MBE method, a PLD method, an ALD method, or the like. As the insulating film 271A, an insulating film having a function of inhibiting passage of oxygen is preferably used. For example, as the insulating film 271A, aluminum oxide, hafnium oxide, silicon nitride, or the like may be deposited by a sputtering method or an ALD method.

Next, a conductive film 248A is deposited over the insulating film 271A (see FIG. 5A to FIG. 5D). The conductive film 248A can be deposited by a sputtering method, a CVD method, an MBE method, a PLD method, an ALD method, or the like. For example, a conductive film similar to the conductive film 242A may be used as the conductive film 248A.

In this embodiment, tantalum nitride, aluminum oxide, and tantalum nitride are deposited by a sputtering method for the conductive film 242A, the insulating film 271A, and the conductive film 248A, respectively.

The conductive film 242A, the insulating film 271A, and the conductive film 248A are preferably deposited under reduced pressure successively without being exposed to the air environment. Depositing these films without being exposed to the air environment can prevent impurities or moisture from the air environment from attaching onto the conductive film 242A, the insulating film 271A, and the conductive film 248A; this can keep clean the interface between the conductive film 242A and the insulating film 271A, the vicinity of the interface, the interface between the insulating film 271A and the conductive film 248A, and the vicinity of the interface, which is preferable. For example, a multi-chamber deposition apparatus is used. The successive deposition can reduce the manufacturing time of the semiconductor device, which is preferable.

Next, the oxide film 230A, the oxide film 230B, the oxide film 243A, the conductive film 242A, the insulating film 271A, and the conductive film 248A are processed into island shapes by a lithography method to form the oxide 230a, the oxide 230b, an oxide layer 243B, a conductive layer 242B, an insulating layer 271B, and a conductive layer 248 (see FIG. 6A to FIG. 6D). A dry etching method or a wet etching method can be used for the processing. Processing by a dry etching method is suitable for microfabrication. The oxide film 230A, the oxide film 230B, the oxide film 243A, the conductive film 242A, the insulating film 271A, and the conductive film 248A may be processed under different conditions. Note that in this step, the thickness of the insulator 224 in a region not overlapping with the oxide 230a is reduced in some cases.

Note that in the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps. In this embodiment, the insulating layer 271B and the conductive layer 248 are used as hard masks.

Figure 6A:
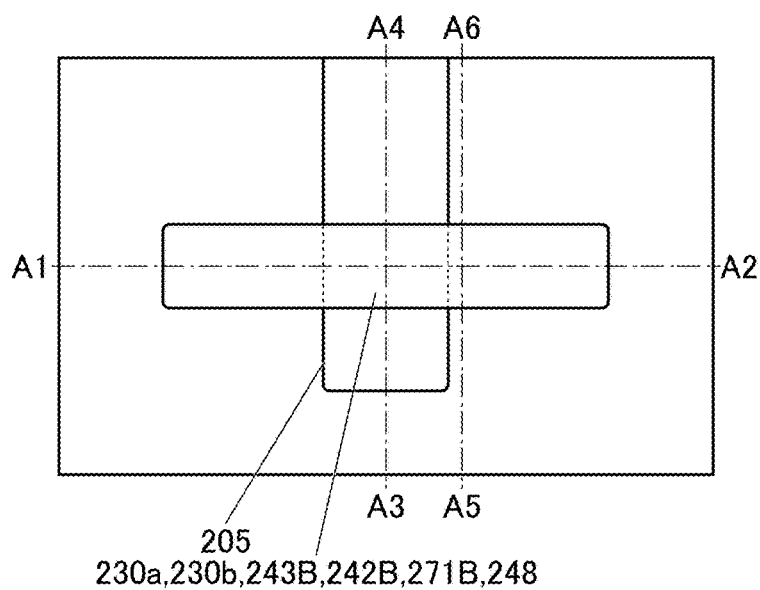
FIG. 6A is a top view illustrating the method for manufacturing a semiconductor device of one embodiment of the present invention.
Figure 6C:
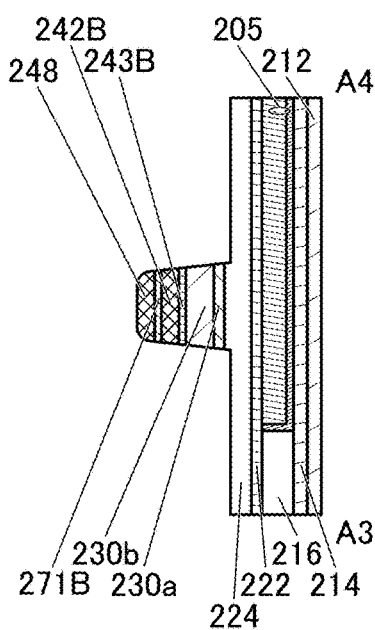
FIG. 6B to FIG. 6D are cross-sectional views illustrating the method for manufacturing a semiconductor device of one embodiment of the present invention.
Figure 6B:
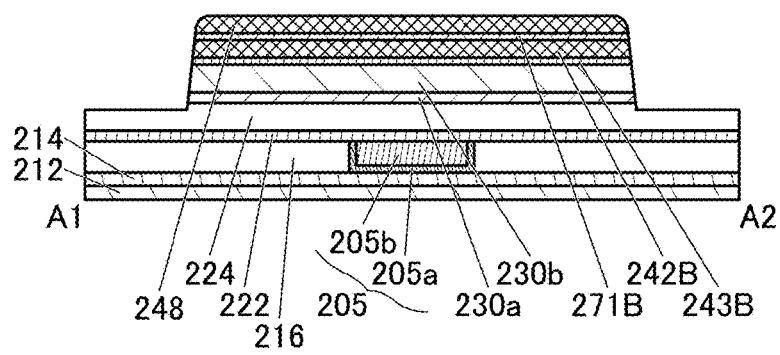
Figure 6D:
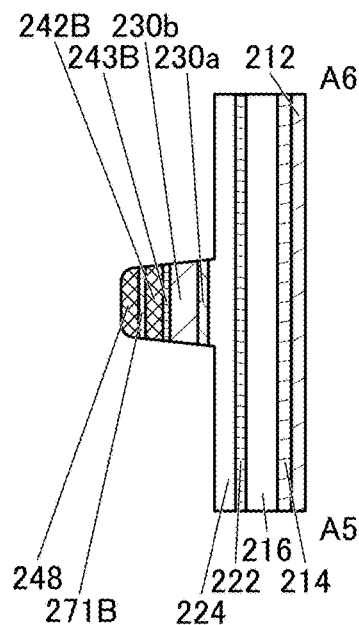
Figure 7A:
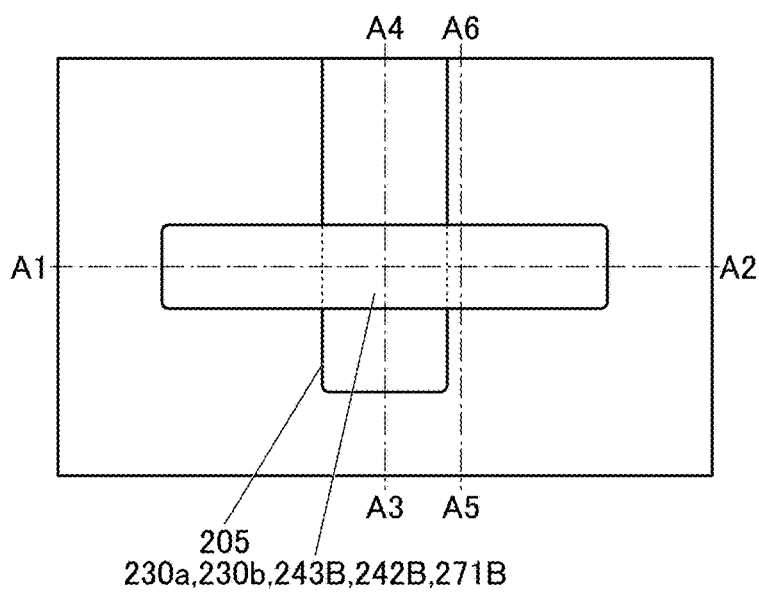
FIG. 7A is a top view illustrating the method for manufacturing a semiconductor device of one embodiment of the present invention.
Figure 7C:
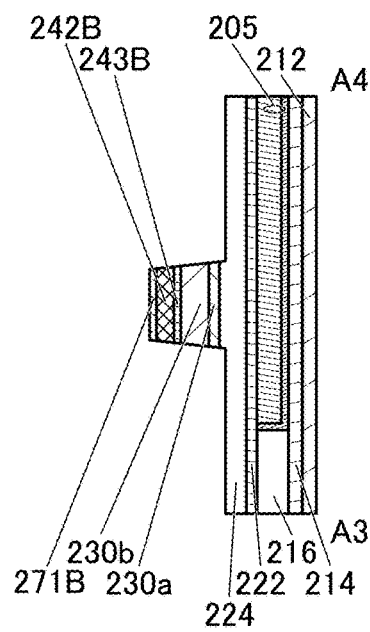
FIG. 7B to FIG. 7D are cross-sectional views illustrating the method for manufacturing a semiconductor device of one embodiment of the present invention.
Figure 7B:
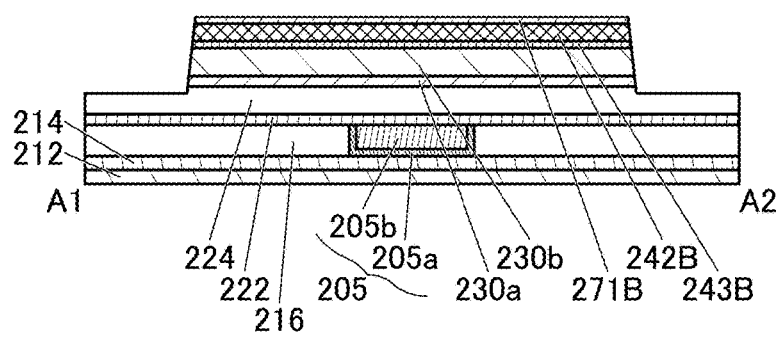
Figure 7D:
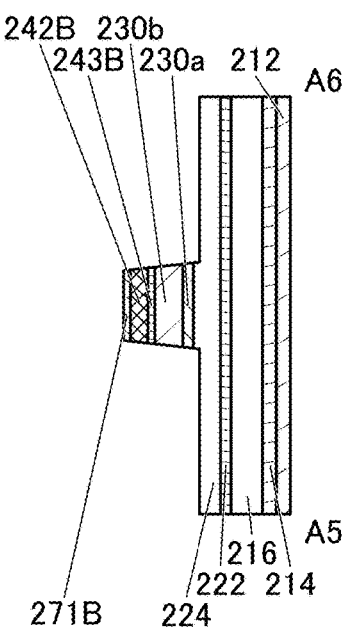
Figure 8A:
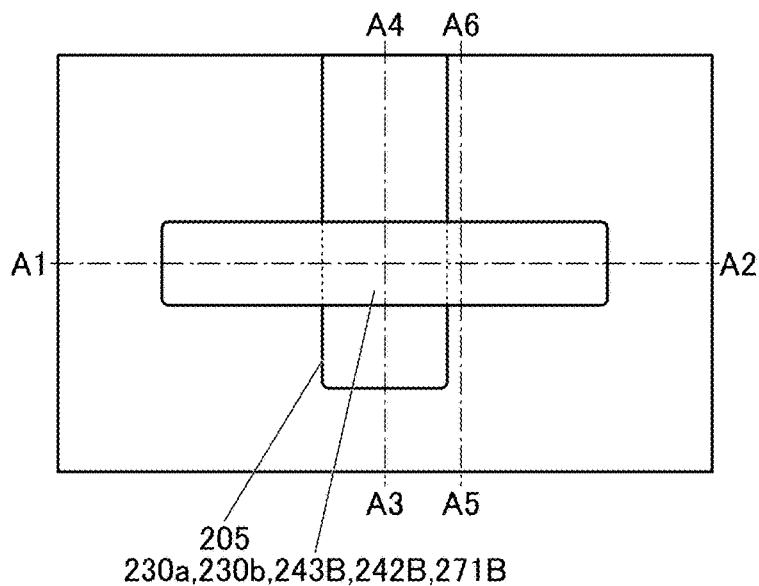
FIG. 8A is a top view illustrating the method for manufacturing a semiconductor device of one embodiment of the present invention.
Figure 8C:
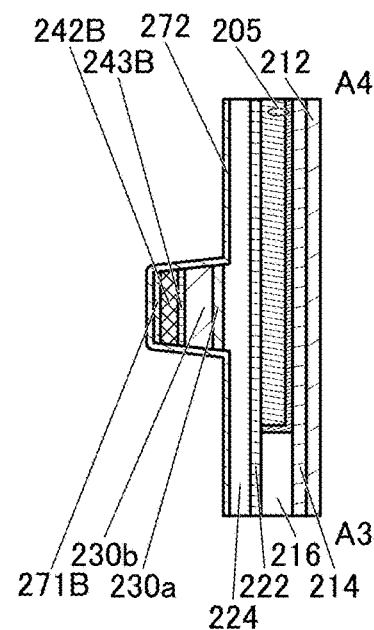
FIG. 8B to FIG. 8D are cross-sectional views illustrating the method for manufacturing a semiconductor device of one embodiment of the present invention.
Figure 8B:
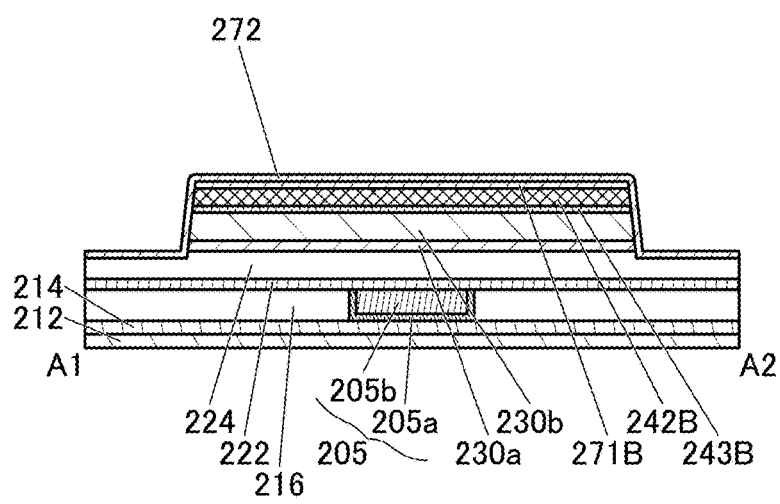
Figure 8D:
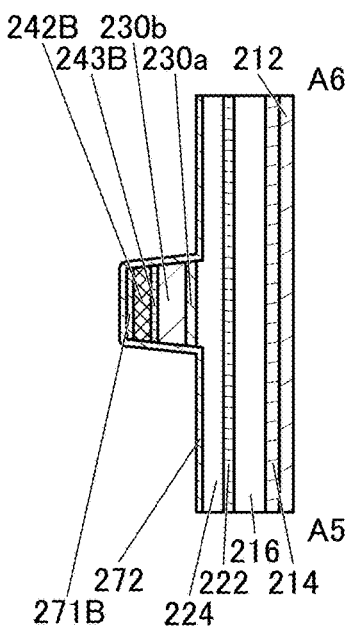
Figure 9A:
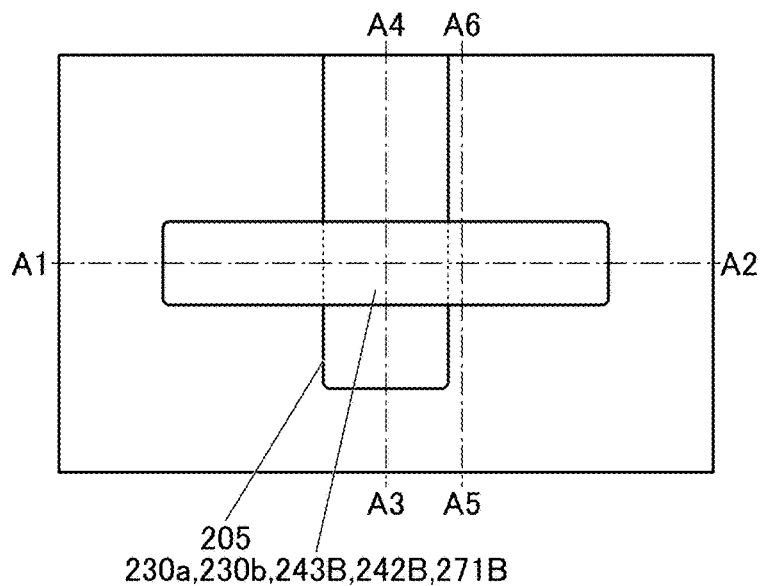
FIG. 9A is a top view illustrating the method for manufacturing a semiconductor device of one embodiment of the present invention.
Figure 9C:
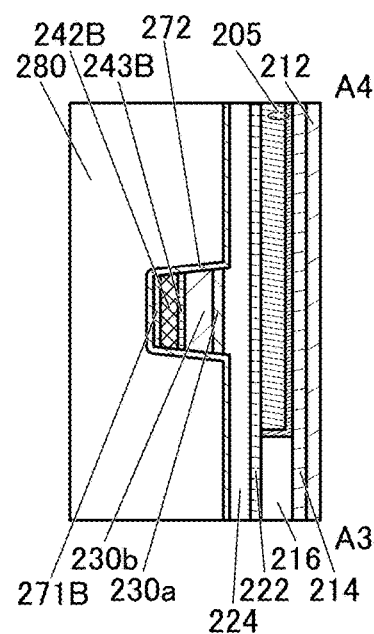
FIG. 9B to FIG. 9D are cross-sectional views illustrating the method for manufacturing a semiconductor device of one embodiment of the present invention.
Figure 9B:
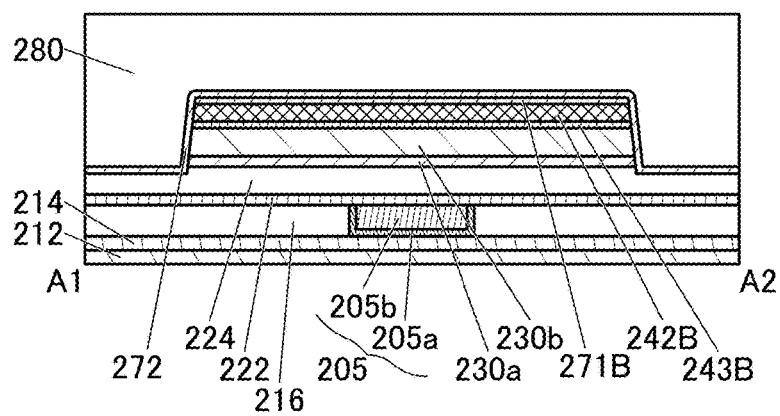
Figure 9D:
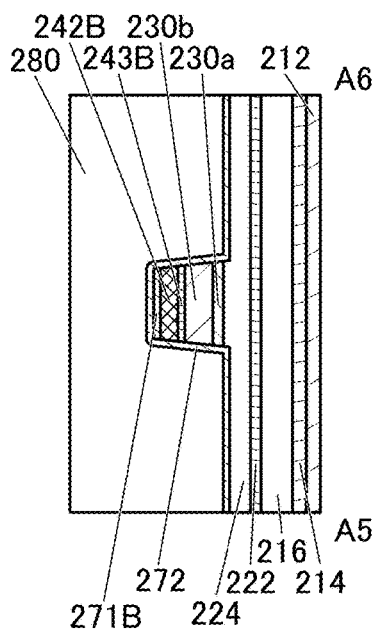
Figure 10A:
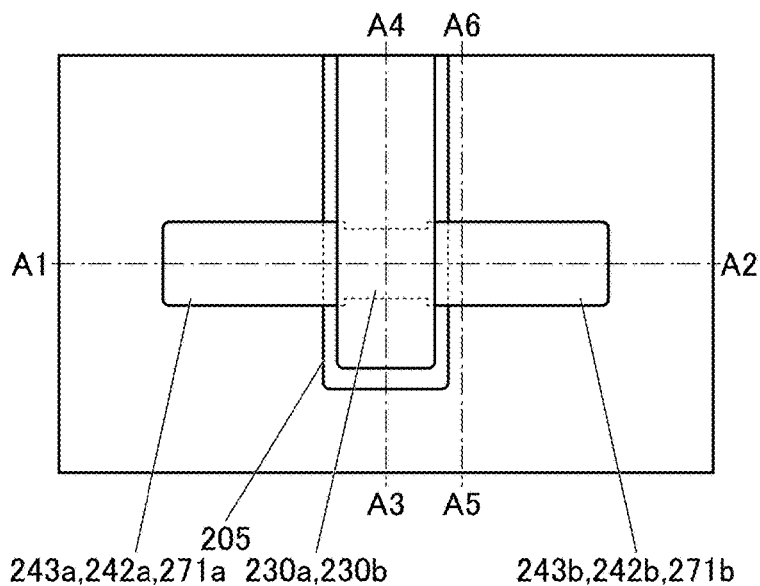
FIG. 10A is a top view illustrating the method for manufacturing a semiconductor device of one embodiment of the present invention.
Figure 10C:
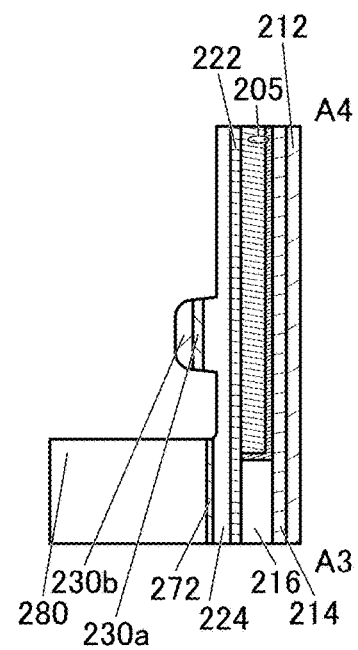
FIG. 10B to FIG. 10D are cross-sectional views illustrating the method for manufacturing a semiconductor device of one embodiment of the present invention.
Figure 10B:
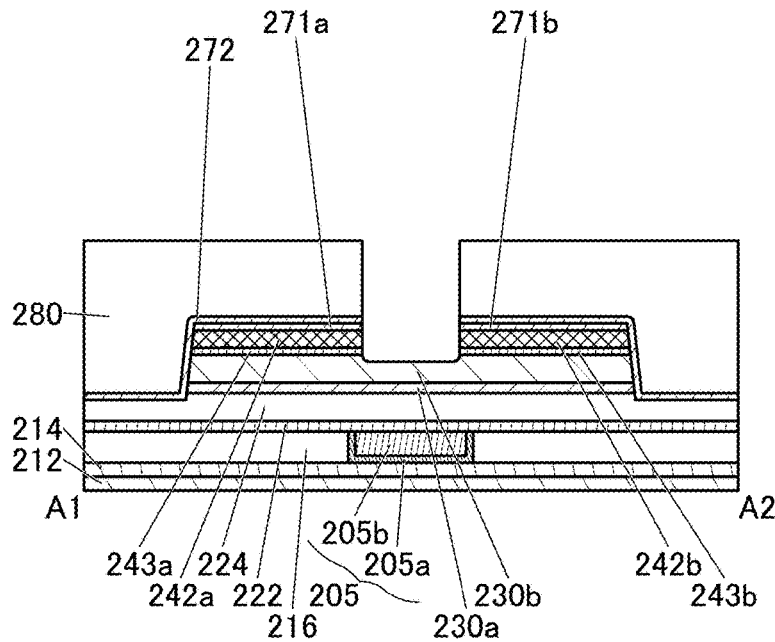
Figure 10D:
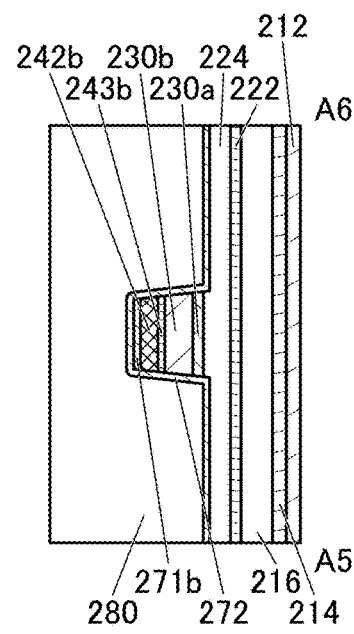
Figure 11A:
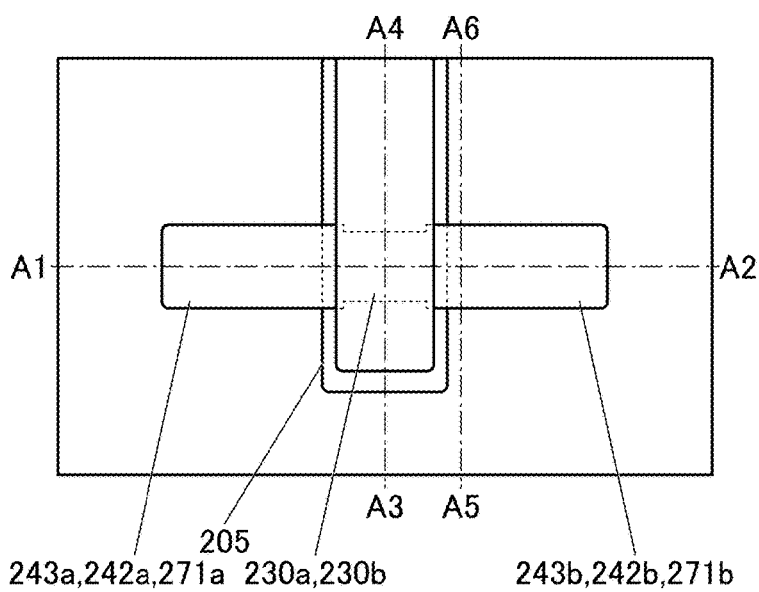
FIG. 11A is a top view illustrating the method for manufacturing a semiconductor device of one embodiment of the present invention.
Figure 11C:
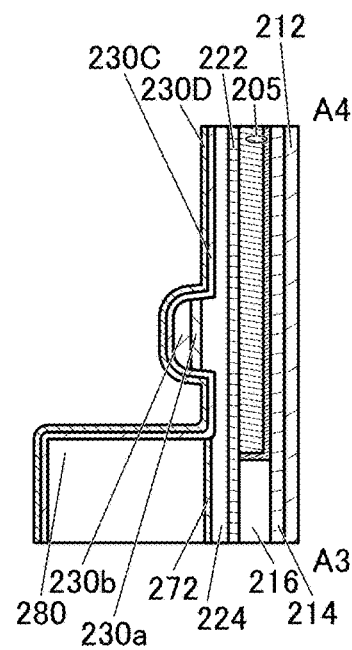
FIG. 11B to FIG. 11D are cross-sectional views illustrating the method for manufacturing a semiconductor device of one embodiment of the present invention.
Figure 11B:
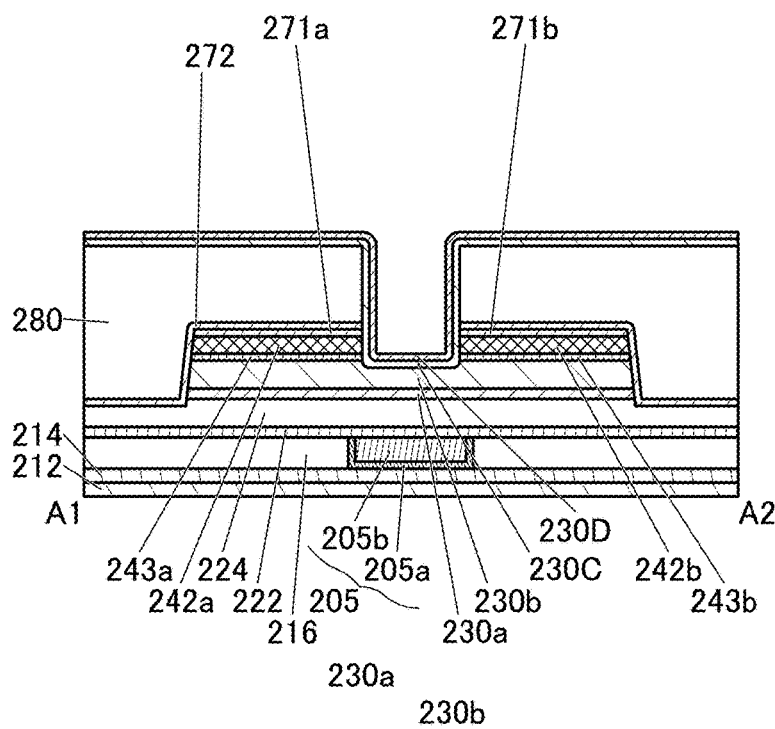
Figure 11D:
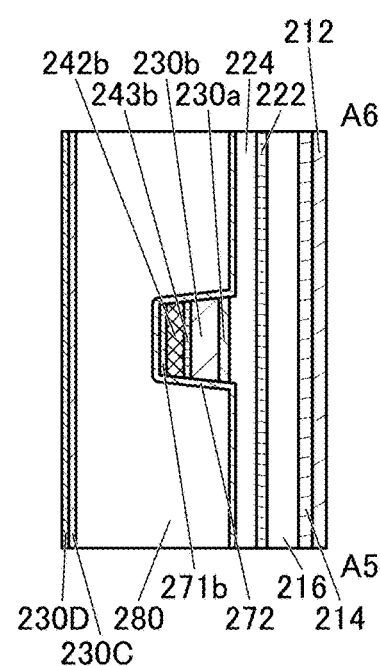
Figure 12A:
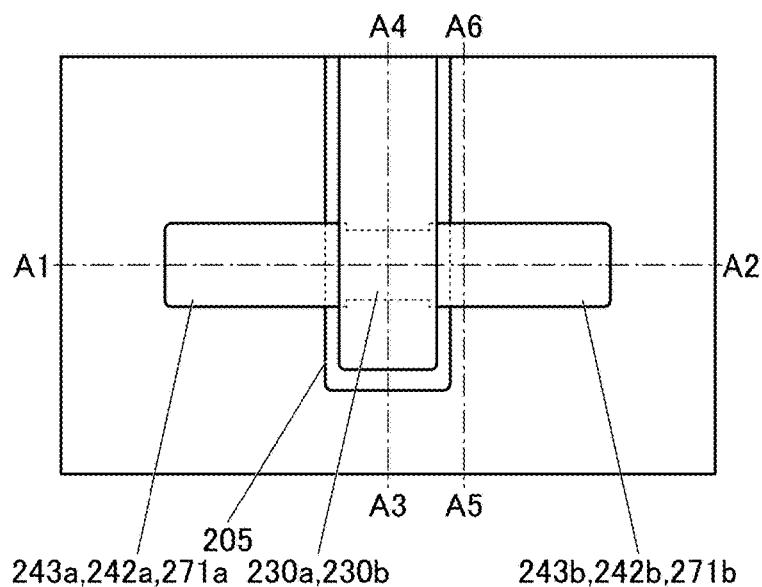
FIG. 12A is a top view illustrating the method for manufacturing a semiconductor device of one embodiment of the present invention.
Figure 12C:
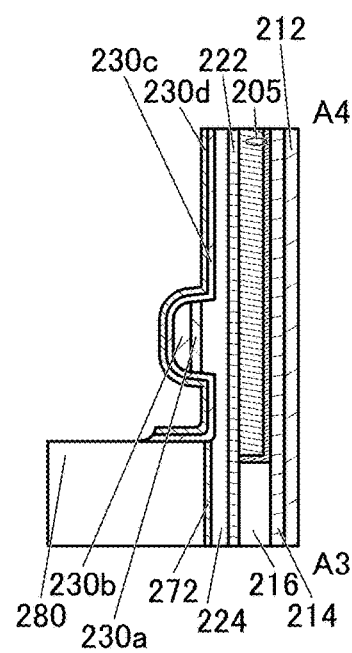
FIG. 12B to FIG. 12D are cross-sectional views illustrating the method for manufacturing a semiconductor device of one embodiment of the present invention.
Figure 12B:
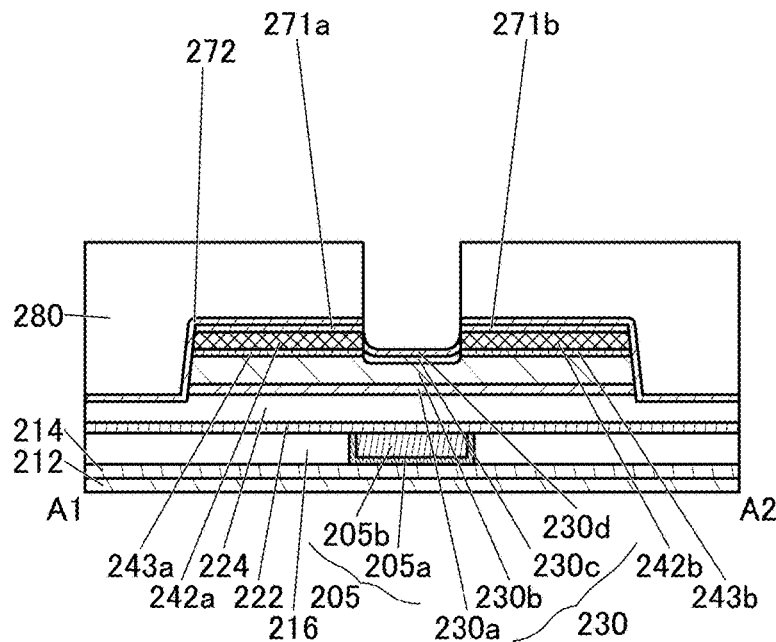
Figure 12D:
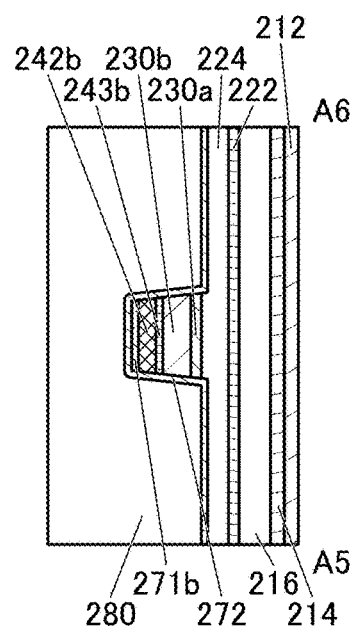
Figure 13A:
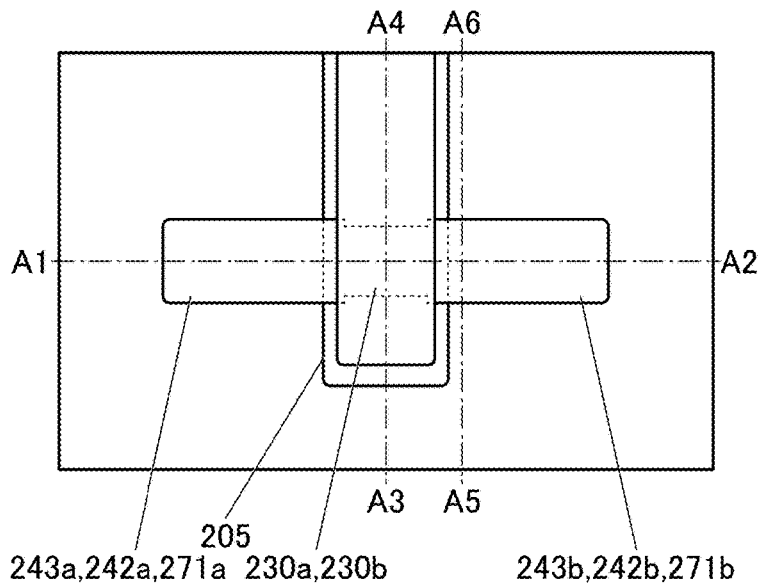
FIG. 13A is a top view illustrating the method for manufacturing a semiconductor device of one embodiment of the present invention.
Figure 13C:
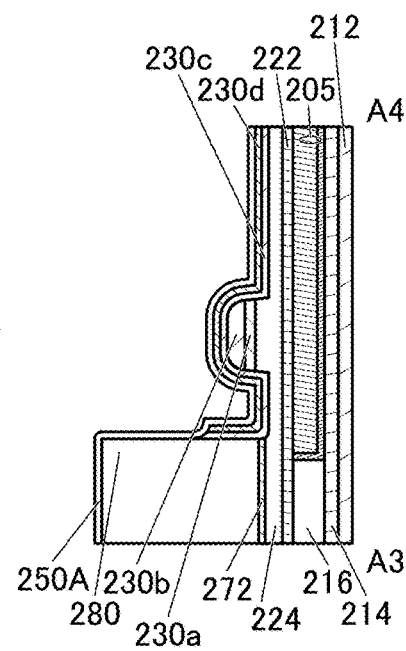
FIG. 13B to FIG. 13D are cross-sectional views illustrating the method for manufacturing a semiconductor device of one embodiment of the present invention.
Figure 13B:
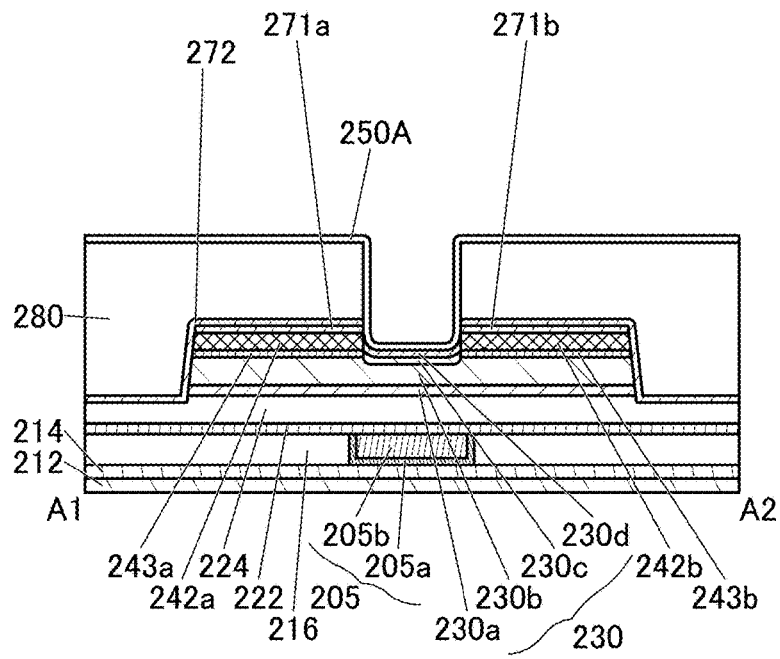
Figure 13D:
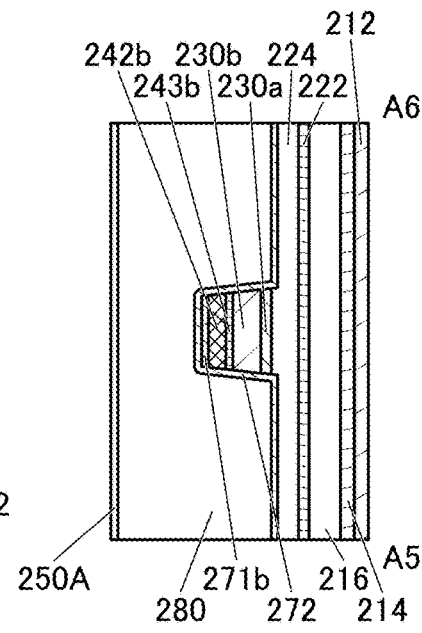
Figure 14A:
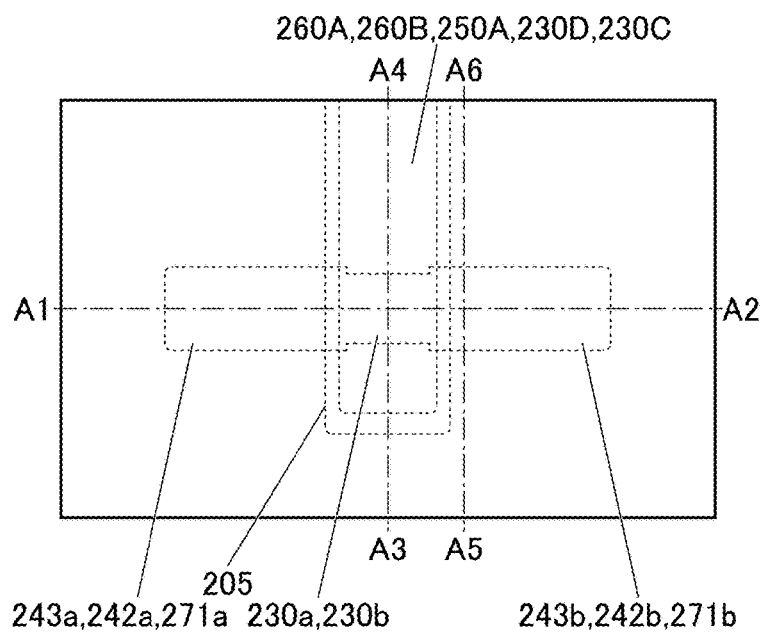
FIG. 14A is a top view illustrating the method for manufacturing a semiconductor device of one embodiment of the present invention.
Figure 14C:
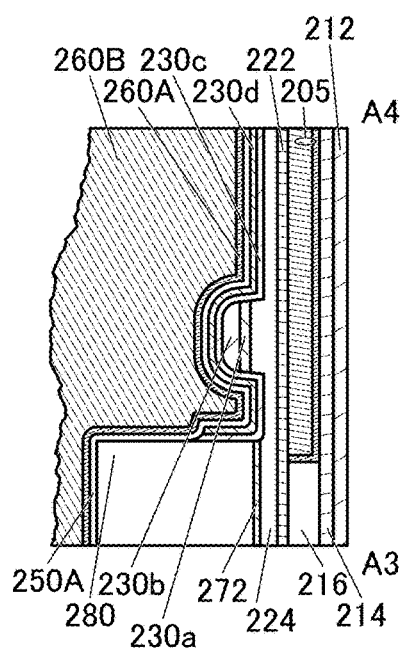
FIG. 14B to FIG. 14D are cross-sectional views illustrating the method for manufacturing a semiconductor device of one embodiment of the present invention.
Figure 14B:
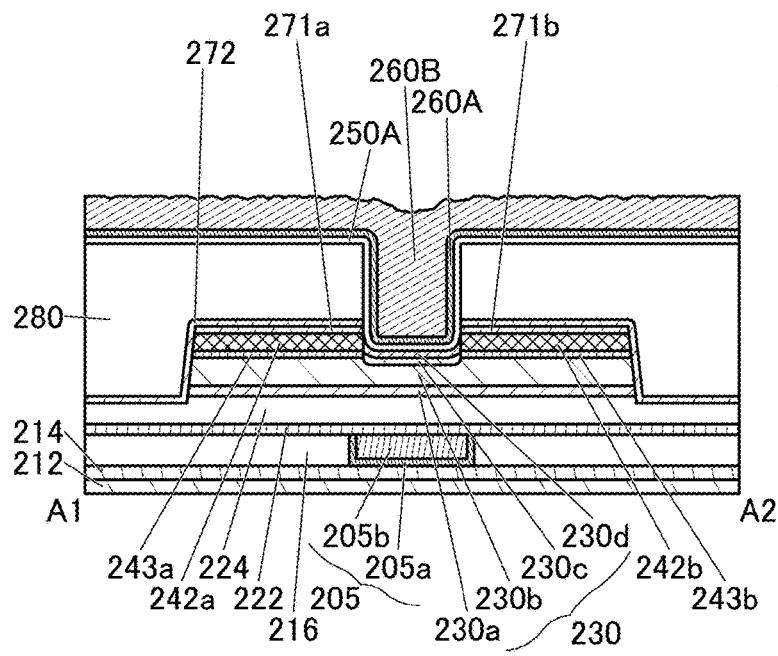
Figure 14D:
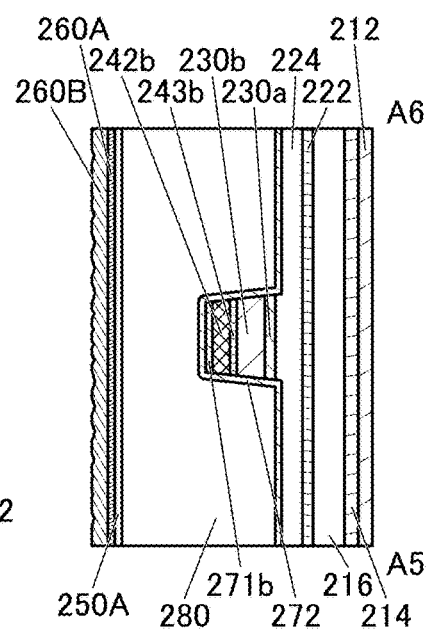
Figure 15A:
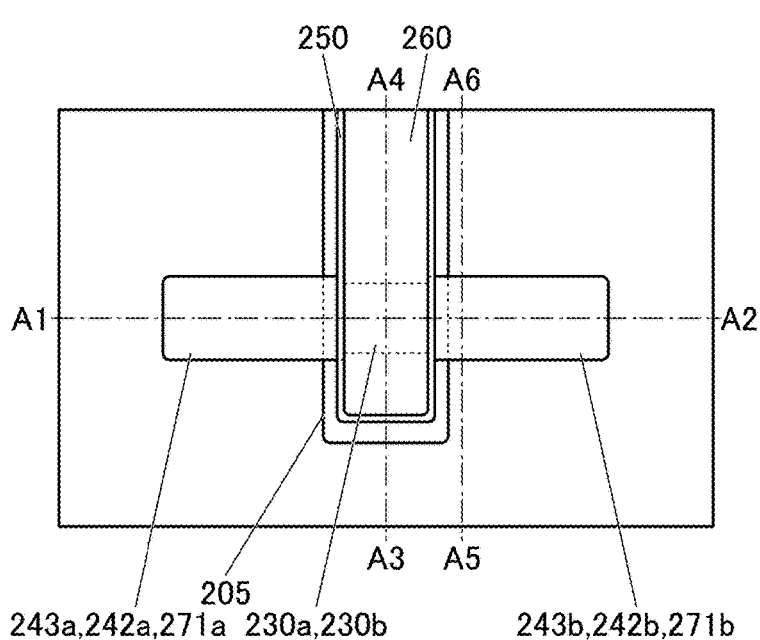
FIG. 15A is a top view illustrating the method for manufacturing a semiconductor device of one embodiment of the present invention.
Figure 15C:
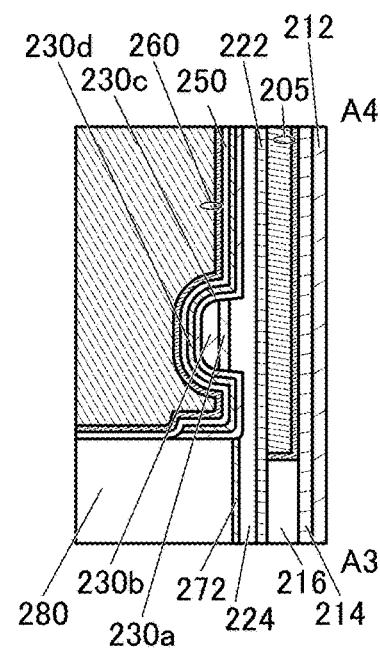
FIG. 15B to FIG. 15D are cross-sectional views illustrating the method for manufacturing a semiconductor device of one embodiment of the present invention.
Figure 15B:
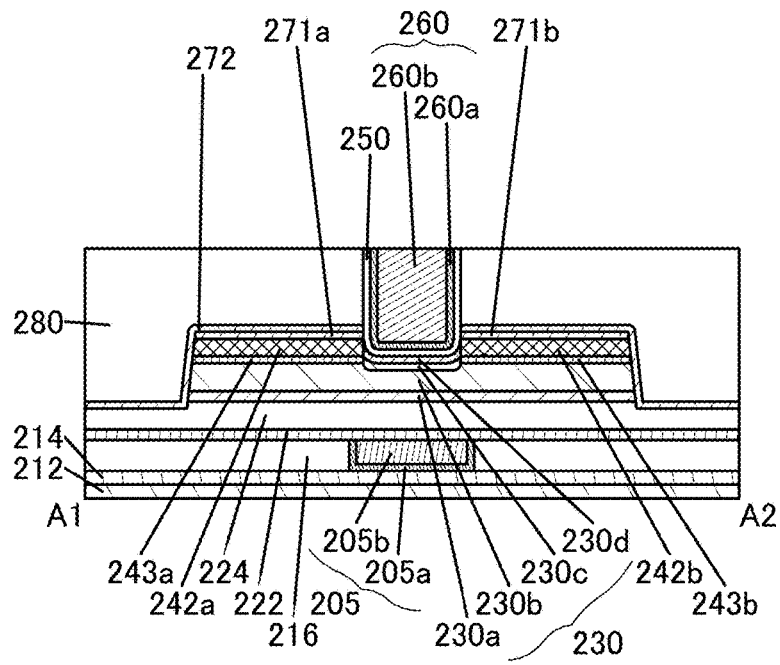
Figure 15D:
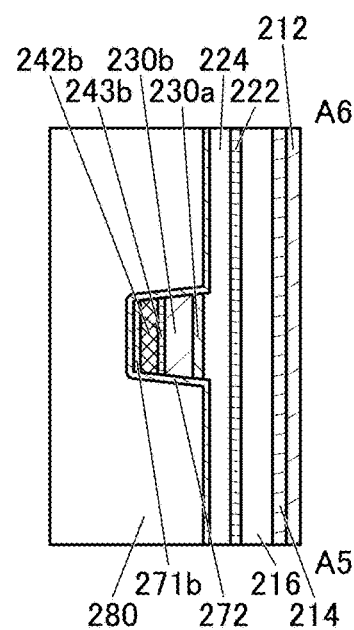
Figure 16A:
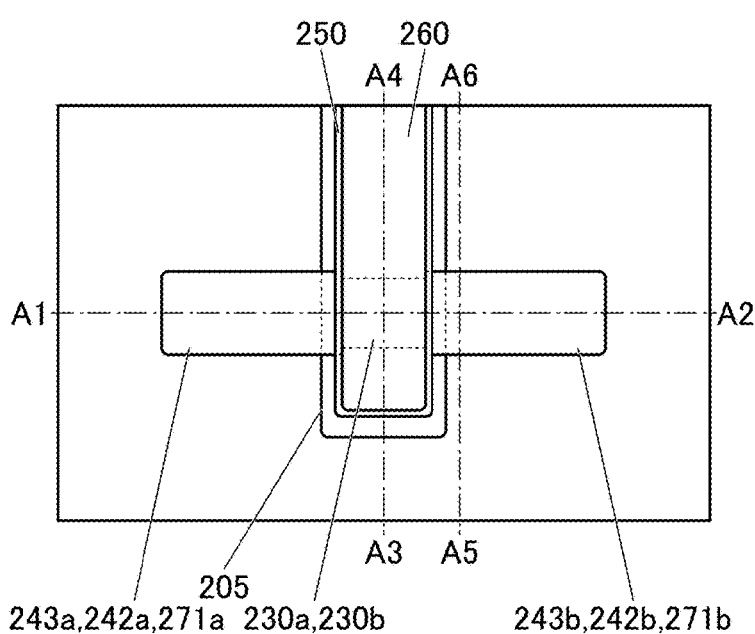
FIG. 16A is a top view illustrating the method for manufacturing a semiconductor device of one embodiment of the present invention.
Figure 16C:
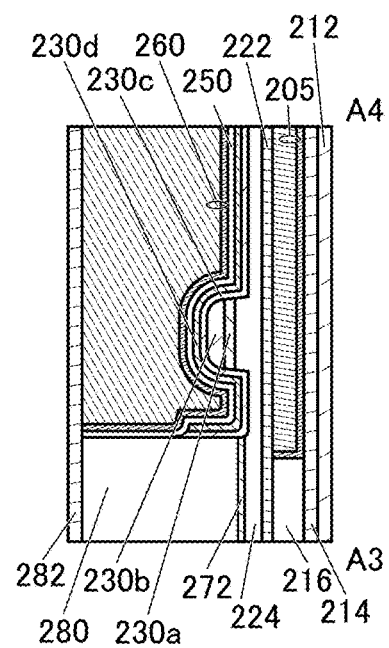
FIG. 16B to FIG. 16D are cross-sectional views illustrating the method for manufacturing a semiconductor device of one embodiment of the present invention.
Figure 16B:
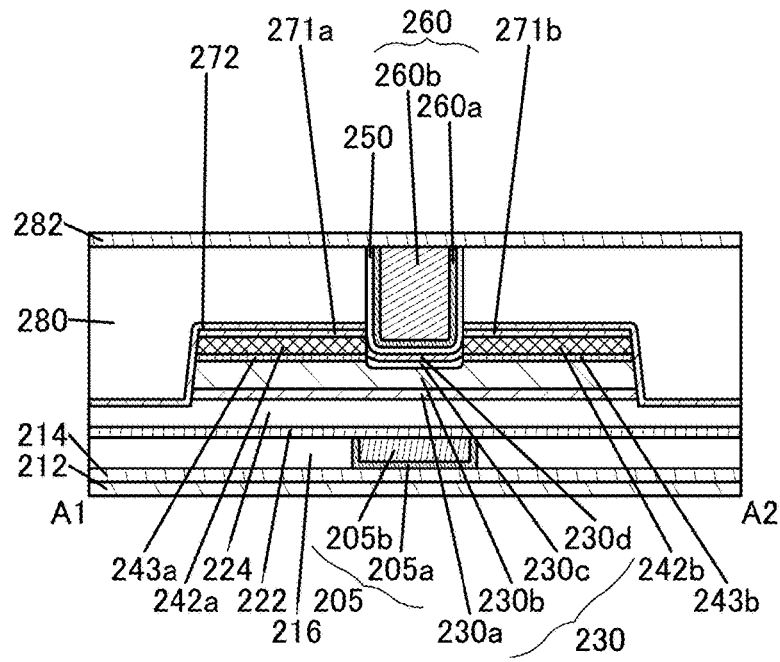
Figure 16D:
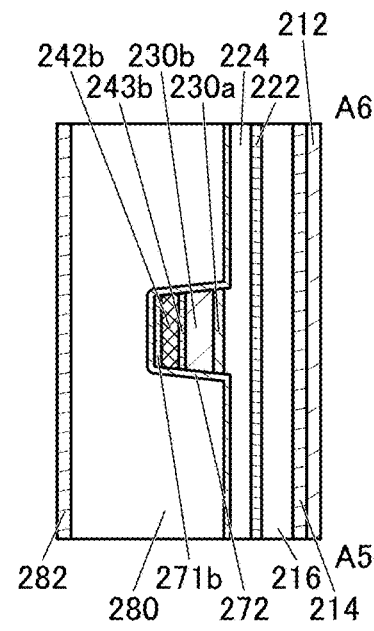
Figure 17A:
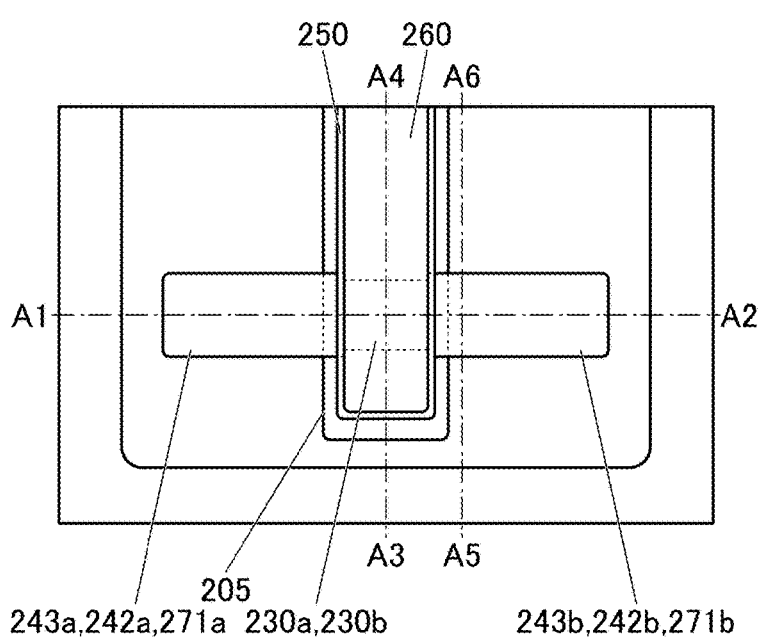
FIG. 17A is a top view illustrating the method for manufacturing a semiconductor device of one embodiment of the present invention.
Figure 17C:
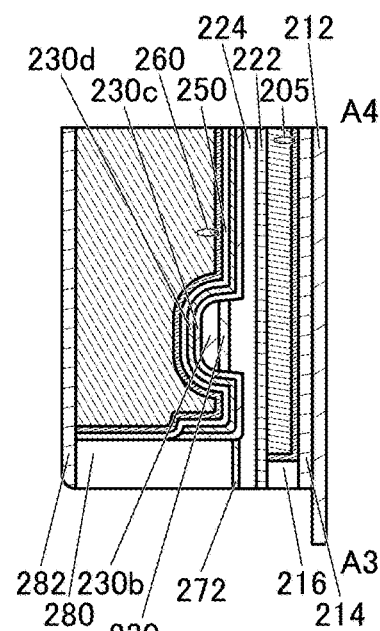
FIG. 17B to FIG. 17D are cross-sectional views illustrating the method for manufacturing a semiconductor device of one embodiment of the present invention.
Figure 17B:
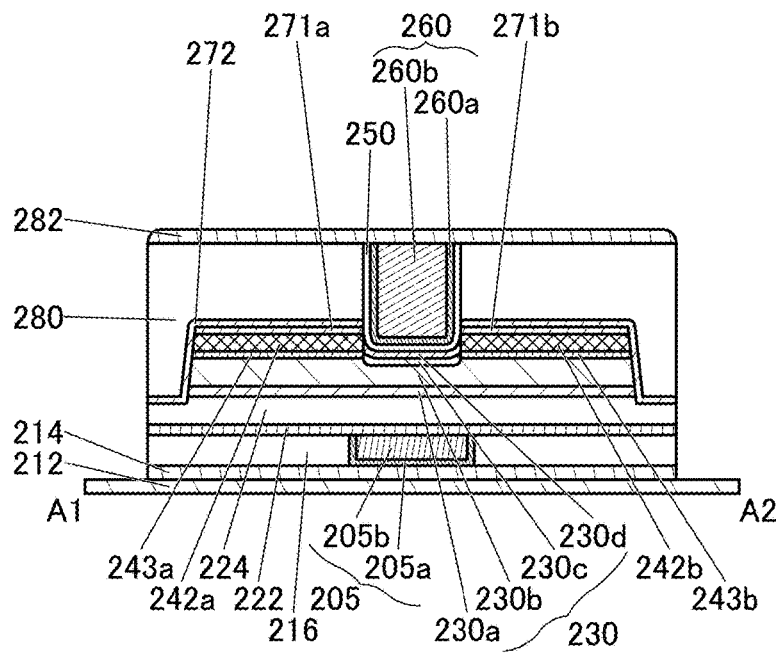
Figure 17D:
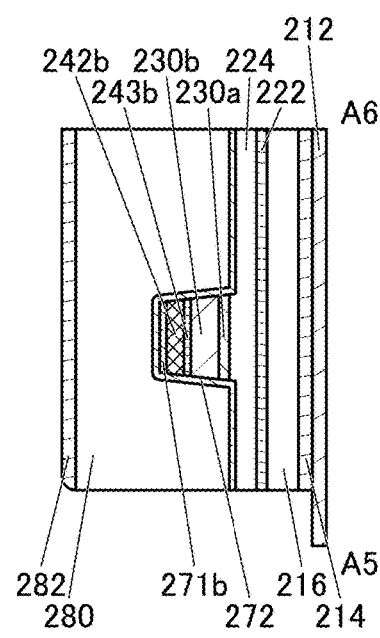

Here, the insulating layer 271B and the conductive layer 248 function as masks for the conductive layer 242B; thus, as shown in FIG. 6B to FIG. 6D, the conductive layer 242B does not have a curved surface between the side surface and the top surface. Thus, end portions at the intersections of the side surfaces and the top surfaces of the conductor 242a and the conductor 242b shown in FIG. 3B to FIG. 3D are angular. The cross-sectional area of the conductor 242 is larger in the case where the end portion at the intersection of the side surface and the top surface of the conductor 242 is angular than in the case where the end portion is rounded. Accordingly, the resistance of the conductor 242 is reduced, so that the on-state current of the transistor 200 can be increased.

Here, the oxide 230a, the oxide 230b, the oxide layer 243B, the conductive layer 242B, the insulating layer 271B, and the conductive layer 248 are formed to at least partly overlap with the conductor 205. It is preferable that the side surfaces of the oxide 230a, the oxide 230b, the oxide layer 243B, the conductive layer 242B, the insulating layer 271B, and the conductive layer 248 be substantially perpendicular to the top surface of the insulator 222. When the side surfaces of the oxide 230a, the oxide 230b, the oxide layer 243B, the conductive layer 242B, the insulating layer 271B, and the conductive layer 248 are substantially perpendicular to the top surface of the insulator 222, a plurality of transistors 200 can be provided in a smaller area and at a higher density. Alternatively, a structure may be employed in which an angle formed by the side surfaces of the oxide 230a, the oxide 230b, the oxide layer 243B, the conductive layer 242B, the insulating layer 271B, and the conductive layer 248 and the top surface of the insulator 222 is a small angle. In that case, the angle formed by the side surfaces of the oxide 230a, the oxide 230b, the oxide layer 243B, the conductive layer 242B, the insulating layer 271B, and the conductive layer 248 and the top surface of the insulator 222 is preferably greater than or equal to 60° and less than 70°. With such a shape, in later steps, the coverage with the insulator 272 and the like can be improved, so that defects such as a void can be reduced.

Then, the conductive layer 248 is removed. The conductive layer 248 is removed by a dry etching method (see FIG. 7A to FIG. 7D).

Next, the insulator 272 is formed over the insulator 224, the oxide 230a, the oxide 230b, the oxide layer 243B, the conductive layer 242B, and the insulating layer 271B (see FIG. 8A to FIG. 8D). The insulator 272 can be deposited by a sputtering method, a CVD method, an MBE method, a PLD method, an ALD method, or the like. In this embodiment, for the insulator 272, aluminum oxide is deposited by a sputtering method. In particular, the insulator 272 is preferably deposited by a bias sputtering method. In the bias sputtering method, the amount of oxygen implanted into the insulator 224 serving as a base of the insulator 272 can be controlled with the amount of RF power applied to the substrate. For example, as the RF power, a bias with a power density of 0.31 W/cm$^2$ or more, preferably 0.62 W/cm$^2$ or more, further preferably 1.86 W/cm$^2$ or more is applied to the substrate. In other words, an appropriate amount of oxygen for the transistor characteristics can be implanted by changing the amount of RF power used for the formation of the insulator 272. Moreover, an appropriate amount of oxygen for improving the reliability of the transistor can be implanted. The frequency of the RF is preferably 10 MHz or more; typically 13.56 MHz. The higher the RF frequency is, the less damage the substrate gets.

As described above, the insulator 272 has a function of implanting oxygen to the film serving as a base, but the insulator 272 itself has a function of inhibiting passage of oxygen. Accordingly, when the insulator 280 is formed over the insulator 272 and oxygen is diffused from the insulator 280 in a later step, the oxygen can be prevented from being directly diffused from the insulator 280 into the oxide 230a, the oxide 230b, the oxide layer 243B, and the conductive layer 242B.

Next, an insulating film to be the insulator 280 is deposited over the insulator 224 and the insulator 272. The insulating film can be deposited by a sputtering method, a CVD method, an MBE method, a PLD method, an ALD method, or the like. For example, as the insulating film, a silicon oxide film is deposited by a sputtering method, and a silicon oxide film is deposited thereover by a PEALD method or a thermal ALD method. The insulating film is preferably deposited by a deposition method using a gas in which hydrogen atoms are reduced or removed. Thus, the hydrogen concentration in the insulator 280 can be reduced. Note that heat treatment may be performed before the insulating film is deposited. The heat treatment may be performed under reduced pressure, and the insulating films may be successively deposited without exposure to the air. The treatment can remove moisture and hydrogen adsorbed onto the surfaces of the insulator 224, the insulator 272, and the like and further can reduce the moisture concentration and the hydrogen concentration in the oxide 230a, the oxide 230b, the oxide layer 243B, and the insulator 224. For the heat treatment, the above heat treatment conditions can be used.

Next, the insulating film is subjected to CMP treatment, so that the insulator 280 having a flat top surface is formed (see FIG. 9A to FIG. 9D). Note that in a manner similar to that of the insulator 224, aluminum oxide may be deposited over the insulator 280 by a sputtering method, for example, and the aluminum oxide may be subjected to CMP until the insulator 280 is reached.

Here, microwave treatment may be performed. The microwave treatment is preferably performed in an atmosphere containing oxygen under reduced pressure. By performing the microwave treatment, an electric field by a microwave can be supplied to the insulator 280, the oxide 230b, the oxide 230a, and the like to divide VoH in the oxide 230b and the oxide 230a into an oxygen vacancy ($V_O$) and hydrogen (H). Part of hydrogen divided at this time is bonded to oxygen contained in the insulator 280 and is removed as water molecules in some cases. Some hydrogen is gettered by the conductive layer 242B through the insulator 272 and the insulating layer 271B in some cases.

After the microwave treatment, heat treatment may be performed with the reduced pressure being maintained. Such treatment enables hydrogen in the insulator 280, the oxide 230b, and the oxide 230a to be removed efficiently. Note that the temperature of the heat treatment is preferably higher than or equal to 300° C. and lower than or equal to 500° C.

Performing the microwave treatment improves the film quality of the insulator 280, thereby inhibiting diffusion of hydrogen, water, impurities, and the like. Accordingly, hydrogen, water, impurities, and the like can be inhibited from diffusing into the oxide 230 through the insulator 280 in a later step after the formation of the insulator 280, heat treatment, or the like.

Then, part of the insulator 280, part of the insulator 272, part of the insulating layer 271B, part of the conductive layer 242B, part of the oxide layer 243B, and part of the oxide 230b are processed to form an opening reaching the oxide 230b. The opening is preferably formed to overlap with the conductor 205. The insulator 271a, the insulator 271b, the conductor 242a, the conductor 242b, the oxide 243a, and the oxide 243b are formed through the formation of the opening (see FIG. 10A to FIG. 10D).

An upper portion of the oxide 230b is removed when the opening is formed. When part of the oxide 230b is removed, a groove portion is formed in the oxide 230b. The groove portion may be formed in the same step as the formation of the opening or in a step different from the formation of the opening in accordance with the depth of the groove portion.

The part of the insulator 280, the part of the insulator 272, the part of the insulating layer 271B, the part of the conductive layer 242B, the part of the oxide layer 243B, and the part of the oxide 230b can be processed by a dry etching method or a wet etching method. Processing by a dry etching method is suitable for microfabrication. The processing may be performed under different conditions. For example, the part of the insulator 280 may be processed by a dry etching method, the part of the insulator 272 and the part of the insulating layer 271B may be processed by a wet etching method, and the part of the oxide layer 243B, the part of the conductive layer 242B, and the part of the oxide 230b may be processed by a dry etching method. Processing of the part of the oxide layer 243B and the part of the conductive layer 242B and processing of the part of the oxide 230b may be performed under different conditions.

When the oxide 230b is partly removed to form a groove by a dry etching method, a strong bias power is preferably applied. A bias power density is, for example, more than or equal to 0.02 W/cm$^2$, preferably more than or equal to 0.03 W/cm$^2$, further preferably more than or equal to 0.06 W/cm$^2$. The dry etching treatment time may be set as appropriate depending on the depth of the groove portion.

Here, it is preferable to remove impurities that are attached onto the surfaces of the oxide 230a, the oxide 230b, and the like or diffused into the oxide 230a, the oxide 230b, and the like. It is also preferable to remove a damaged region that is formed on the surface of the oxide 230b by the above dry etching. The impurities come from components contained in the insulator 280, part of the insulator 272, part of the insulating layer 271B, and the conductive layer 242B; components contained in a member of an apparatus used to form the opening; and components contained in a gas or a liquid used for etching, for instance. Examples of the impurities include aluminum, silicon, tantalum, fluorine, and chlorine.

In particular, impurities such as aluminum and silicon block the oxide 230b and the oxide 230c, which is formed in a later step, from becoming a CAAC-OS. It is thus preferable to reduce or remove impurity elements such as aluminum and silicon, which block the oxide from becoming a CAAC-OS. For example, the concentration of aluminum atoms at the interface between the oxide 230b and the oxide 230c and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that in a metal oxide, a region that is hindered from becoming a CAAC-OS by impurities such as aluminum and silicon and becomes an amorphous-like oxide semiconductor (a-like OS) is referred to as a non-CAAC region in some cases. In the non-CAAC region, the density of the crystal structure is reduced to increase VoH; thus, the transistor is likely to be normally on. Hence, the non-CAAC regions in the oxide 230b and the oxide 230c are preferably reduced or removed.

In contrast, the oxide 230b and the oxide 230c preferably have CAAC structures. In particular, the CAAC structure preferably reaches a lower edge portion of a drain in the oxide 230b and the oxide 230c. Here, in the transistor 200, the conductor 242a or the conductor 242b, and its vicinity function as a drain. In other words, one or both of the oxide 230b and the oxide 230c in the vicinity of the lower edge portion of the conductor 242a (conductor 242b) preferably have a CAAC structure. In this manner, the damaged region of the oxide 230b is removed and the CAAC structure is formed in the edge portion of the drain, which significantly affects the drain withstand voltage, so that variation of the electrical characteristics of the transistor 200 can be further suppressed. The reliability of the transistor 200 can be improved.

In order to remove the above impurities and the like, cleaning treatment is performed. Examples of the cleaning method include wet cleaning using a cleaning solution, plasma treatment using plasma, and cleaning by heat treatment, and any of these cleanings may be performed in appropriate combination. The cleaning treatment sometimes makes the groove portion deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which pure water is added to hydrofluoric acid for dilution is referred to as diluted hydrofluoric acid, and an aqueous solution in which pure water is added to ammonia water for dilution is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted hydrofluoric acid is performed, and then, wet cleaning using pure water or carbonated water is performed. The cleaning treatment can remove impurities that are attached onto the surfaces of the oxide 230a, the oxide 230b, and the like or diffused into the oxide 230a, the oxide 230b, and the like. The crystallinity of the oxide 230c formed over the oxide 230b can be increased.

By the processing such as dry etching or the cleaning treatment, the thickness of the insulator 224 in a region that overlaps with the opening and does not overlap with the oxide 230b and the insulator 272 might become smaller than the thickness of the insulator 224 in a region that overlaps with the oxide 230b.

After the etching or the cleaning treatment, heat treatment may be performed. The heat treatment is performed at a temperature higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce the amount of oxygen vacancies $V_O$. This heat treatment can improve the crystallinity of the oxide 230b and the crystallinity of the oxide 230c which is formed in the groove portion of the oxide 230b. The heat treatment may be performed under reduced pressure. Alternatively, the heat treatment may be performed in an oxygen atmosphere, and then another heat treatment may be successively performed in a nitrogen atmosphere without exposure to the air.

Next, an oxide film 230C is deposited (see FIG. 11A to FIG. 11D). Heat treatment may be performed before the oxide film 230C is deposited. It is preferable that the heat treatment be performed under reduced pressure and the oxide film 230C be successively deposited without exposure to the air. The heat treatment is preferably performed in an atmosphere containing oxygen. Such treatment can remove moisture and hydrogen adsorbed onto the surface of the oxide 230b or the like and can reduce the moisture concentration and the hydrogen concentration in the oxide 230a and the oxide 230b. The heat treatment is preferably performed at a temperature higher than or equal to 100° C. and lower than or equal to 400° C. In this embodiment, the heat treatment is performed at 200° C.

The oxide film 230C can be deposited by a sputtering method, a CVD method, an MBE method, a PLD method, an ALD method, or the like. The oxide film 230C may be formed by a deposition method similar to that for the oxide film 230A or the oxide film 230B depending on characteristics required for the oxide film 230C. In this embodiment, the oxide film 230C is deposited by a sputtering method using an oxide target with In:Ga:Zn=4:2:3 [atomic ratio], an oxide target with In:Ga:Zn=5:1:3 [atomic ratio], an oxide target with In:Ga:Zn=10:1:3 [atomic ratio], or an indium oxide target.

Part of oxygen contained in the sputtering gas is sometimes supplied to the oxide 230a and the oxide 230b during the deposition of the oxide film 230C. Alternatively, during the deposition of the oxide film 230C, part of oxygen contained in the sputtering gas is supplied to the insulator 280 in some cases. Therefore, the proportion of oxygen in the sputtering gas for the oxide film 230C is preferably 70% or higher, further preferably 80% or higher, still further preferably 100%. By depositing the oxide film 230C in an atmosphere containing much oxygen, the oxide film 230C is likely to be CAAC-OS.

The oxide film 230C is preferably deposited while the substrate is being heated. In that case, the substrate temperature is set to higher than or equal to 200° C., so that oxygen vacancies in the oxide film 230C and the oxide 230b can be reduced. The deposition is performed while the substrate is heated, whereby the crystallinity of the oxide film 230C and the oxide 230b can be improved.

Next, an oxide film 230D is deposited (see FIG. 11A to FIG. 11D). The oxide film 230D is preferably successively deposited after the deposition of the oxide film 230C without being exposed to the air.

The oxide film 230D can be deposited by a sputtering method, a CVD method, an MBE method, a PLD method, an ALD method, or the like. The oxide film 230D is deposited by a deposition method similar to that for the oxide film 230A or the oxide film 230B depending on with characteristics required for the oxide film 230D. In this embodiment, the oxide film 230D is deposited by a sputtering method using an oxide target with In:Ga:Zn=1:3:4 [atomic ratio].

Part of oxygen contained in the sputtering gas is sometimes supplied to the oxide film 230C during the deposition of the oxide film 230D. Alternatively, during the deposition of the oxide film 230D, part of oxygen contained in the sputtering gas is supplied to the insulator 280 in some cases. Therefore, the proportion of oxygen contained in the sputtering gas for the oxide film 230D is higher than or equal to 70%, preferably higher than or equal to 80%, further preferably 100%.

Next, the oxide film 230C and the oxide film 230D on the side surface of the insulator 280, the side surface of the insulator 272, and the side surface of the insulator 271 in the opening are removed by a dry etching method. At the same time, the oxide film 230C and the oxide film 230D over the insulator 280 are also removed. The oxide film 230C and the oxide film 230D are left on the bottom portion of the opening, whereby the oxide 230c and the oxide 230d are formed (see FIG. 12A to FIG. 12D).

The above processing is possible when dry etching conditions are appropriately set. For example, a pressure at the dry etching is set high. Specifically, the pressure at the dry etching is preferably higher than or equal to 66.5 Pa, further preferably higher than or equal to 133 Pa. With such a pressure, reactive ions, which are etching species, move in random directions due to a short mean free path of the reactive ions in plasma, and thus the reactive ions are less likely to reach the bottom portion of the opening in some cases. Accordingly, the oxide film 230C and the oxide film 230D on the bottom portion of the opening can be inhibited from being removed to be left.

Here, a method for forming the oxide 230c and the oxide 230d, which is different from the above method, is described below. The oxide film 230C and the oxide film 230D are each deposited by an ionization sputtering method. An ionization sputtering method is a deposition method in which sputtering particles are ionized by applying a high-frequency power or the like to the sputtering particles. With the use of the ionization sputtering method, the films are deposited mainly on the bottom portion of the opening and over the insulator 280, whereby the thicknesses of the films on the bottom portion of the opening can be made larger than the thicknesses of the films on the side surface of the opening.

Next, the oxide film 230C and the oxide film 230D on the bottom portion of the opening are left with the use of the above-described dry etching method, so that the oxide 230c and the oxide 230d are formed. A semiconductor device including the transistor 200 manufactured in this manner is illustrated in FIG. 4A to FIG. 4D.

Next, an insulating film 250A is deposited (see FIG. 13A to FIG. 13D). Heat treatment may be performed before the deposition of the insulating film 250A. It is preferable that the heat treatment be performed under reduced pressure and the insulating film 250A be successively deposited without exposure to the air. The heat treatment is preferably performed in an atmosphere containing oxygen. Such treatment can remove moisture and hydrogen adsorbed onto the surface of the oxide 230d or the like and can reduce the moisture concentration and the hydrogen concentration in the oxide 230a, the oxide 230b, the oxide 230c, and the oxide 230d. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. The insulating film 250A is preferably deposited by a deposition method using a gas in which hydrogen atoms are reduced or removed. This can reduce the hydrogen concentration in the insulating film 250A. The hydrogen concentration in the insulating film 250A is preferably reduced because the insulating film 250A becomes the insulator 250 that is in contact with the oxide 230d in a later step.

In the case where the insulator 250 has a stacked-layer structure including two layers, it is preferable that a lower layer of the insulator 250 be formed using an insulator from which oxygen is released by heating and an upper layer of the insulator 250 be formed using an insulator having a function of inhibiting diffusion of oxygen. With such a structure, oxygen contained in the lower layer of the insulator 250 can be inhibited from being diffused into the conductor 260 to be formed in a later step. That is, reduction in the amount of oxygen supplied to the oxide 230 can be inhibited. In addition, oxidation of the conductor 260 due to oxygen contained in the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative permittivity. The gate insulator having a stacked-layer structure of the lower layer of the insulator 250 and the upper layer of the insulator 250 can be thermally stable and can have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Alternatively, an insulator having a function of inhibiting oxygen diffusion may be formed as the insulator serving as the lower layer of the insulator 250 and an insulator from which oxygen is released by heating may be formed as the upper layer of the insulator 250. With such a structure, oxygen contained in the insulator 280 can be inhibited from being diffused into the conductor 260 to be formed in a later step. Moreover, an insulator having a function of inhibiting passage of impurities such as water and hydrogen is preferably formed for the lower layer of the insulator 250. With such a structure, diffusion of impurities such as water and hydrogen contained in the insulator 280 into the oxide 230 can be inhibited.

An insulator containing an oxide of one or both of aluminum and hafnium is preferably deposited as the insulator having a barrier property against oxygen, hydrogen, and water. Note that as the insulator containing an oxide of one or both of aluminum and hafnium, aluminum oxide, hafnium oxide, an oxide containing aluminum and hafnium (hafnium aluminate), or the like is preferably used. The above insulator is preferably deposited by a thermal ALD method using an inorganic precursor. An insulator with reduced hydrogen can be deposited by this method.

Here, after the insulating film 250A is deposited, microwave treatment may be performed in an atmosphere containing oxygen under reduced pressure. By performing the microwave treatment, an electric field from microwaves is supplied to the insulating film 250A, the oxide film 230D, the oxide film 230C, the oxide 230b, and the oxide 230a, so that VoH in the oxide film 230D, the oxide film 230C, the oxide 230b, and the oxide 230a can be divided into $V_O$ and hydrogen. Part of hydrogen divided at this time is bonded to oxygen and is removed as $H_2O$ from the insulating film 250A, the oxide film 230D, the oxide film 230C, the oxide 230b, and the oxide 230a in some cases. Part of hydrogen is gettered by the conductor 242 (the conductor 242a and the conductor 242b) in some cases. Performing the microwave treatment in such a manner can reduce the hydrogen concentration in the insulating film 250A, the oxide film 230D, the oxide film 230C, the oxide 230b, and the oxide 230a. Furthermore, oxygen is supplied to $V_O$ that can exist after VoH in the oxide 230a, the oxide 230b, the oxide film 230C, and the oxide film 230D is divided into $V_O$ and hydrogen, so that $V_O$ can be repaired or filled.

After the microwave treatment, heat treatment may be performed with the reduced pressure being maintained. Such treatment can remove hydrogen in the insulating film 250A, the oxide film 230D, the oxide film 230C, the oxide 230b, and the oxide 230a efficiently. Part of hydrogen is gettered by the conductor 242 (the conductor 242a and the conductor 242b) in some cases. Alternatively, it is possible to repeat the step of performing microwave treatment and the step of performing heat treatment with the reduced pressure being maintained after the microwave treatment. Repetitions of the heat treatment can remove hydrogen in the insulating film 250A, the oxide film 230D, the oxide film 230C, the oxide 230b, and the oxide 230a more efficiently. Note that the temperature of the heat treatment is preferably higher than or equal to 300° C. and lower than or equal to 500° C.

Furthermore, the microwave treatment improves the film quality of the insulating film 250A, thereby inhibiting diffusion of hydrogen, water, impurities, and the like. Accordingly, hydrogen, water, impurities, and the like can be inhibited from being diffused into the oxide 230b, the oxide 230a, and the like through the insulator 250 in a later step such as deposition of a conductive film to be the conductor 260 or a later treatment such as heat treatment.

Next, a conductive film 260A and a conductive film 260B are deposited in this order (see FIG. 14A to FIG. 14D). The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is successively deposited by a CVD method without exposure to the air.

Then, the oxide film 230C, the oxide film 230D, the insulating film 250A, the conductive film 260A, and the conductive film 260B are polished by CMP treatment until the insulator 280 is exposed, whereby the oxide 230c, the oxide 230d, the insulator 250, and the conductor 260 (the conductor 260a and the conductor 260b) are formed (see FIG. 15A to FIG. 15D). Accordingly, the oxide 230c is positioned to cover the inner walls (the side wall and the bottom surface) of the opening reaching the oxide 230b and the groove portion of the oxide 230b. The oxide 230d is positioned to cover the inner walls of the opening and the groove portion with the oxide 230c therebetween. The insulator 250 is positioned to cover the inner walls of the opening and the groove portion with the oxide 230d therebetween. The conductor 260 is positioned to fill the opening and the groove portion with the oxide 230c, the oxide 230d, and the insulator 250 therebetween.

Then, heat treatment may be performed under conditions similar to those of the above heat treatment. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively deposited without exposure to the air.

Next, the insulator 282 is formed over the oxide 230d, the oxide 230c, the insulator 250, the conductor 260, and the insulator 280 (see FIG. 16A to FIG. 16D). The insulator 282 can be deposited by a sputtering method, a CVD method, an MBE method, a PLD method, an ALD method, or the like. Aluminum oxide is preferably deposited for the insulator 282 by a sputtering method, for example. The insulator 282 is deposited by a sputtering method in an oxygen-containing atmosphere, whereby oxygen can be added to the insulator 280 during the deposition. Thus, excess oxygen can be contained in the insulator 280. At this time, the insulator 282 is preferably deposited while the substrate is being heated. It is preferable to form the insulator 282 in contact with the top surface of the conductor 260 because oxygen contained in the insulator 280 can be inhibited from being absorbed by the conductor 260 in later heat treatment.

Next, part of the insulator 282, part of the insulator 280, part of the insulator 272, part of the insulator 224, part of the insulator 222, part of the insulator 216, and part of the insulator 214 are processed to form an opening reaching the insulator 212 (see FIG. 17A to FIG. 17D). The opening is formed to surround the transistor 200 in some cases. In other cases, the opening is formed to surround the plurality of the transistors 200. Accordingly, part of the side surface of the insulator 282, part of the side surface of the insulator 280, part of the side surface of the insulator 272, part of the side surface of the insulator 224, part of the side surface of the insulator 222, part of the side surface of the insulator 216, and part of the side surface of the insulator 214 are exposed in the opening.

The part of the insulator 282, the part of the insulator 280, the part of the insulator 272, the part of the insulator 224, the part of the insulator 222, the part of the insulator 216, and the part of the insulator 214 can be processed by a dry etching method or a wet etching method. Processing by a dry etching method is suitable for microfabrication. The processing may be performed under different conditions.

Figure 18A:
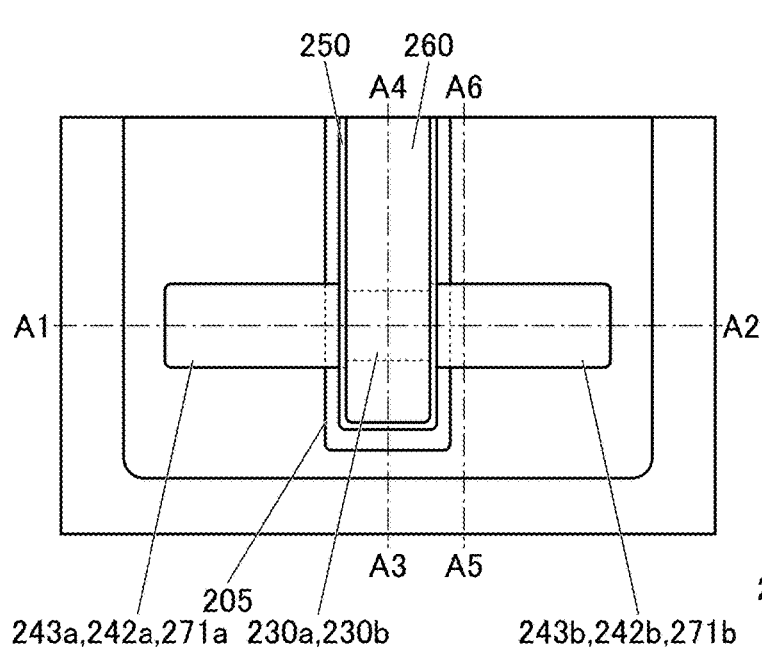
FIG. 18A is a top view illustrating the method for manufacturing a semiconductor device of one embodiment of the present invention.
Figure 18C:
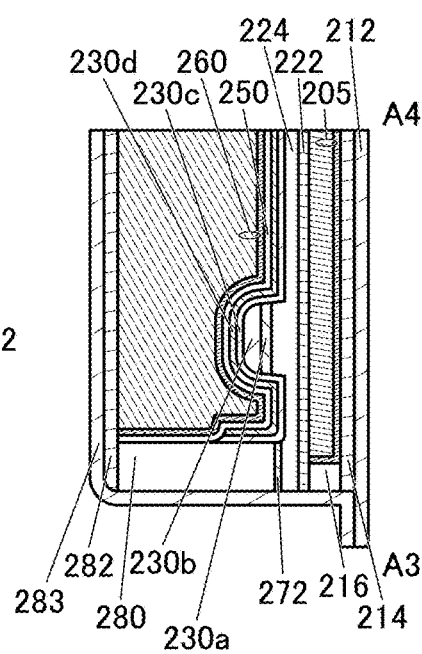
FIG. 18B to FIG. 18D are cross-sectional views illustrating the method for manufacturing a semiconductor device of one embodiment of the present invention.
Figure 18B:
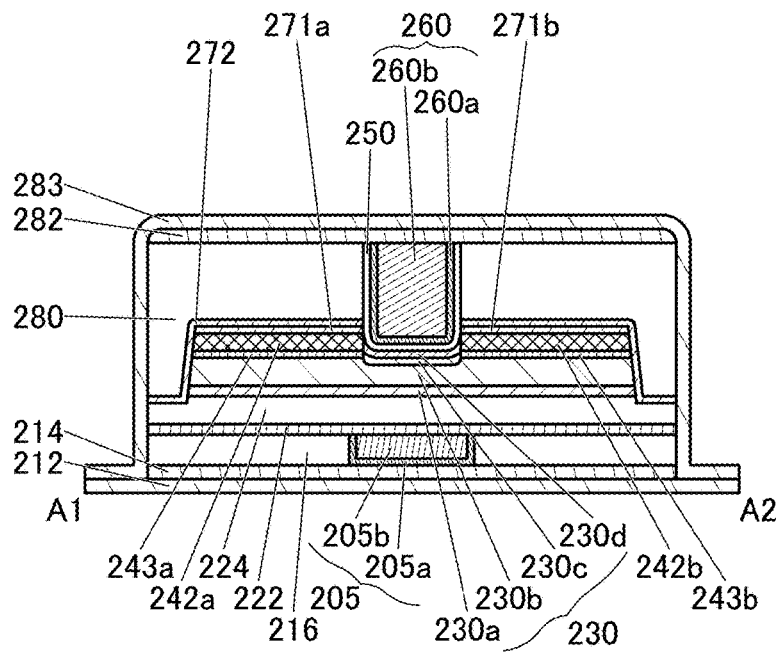
Figure 18D:
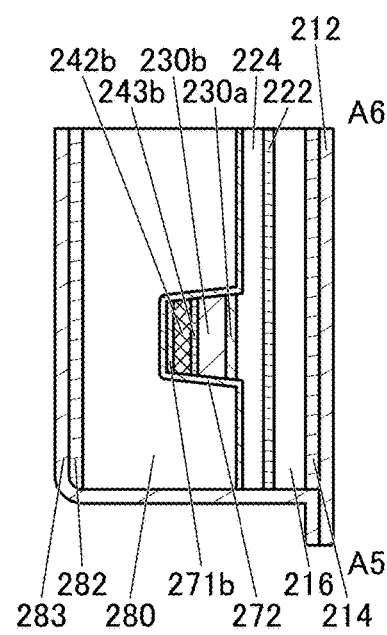
Figure 19A:
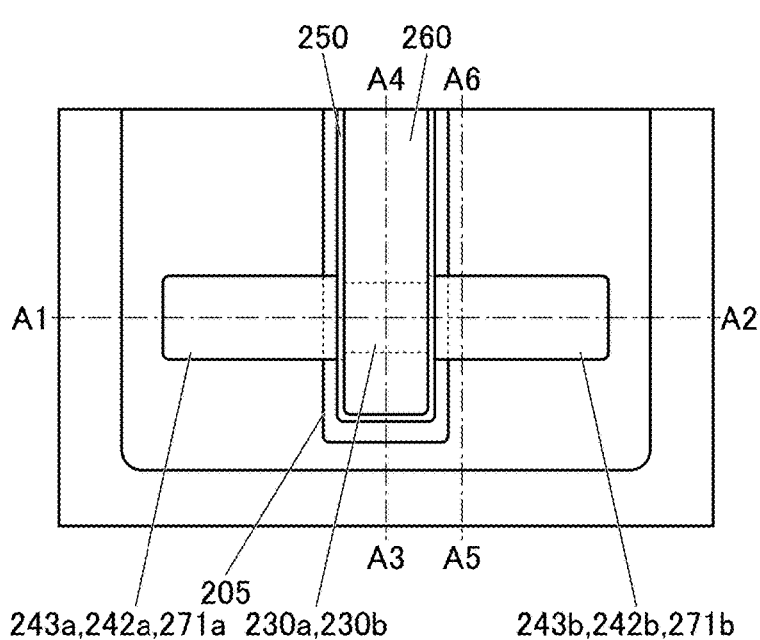
FIG. 19A is a top view illustrating the method for manufacturing a semiconductor device of one embodiment of the present invention.
Figure 19C:
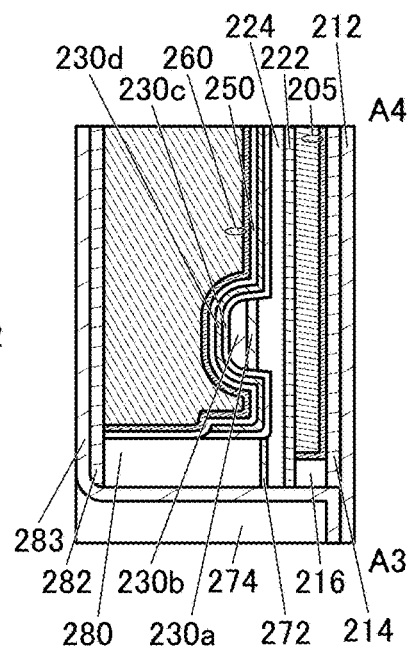
FIG. 19B to FIG. 19D are cross-sectional views illustrating the method for manufacturing a semiconductor device of one embodiment of the present invention.
Figure 19B:
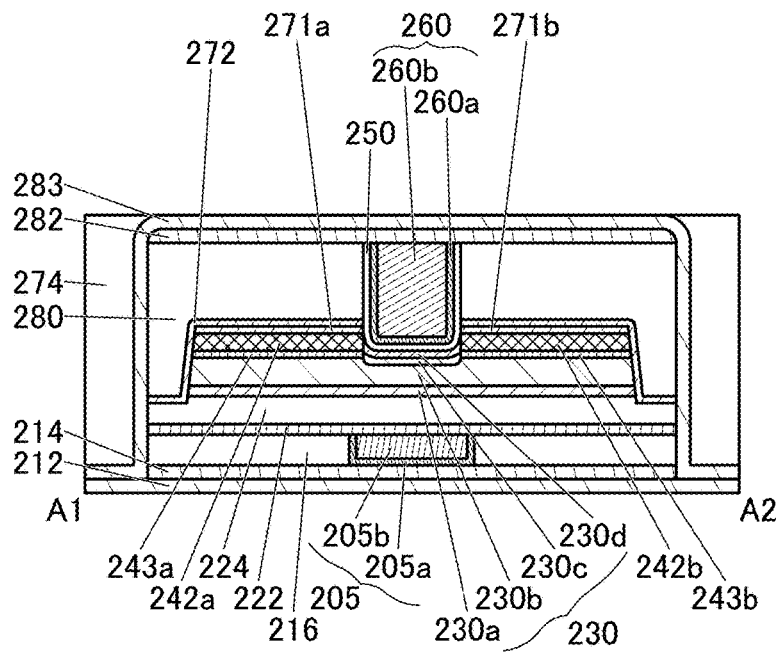
Figure 19D:
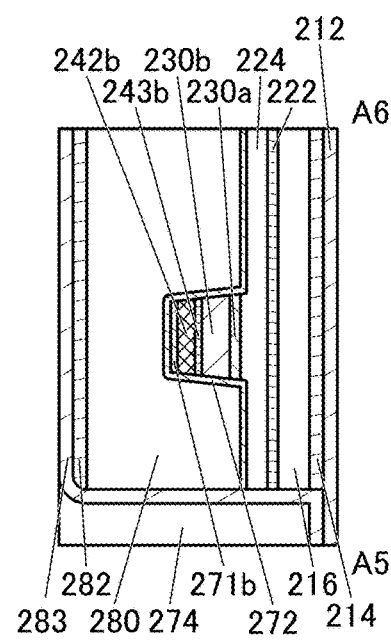
Figure 20A:
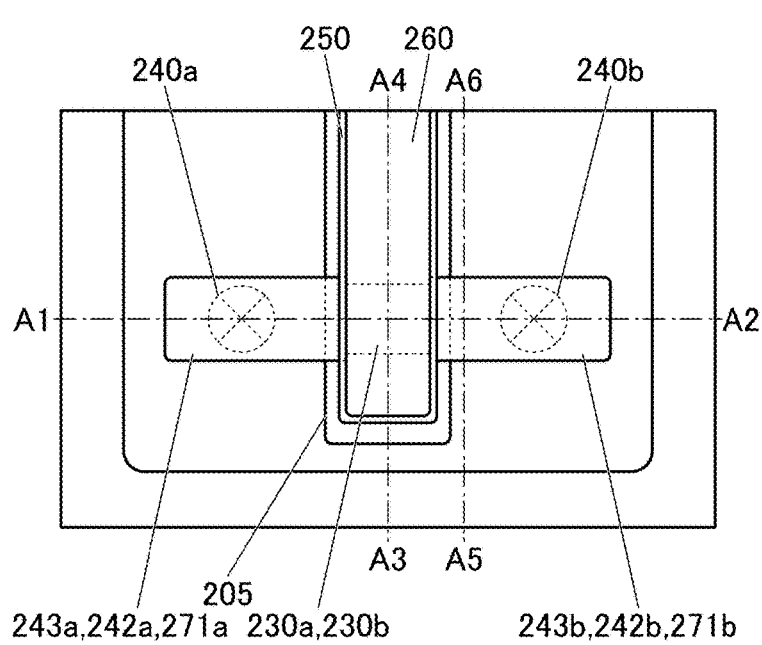
FIG. 20A is a top view illustrating the method for manufacturing a semiconductor device of one embodiment of the present invention.
Figure 20C:
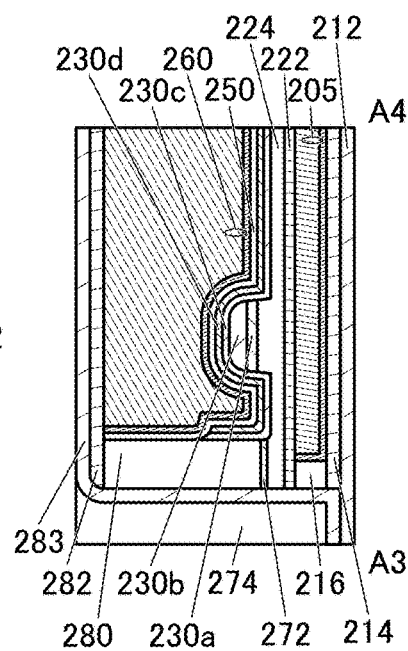
FIG. 20B to FIG. 20D are cross-sectional views illustrating the method for manufacturing a semiconductor device of one embodiment of the present invention.
Figure 20B:
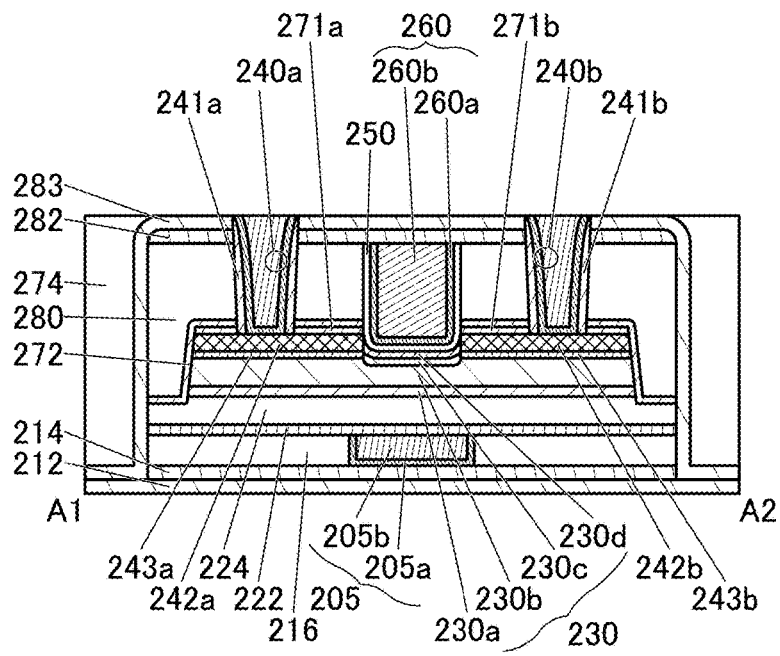
Figure 20D:
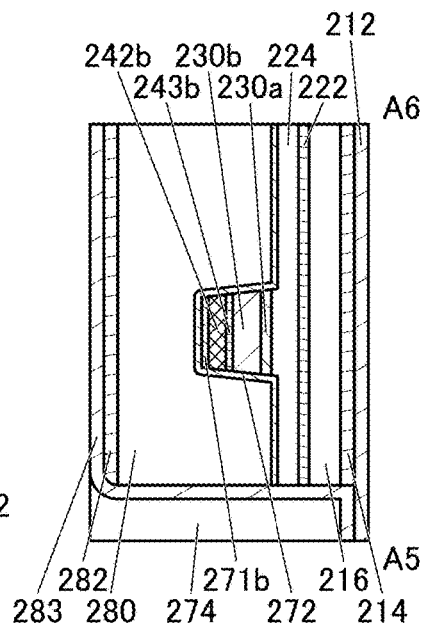
Figure 21A:
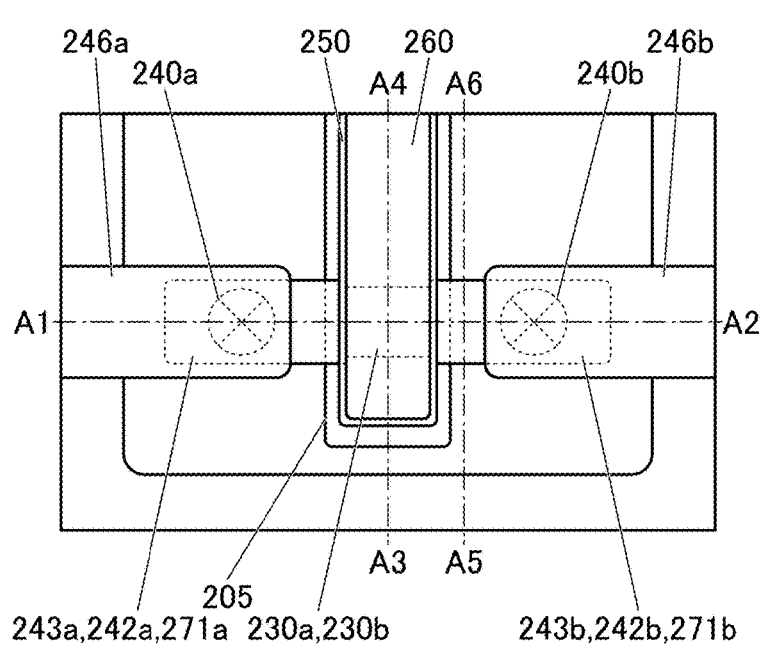
FIG. 21A is a top view illustrating the method for manufacturing a semiconductor device of one embodiment of the present invention.
Figure 21B:
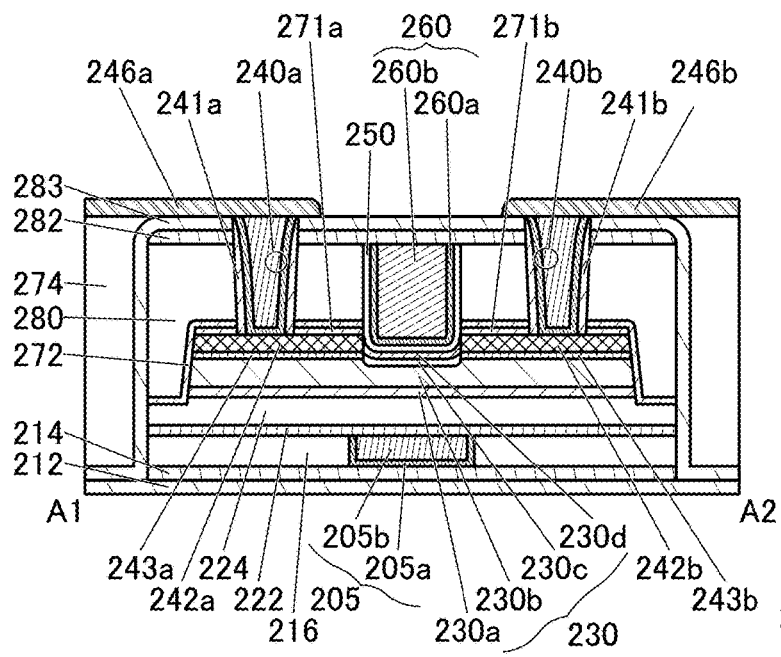
FIG. 21B to FIG. 21D are cross-sectional views illustrating the method for manufacturing a semiconductor device of one embodiment of the present invention.
Figure 21C:
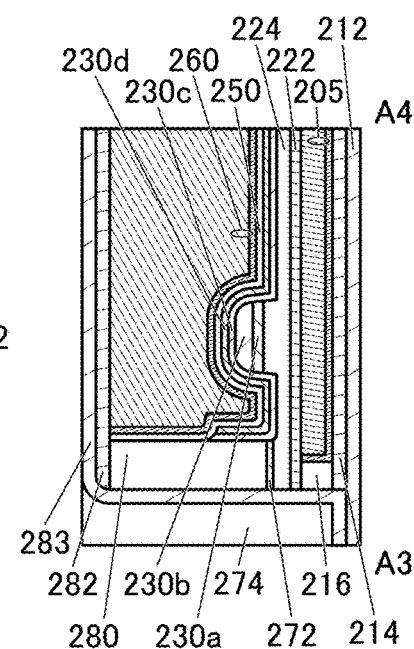
Figure 21D:
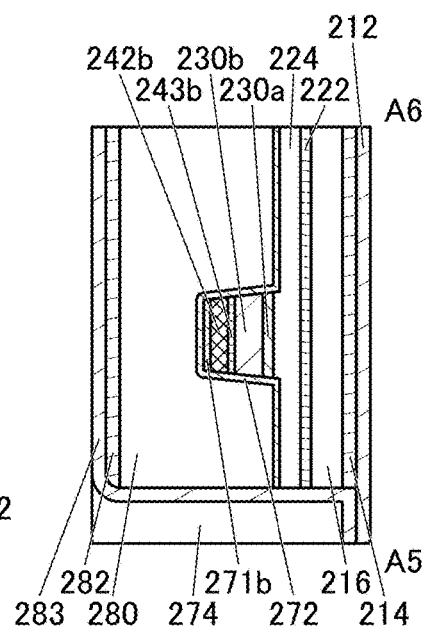

Then, the insulator 283 is formed to cover the insulator 282, the insulator 280, the insulator 224, the insulator 222, the insulator 216, and the insulator 214 (see FIG. 18A to FIG. 18D). The insulator 283 can be deposited by a sputtering method, a CVD method, an MBE method, a PLD method, an ALD method, or the like. In this embodiment, silicon nitride is deposited by a sputtering method. As shown in FIG. 18B to FIG. 18D, the insulator 283 is in contact with the insulator 212 at the bottom surface of the opening. That is, the top surface and the side surface of the transistor 200 are surrounded by the insulator 283 and the bottom surface of the transistor 200 is surrounded by the insulator 212. Surrounding the transistor 200 by the insulator 283 and the insulator 212 having high barrier properties can prevent entry of moisture and hydrogen from the outside.

Then, an insulating film to be the insulator 274 is deposited over the insulator 283. The insulating film to be the insulator 274 can be deposited by a sputtering method, a CVD method, an MBE method, a PLD method, an ALD method, or the like. For example, silicon nitride is preferably deposited by a CVD method. The insulating film to be the insulator 274 is preferably deposited by a deposition method using the gas in which hydrogen atoms are reduced or removed. Thus, the hydrogen concentration in the insulating film to be the insulator 274 can be reduced.

Next, the insulating film to be the insulator 274 is subjected to CMP treatment, whereby the insulator 274 having a flat top surface is formed (see FIG. 19A to FIG. 19D).

Subsequently, openings reaching the conductor 242 are formed in the insulator 271, the insulator 272, the insulator 280, the insulator 282, and the insulator 283 (see FIG. 20A to FIG. 20D). The openings are formed by a lithography method. Note that the openings in the top view in FIG. 20A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Subsequently, an insulating film to be the insulator 241 is deposited and the insulating film is subjected to anisotropic etching, so that the insulator 241 is formed (see FIG. 20A to FIG. 20D). The insulating film to be the insulator 241 can be deposited by a sputtering method, a CVD method, an MBE method, a PLD method, an ALD method, or the like. The insulating film to be the insulator 241 preferably has a function of inhibiting passage of oxygen. For example, aluminum oxide is preferably deposited by an ALD method. Alternatively, silicon nitride is preferably deposited by a PEALD method. Silicon nitride is preferable because it has a high blocking property against hydrogen.

As an anisotropic etching for the insulating film to be the insulator 241, a dry etching method may be performed, for example. When the insulator 241 is provided on the side surfaces of the openings, passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240 is deposited. The conductive film to be the conductor 240 desirably has a stacked-layer structure which includes a conductor having a function of inhibiting passage of impurities such as water and hydrogen. In the case where the conductive film to be the conductor 240 has a stacked-layer structure, tantalum nitride, titanium nitride, or the like can be used for a film in the lower layer. Moreover, tungsten, molybdenum, copper, or the like can be used for a film in the upper layer, for example. The conductive film to be the conductor 240 can be deposited by a sputtering method, a CVD method, an MBE method, a PLD method, an ALD method, or the like.

It is particularly preferable to deposit the lower layer of the conductive film to be the conductor 240 by an ionization sputtering method. Deposition by an ion sputtering method enables uniform deposition of a film on the bottom portion and the side surface of an opening.

Uniform deposition of the lower layer of the conductive film to be the conductor 240 is preferable because the lower layer of the conductive film to be the conductor 240 favorably functions as a seed layer of the upper layer of the conductive film to be the conductor 240.

Then, part of the conductive film to be the conductor 240a and the conductor 240b is removed by CMP treatment to expose the top surfaces of the insulator 283 and the insulator 274. As a result, the conductive film remains only in the openings, so that the conductor 240a and the conductor 240b having flat top surfaces can be formed (see FIG. 20A to FIG. 20D). Note that the top surface of the insulator 283 and the top surface of the insulator 274 are partly removed by the CMP treatment in some cases.

Next, a conductive film to be the conductor 246 is deposited. The conductive film to be the conductor 246 can be deposited by a sputtering method, a CVD method, an MBE method, a PLD method, an ALD method, or the like.

Then, the conductive film to be the conductor 246 is processed by a lithography method, thereby forming the conductor 246a in contact with the top surface of the conductor 240a and the conductor 246b in contact with the top surface of the conductor 240b (see FIG. 21A to FIG. 21D). At this time, part of the insulator 283 in a region where the conductor 246a and the conductor 246b do not overlap with the insulator 283 is sometimes removed, which is not shown.

Next, the insulator 286 is deposited over the conductor 246 and the insulator 283 (see FIG. 3A to FIG. 3D). The insulator 286 can be deposited by a sputtering method, a CVD method, an MBE method, a PLD method, an ALD method, or the like. In addition, the insulator 286 may have a multilayer structure. For example, silicon nitride may be deposited by a sputtering method and silicon nitride may be deposited by a CVD method over the silicon nitride.

Through the above process, the semiconductor device including the transistor 200 shown in FIG. 3A to FIG. 3D can be manufactured. As shown in FIG. 5A to FIG. 21D, the transistor 200 can be manufactured with the use of the method for manufacturing the semiconductor device described in this embodiment. When the semiconductor device including the transistor 200 shown in FIG. 1A to FIG. 1D is manufactured, the semiconductor device can be manufactured without the processes shown in FIG. 17A to FIG. 19D.

Application Example of Semiconductor Device

Examples of a semiconductor device including the transistor 200 of one embodiment of the present invention which is different from the semiconductor device described in the above <Structure example of semiconductor device> and the above <Modification example of semiconductor device> will be described below with reference to FIG. 22A and FIG. 22B. Note that in the semiconductor devices illustrated in FIG. 22A and FIG. 22B, structures having the same functions as the structures in the semiconductor device described in <Modification example of semiconductor device> (see FIG. 3A to FIG. 3D) are denoted by the same reference numerals. Note that also in this section, the materials described in detail in <Structure example of semiconductor device> and <Modification example of semiconductor device> can be used as the materials for the transistor 200.

FIG. 22A and FIG. 22B each show a structure in which a plurality of transistors 200_1 to 200_n are sealed with the insulator 283 and the insulator 212. Note that although the transistor 200_1 to the transistor 200_n appear to be arranged in the channel length direction in FIG. 22A and FIG. 22B, the present invention is not limited thereto. The transistor 200_1 to the transistor 200_n may be arranged in the channel width direction or may be arranged in a matrix. Depending on the design, the transistors may be arranged without regularity.

As shown in FIG. 22A, a portion where the insulator 283 is in contact with the insulator 212 (hereinafter, sometimes referred to as a sealing portion 265) is formed outside the plurality of transistors 200_1 to 200_n. The sealing portion 265 is formed to surround the plurality of transistors 200_1 to 200_n. Such a structure enables the plurality of transistors 200_1 to 200_n to be surrounded by the insulator 283 and the insulator 212. Thus, a plurality of transistor groups surrounded by the sealing portion 265 are provided over a substrate.

A dicing line (sometimes referred to as a scribe line, a dividing line, or a cutting line) may be provided to overlap with the sealing portion 265. The above substrate is divided at the dicing line, so that the transistor group surrounded by the sealing portion 265 is taken out as one chip.

Although the plurality of transistors 200_1 to 200_n are surrounded by one sealing portion 265 in the example shown in FIG. 22A, the present invention is not limited thereto. As shown in FIG. 22B, the plurality of transistors 200_1 to 200_n may be surrounded by a plurality of sealing portions. In FIG. 22B, the plurality of transistors 200_1 to 200_n are surrounded by a sealing portion 265a and are further surrounded by an outer sealing portion 265b.

When the plurality of transistors 200_1 to 200_n are surrounded by the plurality of sealing portions in this manner, a portion where the insulator 283 is in contact with the insulator 212 increases, which further can improve adhesion between the insulator 283 and the insulator 212. As a result, the plurality of transistors 200_1 to 200_n can be more reliably sealed.

In that case, a dicing line may be provided to overlap with the sealing portion 265a or the sealing portion 265b, or may be provided between the sealing portion 265a and the sealing portion 265b.

One embodiment of the present invention can provide a semiconductor device in which variation of transistor characteristics is small. Another embodiment of the present invention can provide a semiconductor device with favorable reliability. Another embodiment of the present invention can provide a semiconductor device having favorable electrical characteristics. Another embodiment of the present invention can provide a semiconductor device with a high on-state current. Another embodiment of the present invention can provide a semiconductor device that can be miniaturized or highly integrated. Another embodiment of the present invention can provide a semiconductor device with low power consumption.

The structure, method, and the like described above in this embodiment can be used in an appropriate combination with the structures, the methods, and the like described in the other embodiments and the like.

Embodiment 2

In this embodiment, one embodiment of a semiconductor device is described with reference to FIG. 23 to FIG. 27.
[Storage Device 1]

Figure 23:
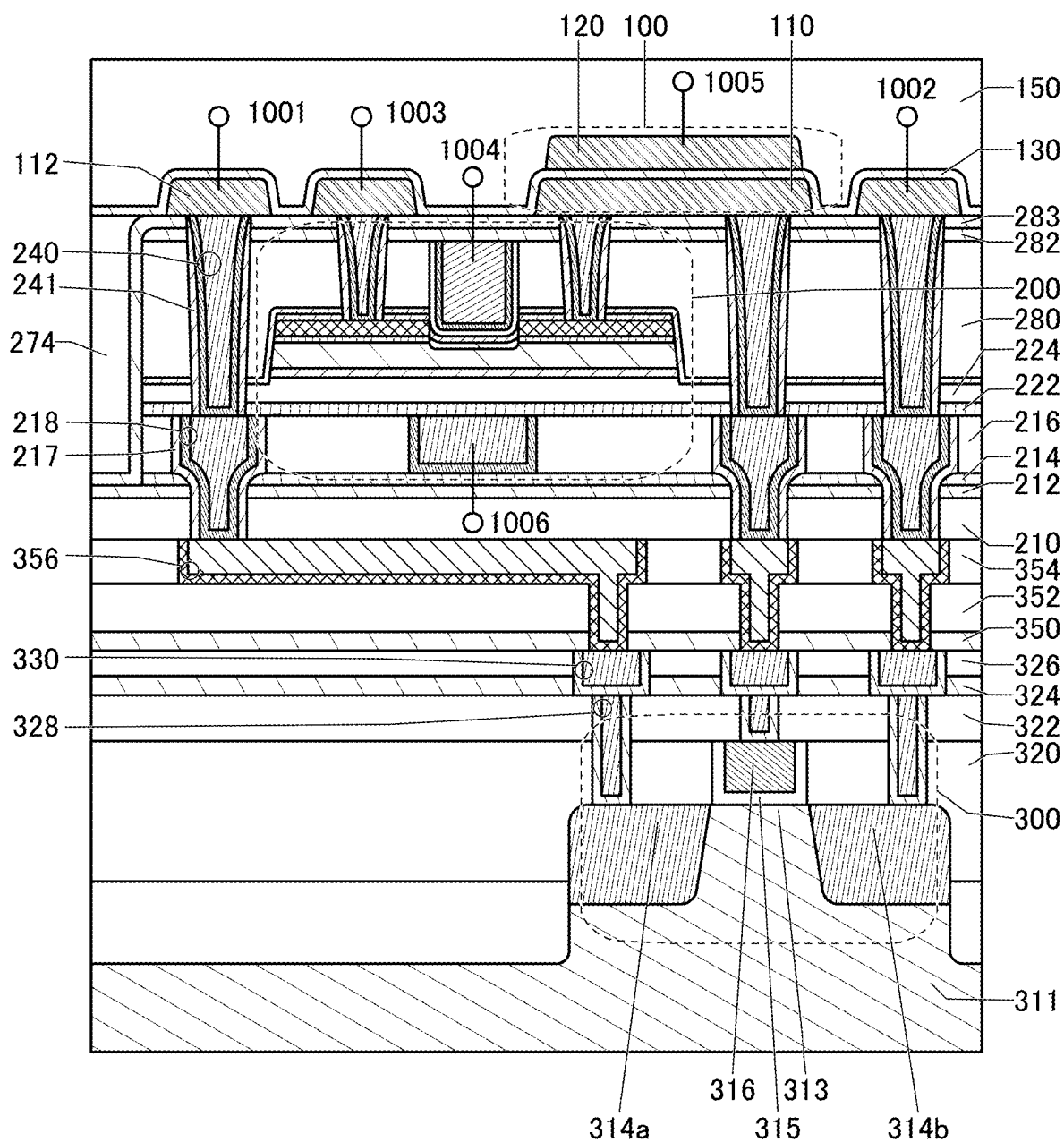
FIG. 23 is a cross-sectional view illustrating a structure of a storage device of one embodiment of the present invention.

FIG. 23 shows an example of a semiconductor device (a storage device) of one embodiment of the present invention. The semiconductor device of one embodiment of the present invention includes the transistor 200, a transistor 300, and a capacitor 100. The transistor 200 is provided above the transistor 300, and the capacitor 100 is provided above the transistor 300 and the transistor 200. The transistor 200 described in the above embodiment can be used as the transistor 200.

The transistor 200 is a transistor in which a channel is formed in a semiconductor layer containing an oxide semiconductor. The off-state current of the transistor 200 is low; thus, by using the transistor 200 in a storage device, stored data can be retained for a long time. In other words, such a storage device does not require refresh operation or has extremely low frequency of the refresh operation, which leads to a sufficient reduction in power consumption of the storage device.

In the semiconductor device shown in FIG. 23, a wiring 1001 is electrically connected to a source of the transistor 300, and a wiring 1002 is electrically connected to a drain of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The storage devices shown in FIG. 23 can form a memory cell array when arranged in a matrix.
<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

Here, in the transistor 300 shown in FIG. 23, the semiconductor region 313 (part of the substrate 311) in which a channel is formed has a protruding shape. In addition, the conductor 316 is provided to cover the side surface and the top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 shown in FIG. 23 is an example and the structure is not limited thereto; an appropriate transistor is used in accordance with a circuit structure or a driving method.
<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, for the insulator 130, the insulator that can be used for the insulator 286 described in the above embodiment is preferably used.

For example, a conductor 112 and the conductor 110 over the conductor 240 can be formed at the same time. Note that the conductor 112 functions as a plug or a wiring that is electrically connected to the capacitor 100, the transistor 200, or the transistor 300.

Although the conductor 112 and the conductor 110 having a single-layer structure are shown in FIG. 23, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the material having a high dielectric strength (a material having a low relative permittivity), silicon oxide, silicon oxynitride, silicon oxide to which fluorine is added, silicon oxide to which carbon is added, silicon oxide to which carbon and nitrogen are added, porous silicon oxide, a resin, or the like can be given.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to increase planarity.

A wiring layer may be provided over the insulator 326 and the conductor 330. For example, in FIG. 23, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in an insulator 210, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with the side surface of the conductor 218 functioning as a plug. The insulator 217 is provided in contact with the inner wall of an opening formed in the insulator 210, the insulator 212, the insulator 214, and the insulator 216. That is, the insulator 217 is provided between the conductor 218 and the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

For the insulator 217, an insulator such as silicon nitride, aluminum oxide, or silicon nitride oxide may be used. Since the insulator 217 is provided in contact with the insulator 210, the insulator 212, the insulator 214, the insulator 216, and the insulator 222, the entry of impurities such as water and hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride is deposited by a PEALD method and an opening reaching the conductor 356 is formed by anisotropic etching.

As an insulator that can be used for an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, parasitic capacitance generated between wirings can be reduced. Thus, a material is preferably selected depending on the function of an insulator.

For example, the insulator 150, the insulator 280, the insulator 210, the insulator 352, the insulator 354, and the like preferably include an insulator having a low relative permittivity. For example, the insulator preferably includes silicon nitride oxide, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having a high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 240, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to form the plugs and the wirings with a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the conductor 240 and the insulator 224 and the insulator 280 that include excess oxygen in FIG. 23. Since the insulator 241 is provided in contact with the insulator 222, the insulator 282, and the insulator 283, the insulator 224 and the transistor 200 can be sealed with the insulators having a barrier property.

That is, the insulator 241 can inhibit excess oxygen contained in the insulator 224 and the insulator 280 from being absorbed by the conductor 240. In addition, diffusion of hydrogen, which is an impurity, into the transistor 200 through the conductor 240 can be inhibited when the insulator 241 is provided.

The insulator 241 is preferably formed using an insulating material having a function of inhibiting diffusion of impurities such as water and hydrogen and oxygen. For example, silicon nitride, silicon nitride oxide, aluminum oxide, hafnium oxide, or the like is preferably used. In particular, silicon nitride is preferably used because silicon nitride has a high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As in the above embodiment, the transistor 200 is preferably sealed with the insulator 212, the insulator 214, the insulator 282, and the insulator 283. Such a structure can inhibit entry of hydrogen contained in the insulator 274, the insulator 150, or the like into the insulator 280 or the like.

Here, the conductor 240 penetrates the insulator 283 and the insulator 282, and the conductor 218 penetrates the insulator 214, the insulator 212, and the insulator 210; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed more surely with the insulator 212, the insulator 214, the insulator 282, the insulator 283, the insulator 241, and the insulator 217, so that impurities such as hydrogen contained in the insulator 274 or the like can be inhibited from entering from the outside.

As described in the above embodiment, the insulator 216, the insulator 224, the insulator 280, the insulator 250, and the insulator 274 are preferably formed by the deposition method using a gas in which hydrogen atoms are reduced or removed. Thus, the hydrogen concentrations in the insulator 216, the insulator 224, the insulator 280, the insulator 250, and the insulator 274 can be lowered.

In this manner, the hydrogen concentration in silicon-based insulating films in the vicinity of the transistor 200 can be reduced; thus, the hydrogen concentration in the oxide 230 can be reduced.

<Dicing Line>

A dicing line (sometimes referred to as a scribe line, a dividing line, or a cutting line) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as shown in FIG. 23, a region in which the insulator 283 and the insulator 212 are in contact with each other is preferably designed to overlap with the dicing line. That is, an opening is provided in the insulator 282, the insulator 280, the insulator 272, the insulator 224, the insulator 222, the insulator 216, and the insulator 214 in the vicinity of a region to be the dicing line that is provided on an outer edge of the memory cell including the plurality of transistors 200.

That is, in the opening provided in the insulator 282, the insulator 280, the insulator 272, the insulator 224, the insulator 222, the insulator 216, and the insulator 214, the insulator 212 is in contact with the insulator 283. When the insulator 212 and the insulator 283 are formed using the same material and the same method, the adhesion therebetween can be increased. For example, silicon nitride is preferably used.

With such a structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen and water from the direction of the side surface of the divided substrate to the transistor 200 can be inhibited.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 24:
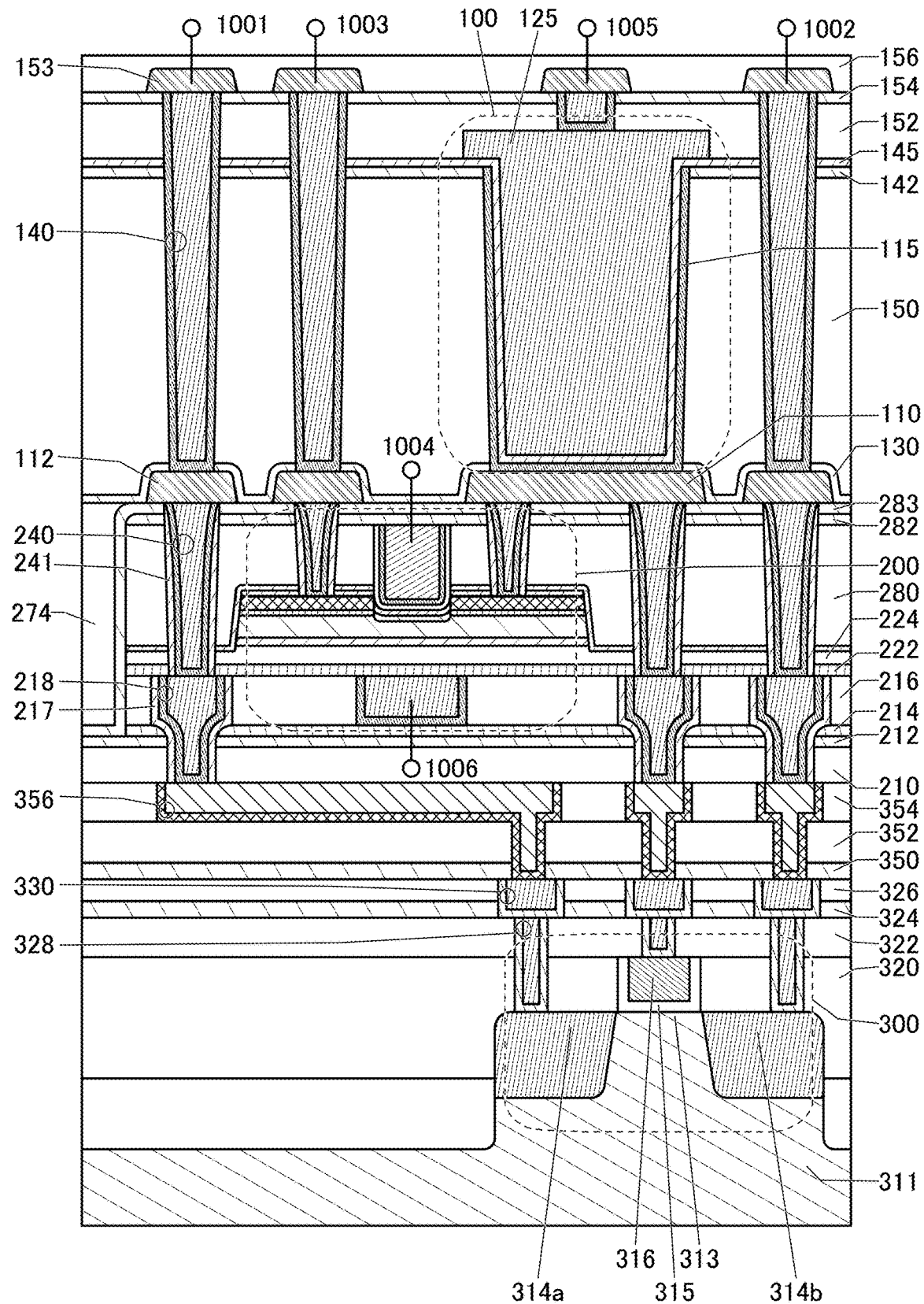
FIG. 24 is a cross-sectional view illustrating a structure of a storage device of one embodiment of the present invention.

Note that although the capacitor 100 of the storage device shown in FIG. 23 has a planar shape, the storage device described in this embodiment is not limited thereto. For example, the capacitor 100 may have a cylindrical shape as shown in FIG. 24. Note that the structure below and including the insulator 150 of a storage device shown in FIG. 24 is similar to that of the semiconductor device shown in FIG. 23.

The capacitor 100 shown in FIG. 24 includes the insulator 150 over the insulator 130, an insulator 142 over the insulator 150, a conductor 115 positioned in an opening formed in the insulator 150 and the insulator 142, an insulator 145 over the conductor 115 and the insulator 142, a conductor 125 over the insulator 145, and an insulator 152 over the conductor 125 and the insulator 145. Here, at least parts of the conductor 115, the insulator 145, and the conductor 125 are positioned in the opening formed in the insulator 150 and the insulator 142.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric positioned therebetween on the side surface as well as the bottom surface of the opening in the insulator 150 and the insulator 142; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used for the insulator 280 can be used for the insulator 152. The insulator 142 preferably functions as an etching stopper at the time of forming the opening in the insulator 150 and is formed using an insulator that can be used for the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 115 is positioned in contact with the opening formed in the insulator 142 and the insulator 150. The top surface of the conductor 115 is preferably substantially level with the top surface of the insulator 142. Furthermore, the bottom surface of the conductor 115 is in contact with the conductor 110 through an opening in the insulator 130. The conductor 115 is preferably deposited by an ALD method, a CVD method, or the like; for example, a conductor that can be used for the conductor 205 is used.

The insulator 145 is positioned to cover the conductor 115 and the insulator 142. The insulator 145 is preferably deposited by an ALD method or a CVD method, for example. The insulator 145 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with s high dielectric strength, such as silicon oxynitride, or a high permittivity (high-k) material is preferably used. Alternatively, a stacked-layer structure using a material with a high dielectric strength and a high permittivity (high-k) material may be employed.

As an insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 145 has a large thickness. When the insulator 145 has a large thickness, leakage current generated between the conductor 115 and the conductor 125 can be inhibited.

Examples of a material with a high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator with a high dielectric strength can increase the dielectric strength and inhibit electrostatic breakdown of the capacitor 100.

The conductor 125 is positioned to fill the opening formed in the insulator 142 and the insulator 150. The conductor 125 is electrically connected to the wiring 1005 through a conductor 140 and a conductor 153. The conductor 125 is preferably deposited by an ALD method, a CVD method, or the like and is formed using a conductor that can be used for the conductor 205, for example.

The conductor 153 is provided over an insulator 154 and is covered with an insulator 156. The conductor 153 is formed using a conductor that can be used for the conductor 112, and the insulator 156 is formed using an insulator that can be used for the insulator 152. Here, the conductor 153 is in contact with the top surface of the conductor 140 and functions as a terminal of the capacitor 100, the transistor 200, or the transistor 300.

[Storage Device 2]

Figure 25:
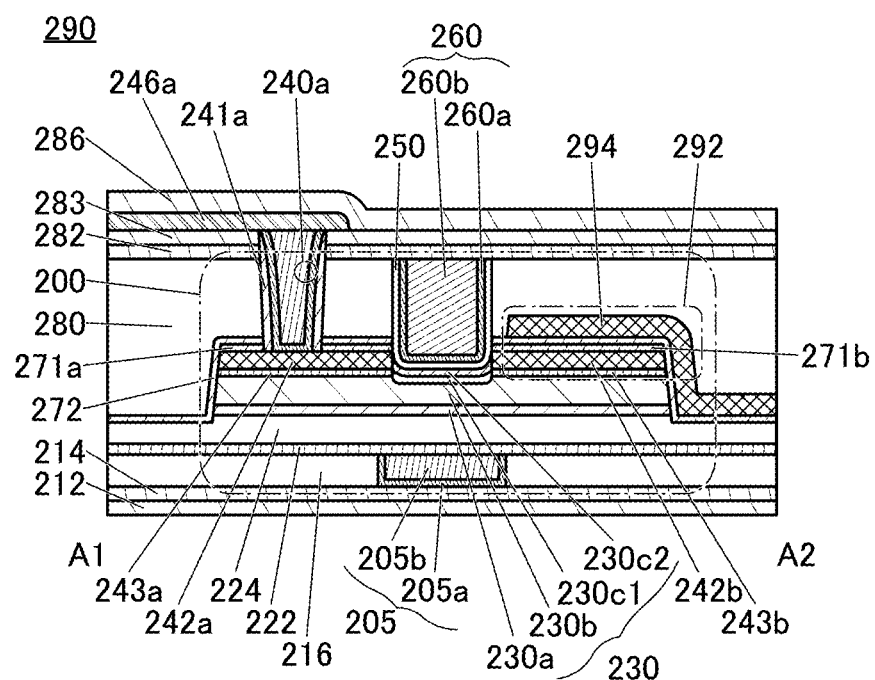
FIG. 25 is a cross-sectional view of a semiconductor device of one embodiment of the present invention.

FIG. 25 shows an example of a semiconductor device (a storage device) of one embodiment of the present invention.

Structure Example of Memory Device

FIG. 25 is a cross-sectional view of a semiconductor device 290 including a memory device. The semiconductor device 290 in FIG. 25 includes a capacitor device 292 besides the transistor 200 shown in FIG. 1A to FIG. 1D. FIG. 25 corresponds to a cross-sectional view in the channel length direction of the transistor 200.

The capacitor device 292 includes the conductor 242b, the insulator 271b over the conductor 242b, the insulator 272 provided in contact with the top surface of the insulator 271b, the side surface of the insulator 271b, and the side surface of the conductor 242b, and a conductor 294 covering the insulator 272. In other words, the capacitor device 292 forms a MIM (Metal-Insulator-Metal) capacitor. Note that one of a pair of electrodes included in the capacitor device 292, i.e., the conductor 242b, can also serve as the source electrode of the transistor. The dielectric layer of the capacitor device 292 can also serve as a protective layer provided in the transistor, i.e., the insulator 271 and the insulator 272.

Thus, the manufacturing process of the capacitor device 292 can also serve as part of the manufacturing process of the transistor; therefore, the productivity of the semiconductor device can be improved. Furthermore, the one of the pair of electrodes included in the capacitor device 292, that is, the conductor 242b, also serves as the source electrode of the transistor; therefore, the area in which the transistor and the capacitor device are positioned can be reduced.

Note that the conductor 294 can be formed using, for example, a material that can be used for the conductor 242.

Modification Example of Memory Device

Examples of a semiconductor device of one embodiment of the present invention including the transistor 200 and the capacitor device 292, which are different from the one described above in <Structure example of memory device>, will be described below with reference to FIG. 26A, FIG. 26B, FIG. 27, and FIG. 28. Note that in the semiconductor devices shown in FIG. 26A, FIG. 26B, FIG. 27, and FIG. 28, structures having the same function as those included in the semiconductor device described in the above embodiment and <Structure example of memory device> (see FIG. 25) are denoted by the same reference numerals. Note that the materials described in detail in the above embodiment and <Structure example of memory device> can be used as constituent materials of the transistor 200 and the capacitor device 292 in this section.

Modification Example 1 of Memory Device

An example of a semiconductor device 600 of one embodiment of the present invention including a transistor 200a, a transistor 200b, a capacitor device 292a, and a capacitor device 292b is described with reference to FIG. 26A.

FIG. 26A is a cross-sectional view of the semiconductor device 600 including the transistor 200a, the transistor 200b, the capacitor device 292a, and the capacitor device 292b in the channel length direction. The semiconductor device 600 includes the conductor 242b, the insulator 271b provided over the conductor 242b, the insulator 272 provided in contact with the top surface of the insulator 271b, the side surface of the insulator 271b, and the side surface of the conductor 242b, and the conductor 294 provided to cover the insulator 272 are provided. The capacitor device 292a includes the conductor 242a, the insulator 271a provided over the conductor 242a, the insulator 272 provided in contact with the top surface of the insulator 271a, the side surface of the insulator 271a, and the side surface of the conductor 242a, and a conductor 294a provided to cover the insulator 272. The capacitor device 292b includes the conductor 242b, the insulator 271b provided over the conductor 242b, the insulator 272 provided in contact with the top surface of the insulator 271b, the side surface of the insulator 271b, and the side surface of the conductor 242b, and a conductor 294b provided to cover the insulator 272.

The semiconductor device 600 has a line-symmetric structure with respect to dashed-dotted line A3-A4 as shown in FIG. 26A. A conductor 242c serves as one of a source electrode and a drain electrode of the transistor 200a and one of a source electrode and a drain electrode of the transistor 200b. Note that an insulator 271c is provided over the conductor 242c. The conductor 240 functioning as a plug connects the conductor 246 functioning as a wiring to the transistor 200a and the transistor 200b. Accordingly, when the connection of the two transistors, the two capacitor devices, the wiring, and the plug have the above-described structure, a semiconductor device that can be miniaturized or highly integrated can be provided.

The structure examples of the semiconductor device in FIG. 1A to FIG. 1D and FIG. 25 can be referred to for the structures and the effects of the transistor 200a, the transistor 200b, the capacitor device 292a, and the capacitor device 292b.

Modification Example 2 of Memory Device

In the above description, the semiconductor device including the transistor 200a, the transistor 200b, the capacitor device 292a, and the capacitor device 292b is given as a structure example; however, the semiconductor device of this embodiment is not limited thereto. For example, as shown in FIG. 26B, a structure in which the semiconductor device 600 and a semiconductor device having a structure similar to that of the semiconductor device 600 are connected through a capacitor portion may be employed. In this specification, the semiconductor device including the transistor 200a, the transistor 200b, the capacitor device 292a, and the capacitor device 292b is referred to as a cell. For the structures of the transistor 200a, the transistor 200b, the capacitor device 292a, and the capacitor device 292b, the above description of the transistor 200a, the transistor 200b, the capacitor device 292a, and the capacitor device 292b can be referred to.

FIG. 26B is a cross-sectional view in which the semiconductor device 600 including the transistor 200a, the transistor 200b, the capacitor device 292a, and the capacitor device 292b, and a cell having a structure similar to that of the semiconductor device 600 are connected through a capacitor portion.

As shown in FIG. 26B, the conductor 294b functioning as one electrode of the capacitor device 292b included in the semiconductor device 600 also serves as one electrode of a capacitor device included in a semiconductor device 601 having a structure similar to that of the semiconductor device 600. Although not shown, the conductor 294a functioning as one electrode of the capacitor device 292a included in the semiconductor device 600 also serves as one electrode of a capacitor device included in a semiconductor device on the left side of the semiconductor device 600, that is, a semiconductor device adjacent to the semiconductor device 600 in the A1 direction in FIG. 26B. The cell on the right side of the semiconductor device 601, that is, the cell in the A2 direction in FIG. 26B, has a similar structure. That is, a cell array (also referred to as a memory device layer) can be formed. With this structure of the cell array, the space between the adjacent cells can be reduced; thus, the projected area of the cell array can be reduced and high integration can be achieved. When the cells shown in FIG. 26B are arranged in a matrix, a matrix-shape cell array can be formed.

When the transistor 200a, the transistor 200b, the capacitor device 292a, and the capacitor device 292b are formed to have the structures described in this embodiment as described above, the area of the cell can be reduced and the semiconductor device including a cell array can be miniaturized or highly integrated.

Figure 27:
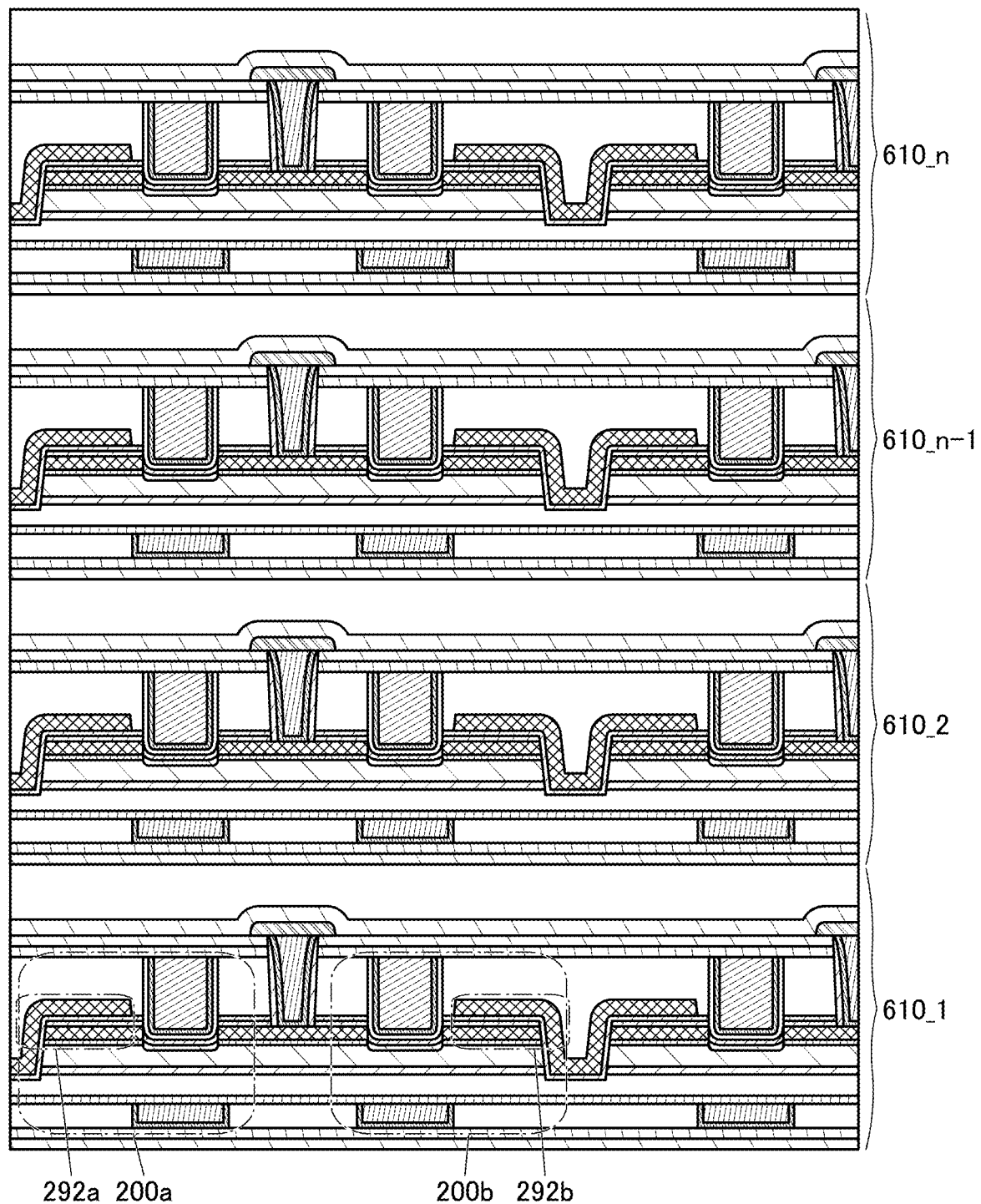
FIG. 27 is a cross-sectional view of a semiconductor device of one embodiment of the present invention.

Furthermore, the cell array may have a stacked-layer structure instead of a single-layer structure. FIG. 27 shows a cross-sectional view of n layers of cell arrays 610 that are stacked. When a plurality of cell arrays (a cell array 610_1 to a cell array 610_n) are stacked as shown in FIG. 27, cells can be integrally positioned without increasing the area occupied by the cell arrays. In other words, a 3D cell array can be formed.

Modification Example 3 of Memory Device

Figure 28:
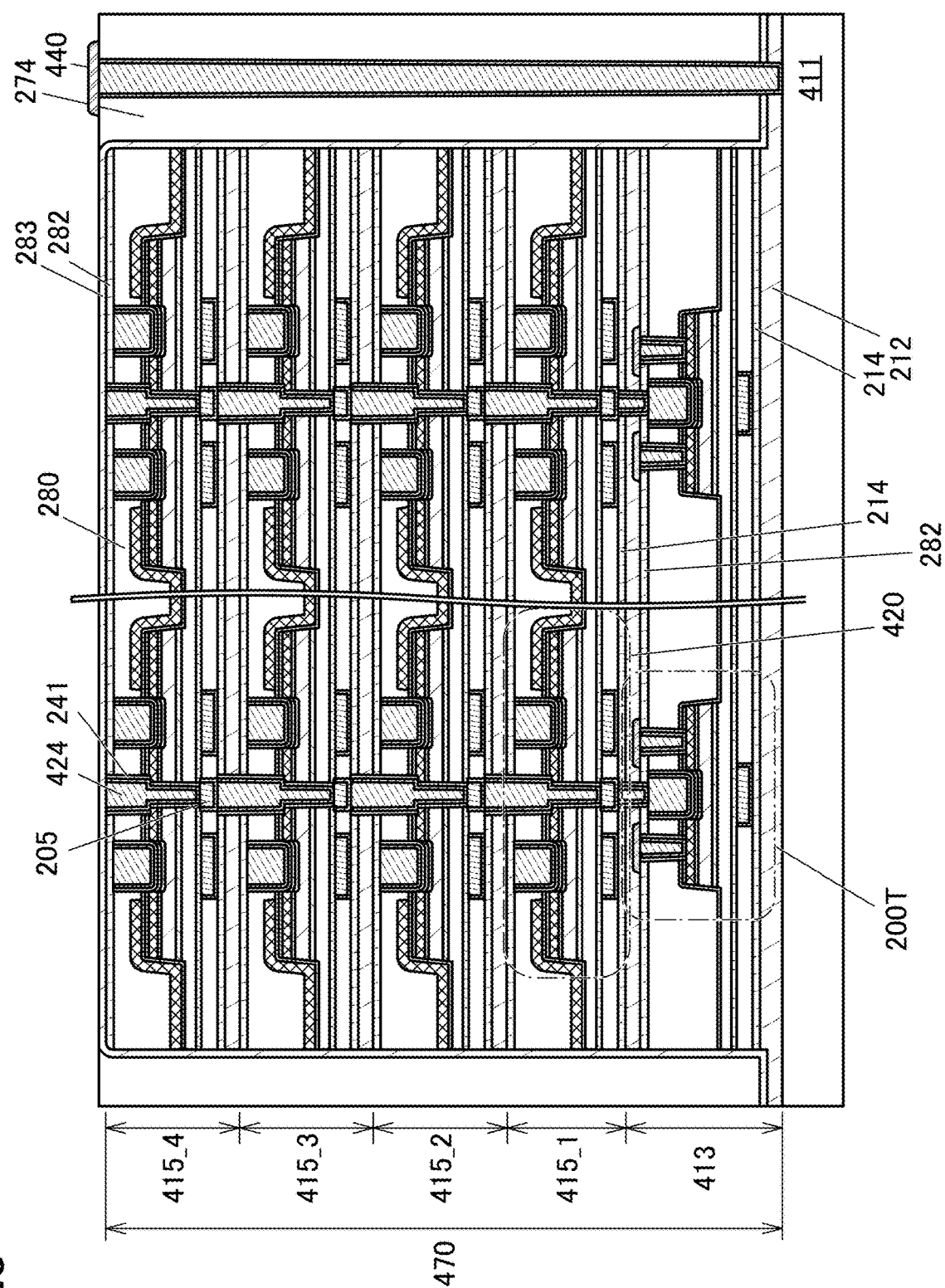
FIG. 28 is a cross-sectional view of a semiconductor device of one embodiment of the present invention.

FIG. 28 shows an example in which a memory unit 470 includes a transistor layer 413 including a transistor 200T and a memory device layer 415 of four layers (a memory device layer 415_1 to a memory device layer 415_4).

The memory device layer 415_1 to the memory device layer 415_4 each include a plurality of memory devices 420.

The memory device 420 is electrically connected to the memory device 420 included in a different memory device layer 415 and the transistor 200T included in the transistor layer 413 through a conductor 424 and the conductor 205.

The memory unit 470 is sealed with the insulator 212, the insulator 214, the insulator 282, and the insulator 283 (such a structure is referred to as a sealing structure below for convenience). The insulator 274 is provided in the periphery of the insulator 283. A conductor 440 is provided in the insulator 274, the insulator 283, and the insulator 212, and is electrically connected to an element layer 411.

The insulator 280 is provided in the sealing structure. The insulator 280 has a function of releasing oxygen by heating. Alternatively, the insulator 280 includes an excess-oxygen region.

The insulator 212 and the insulator 283 are suitably formed using a material having a high blocking property against hydrogen. The insulator 214 and the insulator 282 are suitably formed using a material having a function of capturing hydrogen or fixing hydrogen.

Examples of the material having a high blocking property against hydrogen include silicon nitride and silicon nitride oxide. Examples of the material having a function of trapping or fixing hydrogen include aluminum oxide, hafnium oxide, and an oxide containing aluminum and hafnium (hafnium aluminate).

For the crystal structure of materials used for the insulator 212, the insulator 214, the insulator 282, and the insulator 283, an amorphous or crystalline structure may be employed, although the crystal structure is not limited thereto. For example, it is preferable to use an amorphous aluminum oxide film for the material having a function of trapping or fixing hydrogen. Amorphous aluminum oxide may trap or fix hydrogen more than aluminum oxide with high crystallinity.

Here, as the model of excess oxygen in the insulator 280 with respect to diffusion of hydrogen from an oxide semiconductor in contact with the insulator 280, the following model can be given.

Hydrogen in the oxide semiconductor diffuses to other structure bodies through the insulator 280 in contact with the oxide semiconductor. The hydrogen in the oxide semiconductor react with the excess oxygen in the insulator 280, which yields the OH bonding to diffuse in the insulator 280. The hydrogen atom having the OH bonding reacts with the oxygen atom bonded to an atom (such as a metal atom) in the insulator 282 in reaching a material which has a function of capturing or fixing hydrogen (typically the insulator 282), and is trapped or fixed in the insulator 282. The oxygen atom which had the OH bonding of the excess oxygen may remain as an excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. Specifically, the heat treatment is performed at 350° C. or higher, preferably 400° C. or higher under an atmosphere containing oxygen, an atmosphere containing nitrogen, or a mixed atmosphere of oxygen and nitrogen. The heat treatment is performed for one hour or more, preferably four hours or more, further preferably eight hours or more.

The heat treatment enables diffusion of hydrogen from the oxide semiconductor to the outside through the insulator 280 and the insulator 282. That is, the absolute amount of hydrogen in and near the oxide semiconductor can be reduced.

The insulator 283 is formed after the heat treatment. The insulator 283 is formed using a material having a high blocking property against hydrogen; thus, entry of hydrogen diffusing to the outside or external hydrogen into the inside, specifically, the oxide semiconductor or the insulator 280 side can be inhibited.

An example where the heat treatment is performed after the insulator 282 is formed is shown; however, one embodiment of the present invention is not limited thereto. For example, the heat treatment may be performed after the transistor layer 413 is formed or after the memory device layer 415_1 to the memory device layer 415_3 are formed. When hydrogen is diffused to the outside by the heat treatment, hydrogen is diffused to above the transistor layer 413 or in a lateral direction. Similarly, in the case where heat treatment is performed after the memory device layer 415_1 to the memory device layer 415_3 are formed, hydrogen is diffused into an upper area or in the lateral direction.

Through the above manufacturing process, the insulator 212 and the insulator 283 are bonded, whereby the sealing structure is formed.

With the above-described structure and the above-described manufacturing process, a semiconductor device using an oxide semiconductor with reduced hydrogen concentration can be provided. Accordingly, a semiconductor device with high reliability can be provided. According to another embodiment of the present invention, a semiconductor device with favorable electrical characteristics can be provided.

The structures, methods, and the like described in this embodiment can be used in an appropriate combination with the structures, configurations, methods, and the like described in the other embodiments and the like.

Embodiment 3

In this embodiment, an apparatus that can be used to manufacture a semiconductor device of one embodiment of the present invention is described with reference to FIG. 29.

In manufacture of the semiconductor device of one embodiment of the present invention, it is preferable to use what is called a multi-chamber apparatus including a plurality of treatment chambers enabling successive deposition of different kinds of films. In each treatment chamber, deposition treatment such as sputtering, CVD, or ALD can be performed. For example, in the case where one treatment chamber is a sputtering chamber, the sputtering chamber can be connected to a gas supply device, a gas refining device connected to the gas supply device, a vacuum pump, a target, or the like. The sputtering chamber may have a structure in which an ionization sputtering method can be performed.

Furthermore, the sputtering chamber may have a structure in which a bias sputtering method can be performed.

In each treatment chamber, a substrate cleaning treatment, a plasma treatment, a reverse sputtering treatment, an etching treatment, an ashing treatment, a heat treatment, or the like may be performed. Different treatments are performed between treatment chambers as appropriate, whereby an insulator, a conductor, and a semiconductor film can be formed without exposure to the air.

A typical example of the semiconductor film used in one embodiment of the present invention includes an oxide semiconductor film. In particular, the oxide semiconductor film having a low impurity concentration and a low density of defect states (the amount of oxygen vacancies is small) enables a transistor with excellent electrical characteristics to be manufactured. Here, the state in which the impurity concentration is low and the density of defect states is low is referred to as highly purified intrinsic or substantially highly purified intrinsic.

A highly purified intrinsic or substantially highly purified intrinsic oxide semiconductor film has few carrier generation sources, and thus the carrier density can be reduced. Thus, a transistor in which a channel formation region is formed in the oxide semiconductor film rarely has electrical characteristics in which the threshold voltage is negative (also referred to as normally on). Moreover, a highly purified intrinsic or substantially highly purified intrinsic oxide semiconductor film has a low density of defect states and accordingly may have a low density of trap states. Furthermore, a highly purified intrinsic or substantially highly purified intrinsic oxide semiconductor film has an extremely low off-state current; even when an element has a channel width of $1\times10^6$ μm and a channel length L of 10 μm, the off-state current can be less than or equal to the measurement limit of a semiconductor parameter analyzer, i.e., less than or equal to $1\times10^{-13}$ A, at a voltage between a source electrode and a drain electrode (drain voltage) ranging from 1 V to 10 V.

Note that impurities in the oxide semiconductor film are typically water, hydrogen, and the like. In this specification and the like, reducing or removing water and hydrogen from the oxide semiconductor film may be referred to as dehydration or dehydrogenation. Moreover, adding oxygen to the oxide semiconductor film may be referred to as oxygen addition and a state in which oxygen in excess of the stoichiometric composition is contained due to the oxygen addition may be referred to as an oxygen-excess state.

Here, as an oxide semiconductor, an insulator or a conductor positioned under the oxide semiconductor, and an insulator or a conductor positioned over the oxide semiconductor, different kinds of films are successively deposited without being exposed to the air, whereby a substantially highly purified intrinsic oxide semiconductor film whose impurity (hydrogen and water, in particular) concentration is reduced can be deposited.

First, a structure example of the apparatus that can be used to manufacture a semiconductor device of one embodiment of the present invention will be described in detail with reference to FIG. 29. With the use of the apparatus shown in FIG. 29, it is possible to successively deposit a semiconductor film, an insulator or a conductor positioned under the semiconductor film, and an insulator or a conductor positioned over the semiconductor film. Thus, impurities (hydrogen and water, in particular) can be prevented from entering the semiconductor film.

Figure 29:
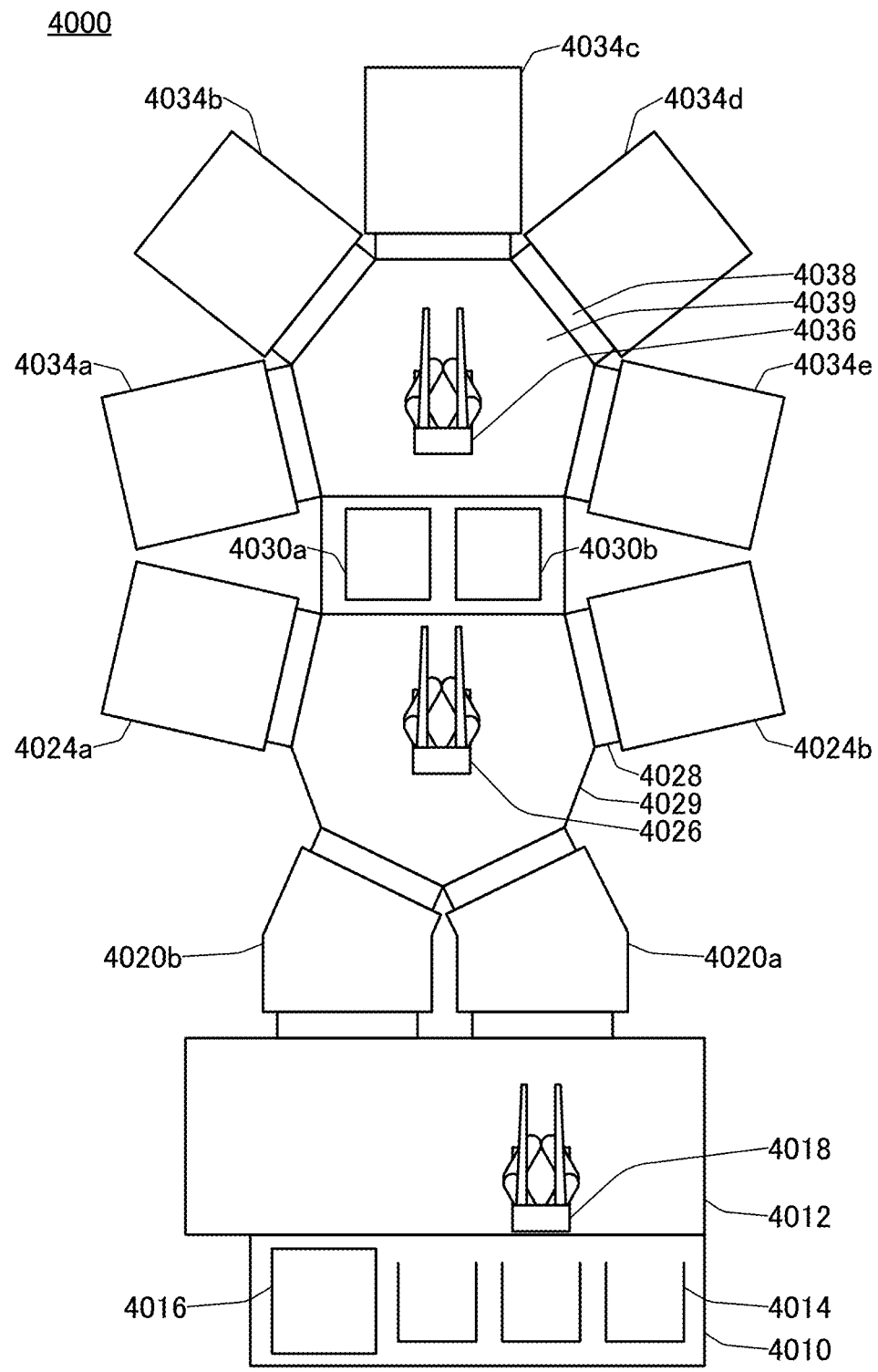
FIG. 29 is a top view illustrating an apparatus for manufacturing a semiconductor device of one embodiment of the present invention.

FIG. 29 schematically shows a top view of a single wafer multi-chamber apparatus 4000.

The apparatus 4000 includes an atmosphere-side substrate supply chamber 4010, an atmosphere-side substrate transfer chamber 4012 that transfers a substrate from the atmosphere-side substrate supply chamber 4010, a load lock chamber 4020a that loads a substrate and switches the pressure in the chamber from an atmospheric pressure to a reduced pressure or from a reduced pressure to an atmospheric pressure, an unload lock chamber 4020b that unloads a substrate and switches the pressure in the chamber from a reduced pressure to an atmospheric pressure or from an atmospheric pressure to a reduced pressure, a transfer chamber 4029 and a transfer chamber 4039 that transfer a substrate in a vacuum, a transport chamber 4030a and a transport chamber 4030b that connect the transfer chamber 4029 and the transfer chamber 4039, and a treatment chamber 4024a, a treatment chamber 4024b, a treatment chamber 4034a, a treatment chamber 4034b, a treatment chamber 4034c, a treatment chamber 4034d, and a treatment chamber 4034e that perform deposition or heating.

Note that different treatments can be performed in a plurality of treatment chambers in parallel. Thus, a stacked-layer structure of different kinds of films can be easily fabricated. The number of parallel treatments that can be conducted at maximum is equated to the number of treatment chambers. For example, the apparatus 4000 shown in FIG. 29 is an apparatus that includes seven treatment chambers. Therefore, seven deposition treatments can be successively performed without exposure to the air using one apparatus (which is referred to as "in-situ" in this specification).

On the other hand, the number of stacked layers that can be fabricated in a stacked-layer structure without exposure to the air is not necessarily the same as the number of treatment chambers. For example, in the case where a stacked-layer structure to be required includes a plurality of layers formed using the same material, the layers can be provided in one treatment chamber; thus, a stacked-layer structure can have stacked layers the number of which is larger than the number of provided treatment chambers.

The atmosphere-side substrate supply chamber 4010 includes a cassette port 4014 that holds a substrate and an alignment port 4016 that aligns a substrate. Note that a plurality of cassette ports 4014 may be provided (for example, in FIG. 29, three cassette ports are provided).

The atmosphere-side substrate transfer chamber 4012 is connected to the load lock chamber 4020a and the unload lock chamber 4020b. The transfer chamber 4029 is connected to the load lock chamber 4020a, the unload lock chamber 4020b, the transport chamber 4030a, the transport chamber 4030b, the treatment chamber 4024a, and the treatment chamber 4024b. The transport chamber 4030a and the transport chamber 4030b are connected to the transfer chamber 4029 and the transfer chamber 4039. The transfer chamber 4039 is connected to the transport chamber 4030a, the transport chamber 4030b, the treatment chamber 4034a, the treatment chamber 4034b, the treatment chamber 4034c, the treatment chamber 4034d, and the treatment chamber 4034e.

Note that a gate valve 4028 or a gate valve 4038 is provided for a connecting portion of each chamber so that each of the chambers except for the atmosphere-side substrate supply chamber 4010 and the atmosphere-side substrate transfer chamber 4012 can be independently kept under vacuum. The atmosphere-side substrate transfer chamber 4012 includes a transfer robot 4018. The transfer chamber 4029 includes a transfer robot 4026, and the transfer chamber 4039 includes a transfer robot 4036. Each of the transfer robot 4018, the transfer robot 4026, and the transfer robot 4036 includes a plurality of movable portions and an arm for holding a substrate and can transfer a substrate to each chamber.

Note that the numbers of transfer chambers, treatment chambers, load lock chambers, unload lock chambers, and transport chambers are not limited to the above, and the numbers thereof can be set as appropriate depending on the space for placement or the process conditions.

In particular, in the case where a plurality of transfer chambers are provided, two or more transport chambers are preferably provided between one transfer chamber and another transfer chamber. For example, in the case where the transfer chamber 4029 and the transfer chamber 4039 are provided as shown in FIG. 29, the transport chamber 4030a and the transport chamber 4030b are preferably provided in parallel between the transfer chamber 4029 and the transfer chamber 4039.

When the transport chamber 4030a and the transport chamber 4030b are provided in parallel, for example, a step of carrying a substrate to the transport chamber 4030a by the transfer robot 4026 and a step of carrying a substrate to the transport chamber 4030b by the transfer robot 4036 can be concurrently performed. Furthermore, a step of carrying out a substrate from the transport chamber 4030b by the transfer robot 4026 and a step of carrying out a substrate from the transport chamber 4030a by the transfer robot 4036 can be concurrently performed. That is, when a plurality of transfer robots are driven concurrently, the production efficiency is improved.

Although an example in which one transfer chamber includes one transfer robot and is connected to a plurality of treatment chambers is shown in FIG. 29, the present invention is not limited to this structure. One transfer chamber may be provided with a plurality of transfer robots.

In addition, one or both of the transfer chamber 4029 and the transfer chamber 4039 are connected to a vacuum pump and a cryopump through valves. Accordingly, the transfer chamber 4029 and the transfer chamber 4039 can be evacuated with the use of the vacuum pump from the atmospheric pressure to low or medium vacuum (approximately several hundred pascals to 0.1 Pa) and then, by switching the valve, be evacuated with the use of the cryopump from the medium vacuum to high or ultra-high vacuum (approximately 0.1 Pa to $1 \times 10^{-7}$ Pa).

Alternatively, two or more cryopumps may be connected in parallel to one transfer chamber, for example. With a plurality of cryopumps, even when one of the cryopumps is in regeneration, exhaust can be performed using the other of the cryopumps. Note that the above regeneration refers to treatment for discharging molecules (or atoms) entrapped in the cryopump. When molecules (or atoms) are entrapped too much in a cryopump, the exhaust capability is lowered; therefore, it is preferable to perform regeneration regularly.

The treatment chamber 4024a, the treatment chamber 4024b, the treatment chamber 4034a, the treatment chamber 4034b, the treatment chamber 4034c, the treatment chamber 4034d, and the treatment chamber 4034e can perform different treatments in parallel. In other words, the treatment chambers can perform, on the substrates provided, different treatments out of a deposition treatment by a sputtering method, a CVD method, an MBE method, a PLD method, an ALD method, or the like, a heat treatment, and a plasma treatment. In the treatment chamber, a deposition treatment may be performed after a heat treatment or a plasma treatment.

In the apparatus 4000, it is possible to transfer a substrate without exposure of the substrate to the air between treatments since a plurality of treatment chambers are provided; therefore, adsorption of impurities on the substrate can be inhibited. The treatment chambers can perform a deposition treatment for different kinds of films, a heat treatment, or a plasma treatment, which makes it possible to freely determine the order of deposition, a heat treatment, and the like.

Note that each treatment chamber may be connected to the vacuum pump through a valve. As the vacuum pump, a dry pump, a mechanical booster pump, or the like can be used, for example.

Furthermore, each treatment chamber may be connected to a power source capable of generating plasma. As the power source, a DC power source, an AC power source, a high-frequency (RF, microwave, or the like) power source, or the like may be provided. A pulsed generator may be connected to the DC power source.

Moreover, the treatment chamber may be connected to a gas refining device through a gas supply device. Note that the number of provided gas supply devices and the number of provided gas refining devices may be equated to the number of kinds of gases.

For example, in the case where the deposition treatment is performed by sputtering in the treatment chamber, the treatment chamber may include a target, a backing plate connected to the target, a cathode positioned to face the target with the backing plate therebetween, a deposition shield, a substrate stage, or the like. For example, the substrate stage may include a substrate holding mechanism which holds the substrate, a rear heater which heats the substrate from the back surface, or the like.

Note that the substrate stage is held substantially perpendicularly to a floor during deposition and is held substantially parallel to the floor when the substrate is delivered. Here, when the substrate stage is held substantially perpendicularly to the floor, the probability that dust or a particle which might be mixed into the film during deposition is attached to the substrate can be lowered as compared to the case where the substrate stage is held parallel to the floor. However, there is a possibility that the substrate falls when the substrate stage is held perpendicularly (90°) to the floor; therefore, the angle of the substrate stage to the floor is preferably greater than or equal to 80° and less than 90°.

Note that the structure of the substrate stage is not limited to the above structure. A structure in which the substrate stage is substantially parallel to the floor may be employed, for example. In the case of such a structure, a target may be provided below the substrate stage, and a substrate may be provided between the target and the substrate stage. The substrate stage may be provided with a jig for fixing a substrate so as not to fall or a mechanism for fixing a substrate.

Furthermore, when a deposition shield is provided for the treatment chamber, particles sputtered from the target can be inhibited from being deposited on a region where deposition is not needed. Moreover, the deposition shield is preferably processed to prevent accumulated sputtered particles from being separated. For example, blasting treatment which increases surface roughness or projections and depressions may be provided on the surfaces of the deposition shield.

The backing plate has a function of holding the target, and the cathode has a function of applying voltage (for example, negative voltage) to the target.

Note that the target can be formed using a conductor, an insulator, or a semiconductor. For example, when the target is an oxide semiconductor such as a metal oxide, an oxide semiconductor film can be deposited in the treatment chamber. When the target is a metal oxide, an oxynitride semiconductor film can be formed by using a nitrogen gas as the deposition gas.

Each treatment chamber may be connected to a gas supply device through a gas heating mechanism. The gas heating mechanism is connected to a gas refining device through the gas supply apparatus. As the gas introduced to the treatment chamber, a gas whose dew point is −80° C. or lower, preferably −100° C. or lower, further preferably −120° C. or lower can be used; for example, an oxygen gas, a nitrogen gas, and a rare gas (e.g., an argon gas) can be used. With the gas heating mechanism, a gas which is introduced to the treatment chamber can be heated to a temperature higher than or equal to 40° C. and lower than or equal to 400° C. Note that the number of provided gas heating mechanisms, the number of provided gas supply devices, and the number of provided gas refining devices may be equated to the number of kinds of gases.

Each treatment chamber may be connected to a turbo molecular pump and a vacuum pump through valves. Each treatment chamber may be provided with a cryotrap.

The cryotrap is a mechanism which can adsorb a molecule (or an atom) having a relatively high melting point, such as water. The turbo molecular pump has excellent productivity because it stably exhausts a large-sized molecule (or atom) and needs low frequency of maintenance, whereas it has a low capability in removing hydrogen and water. Thus, a cryotrap can be used to improve the evacuation capability of water or the like. The temperature of a freezer of the cryotrap is set lower than or equal to 100 K, preferably lower than or equal to 80 K. Furthermore, in the case where the cryotrap has a plurality of freezers, it is preferable to set the freezers at different temperatures because efficient exhaust is possible. For example, the temperature of a first-stage freezer is set lower than or equal to 100 K and the temperature of a second-stage freezer is set lower than or equal to 20 K.

Note that the exhaust method for the treatment chamber is not limited thereto, and a system similar to that in the exhaust method described for the transfer chamber connected thereto (the exhaust method using the cryopump and the vacuum pump) may be employed. Note that the exhaust method for the transfer chamber may have a system similar to that of the treatment chamber (the exhaust method using the turbo molecular pump and the vacuum pump).

In particular, the vacuum pump and the cryotrap may be combined as the exhaust method for the treatment chamber where an oxide semiconductor film is deposited. The exhaust method for the treatment chamber where an oxide semiconductor film is deposited preferably has at least a function of adsorbing water molecules.

In the treatment chamber where the oxide semiconductor film is deposited, the partial pressure of hydrogen molecules is preferably lower than or equal to $1 \times 10^{-2}$ Pa, and the partial pressure of water molecules is preferably lower than or equal to $1 \times 10^{-4}$ Pa. In the treatment chamber where the oxide semiconductor film is deposited in a standby state, the pressure is lower than or equal to $8.0 \times 10^{-5}$ Pa, preferably lower than or equal to $5.0 \times 10^{-5}$ Pa, further preferably lower than or equal to $1.0 \times 10^{-5}$ Pa. The above values of the partial pressure of hydrogen molecules and the partial pressure of water molecules are the values of both of the standby state and in the deposition state (a plasma discharge state) of the treatment chamber in which sputtering is performed.

Note that a total pressure and a partial pressure in the treatment chamber can be measured using a mass analyzer. For example, Qulee CGM-051, a quadrupole mass analyzer (also referred to as Q-mass) produced by ULVAC, Inc. can be used.

When the partial pressure of hydrogen molecules, the partial pressure of water molecules, and the pressure in the standby state in the treatment chamber are set to the values in above ranges, the impurity concentration in an oxide semiconductor film to be formed can be reduced.

In particular, each treatment chamber is used for deposition treatment by sputtering, so that part of the structure of the transistor 200 described in the above embodiment can be manufactured with a stacked-layer structure by successive in-situ deposition.

In the method for manufacturing the transistor 200, the insulator 212, the insulator 214, and the insulator 216 are successively deposited using the apparatus 4000. The oxide film 230A, the oxide film 230B, and the oxide film 243A are successively deposited using the apparatus 4000. The conductive film 242A, the insulating film 271A, and the conductive film 248A are successively deposited using the apparatus 4000.

That is, the insulator 212, the insulator 214, and the insulator 216 can be successively deposited without being exposed to the air. The oxide film 230A, the oxide film 230B, and the oxide film 243A can be successively deposited without being exposed to the air. The conductive film 242A, the insulating film 271A, and the conductive film 248A can be successively deposited without being exposed to the air.

With the above structure, a stacked film from which impurities (typically, water, hydrogen, and the like) are thoroughly removed can be formed. Furthermore, each interface of the stacked films is not exposed to the air; thus, the impurity concentration is reduced.

Alternatively, in the case where heat treatment is performed in a treatment chamber, for example, the treatment chamber may have a plurality of heating stages that can hold a substrate. Note that the heating stage may have several stages. By increasing the number of the heating stages, a plurality of substrates can be subjected to heat treatment at the same time, which leads to an increase in productivity.

A heating mechanism which can be used for the treatment chamber may be a heating mechanism which performs heating with a resistance heater or the like, for example. Alternatively, a heating mechanism that uses heat conduction or heat radiation from a medium such as a heated gas for heating may be used. For example, RTA (Rapid Thermal Anneal) apparatus such as a GRTA (Gas Rapid Thermal Anneal) apparatus or an LRTA (Lamp Rapid Thermal Anneal) apparatus can be used. In the LRTA, an object is heated through radiation of light (electromagnetic wave) emitted from a lamp such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. An inert gas is used as the gas.

The load lock chamber 4020a may include a substrate delivery stage, a rear heater for heating a substrate from the back surface, or the like. When the pressure in the load lock chamber 4020a is increased from a reduced pressure state to an atmospheric pressure and becomes an atmospheric pressure, the substrate delivery stage receives a substrate from the transfer robot 4018 provided in the atmosphere-side substrate transfer chamber 4012. After that, the load lock chamber 4020a is evacuated into a vacuum to make a reduced pressure state, and then, the transfer robot 4026 provided in the transfer chamber 4029 receives the substrate from the substrate delivery stage.

Furthermore, the load lock chamber 4020a is connected to a vacuum pump and a cryopump through valves. Note that the unload lock chamber 4020b can have a structure similar to that of the load lock chamber 4020a.

Since the atmosphere-side substrate transfer chamber 4012 includes the transfer robot 4018, delivery and receipt of a substrate between the cassette port 4014 and the load lock chamber 4020a can be performed using the transfer robot 4018. Furthermore, a mechanism for inhibiting entry of dust or a particle, such as an HEPA filter (High Efficiency Particulate Air Filter), may be provided above the atmosphere-side substrate transfer chamber 4012 and the atmosphere-side substrate supply chamber 4010. The cassette port 4014 can hold a plurality of substrates.

Entry of impurities into a semiconductor film can be suitably inhibited when an insulating film, a semiconductor film, and a conductive film are successively deposited without exposure to the air with the use of the apparatus 4000 described above.

As described above, a stacked-layer structure including a semiconductor film can be formed through successive film deposition with the use of the apparatus of one embodiment of the present invention. Therefore, impurities such as hydrogen and water that might enter a semiconductor film can be inhibited and a semiconductor film with a low density of defect states can be formed.

The structure, method, and the like described above in this embodiment can be used in an appropriate combination with the structures, the methods, and the like described in the other embodiments and the like.

Embodiment 4

In this embodiment, a storage device of one embodiment of the present invention including a transistor in which an oxide is used as a semiconductor (hereinafter referred to as an OS transistor in some cases) and a capacitor (hereinafter referred to as an OS memory device in some cases), is described with reference to FIG. 30A, FIG. 30B, and FIG. 31A to FIG. 31H. The OS memory device is a storage device including at least a capacitor and the OS transistor that controls the charging and discharging of the capacitor. Since the OS transistor has an extremely low off-state current, the OS memory device has excellent retention characteristics and thus can function as a nonvolatile memory.

Structure Example of Storage Device

Figure 30A:
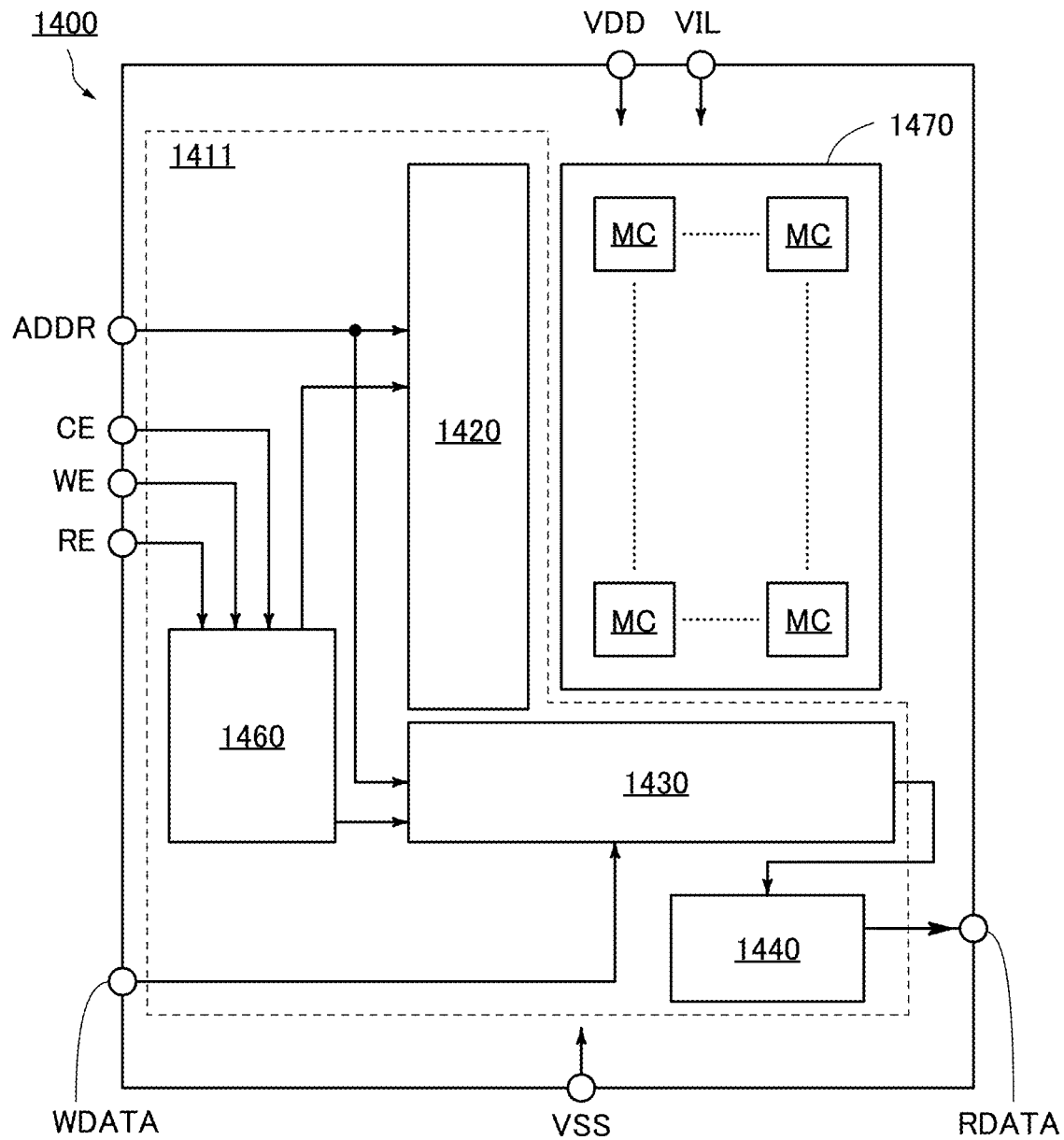
FIG. 30A and FIG. 30B are block diagrams illustrating a structure example of a storage device of one embodiment of the present invention.

FIG. 30A shows a structure example of the OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 30B:
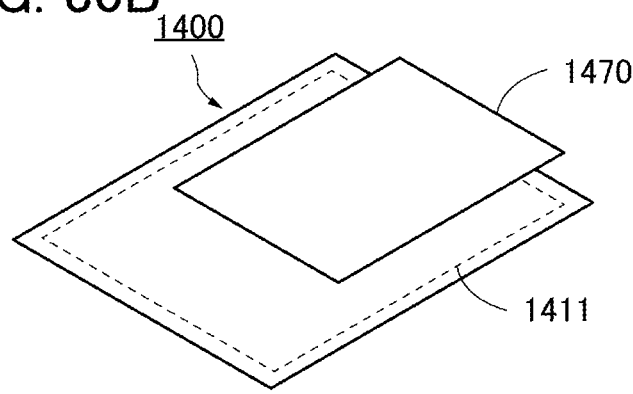

Note that FIG. 30A shows an example in which the peripheral circuit 1411 and the memory cell array 1470 are formed on the same plane; however, this embodiment is not limited thereto. For example, as shown in FIG. 30B, the memory cell array 1470 may be provided to overlap with part of the peripheral circuit 1411. For example, the sense amplifier may be provided below the memory cell array 1470 so that they overlap with each other.

FIG. 31A to FIG. 31H show structure examples of a memory cell that can be applied to the memory cell MC.

[DOSRAM]

Figure 31A:
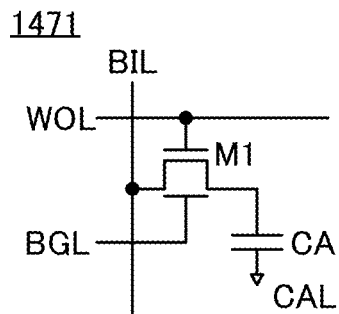
FIG. 31A to FIG. 31H are circuit diagrams each illustrating a structure example of a storage device of one embodiment of the present invention.
Figure 31B:
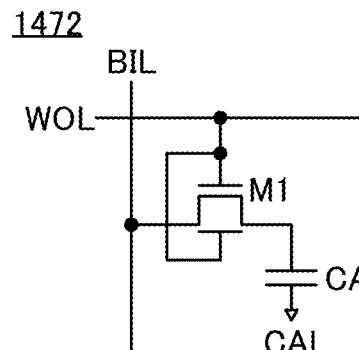
Figure 31C:
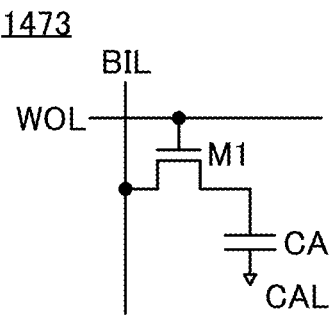

FIG. 31A to FIG. 31C show circuit structure examples of DRAM memory cells. In this specification and the like, a DRAM using a memory cell including one OS transistor and one capacitor is referred to as a DOSRAM (Dynamic Oxide Semiconductor Random Access Memory) in some cases. A memory cell 1471 shown in FIG. 31A includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, a memory cell 1471 shown in FIG. 31A corresponds to the storage device shown in FIG. 25. That is, the transistor M1 and the capacitor CA correspond to the transistor 200 and the capacitor device 292, respectively.

The memory cell MC is not limited to the memory cell 1471, and the circuit structure can be changed. For example, as in a memory cell 1472 shown in FIG. 31B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 shown in FIG. 31C.

In the case where the semiconductor device described in the above embodiment is used in the memory cell 1471 or the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long period of time, and thus the frequency of the refresh operation for the memory cell can be decreased. In addition, refresh operation for the memory cell can be omitted. In addition, since the transistor M1 has an extremely low leakage current, multi-level data or analog data can be retained in the memory cell 1471, the memory cell 1472, and the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIG. 31D to FIG. 31G show circuit structure examples of gain-cell memory cells each including two transistors and one capacitor. A memory cell 1474 shown in FIG. 31D includes a transistor M2, a transistor M3, and a capacitor CB. Note that the transistor M2 includes a top gate (simply referred to as a gate in some cases) and a back gate. In this specification and the like, a storage device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 31D:
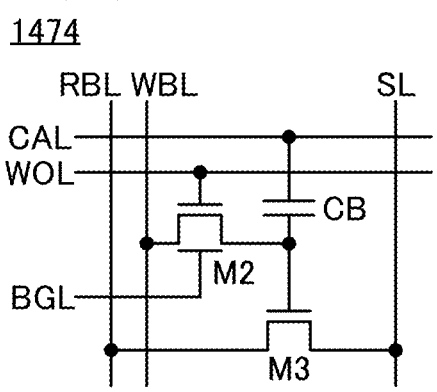
Figure 31E:
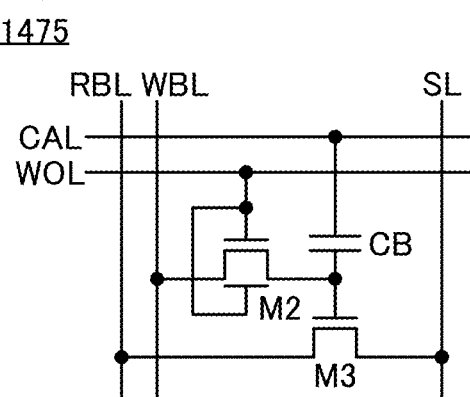
Figure 31F:
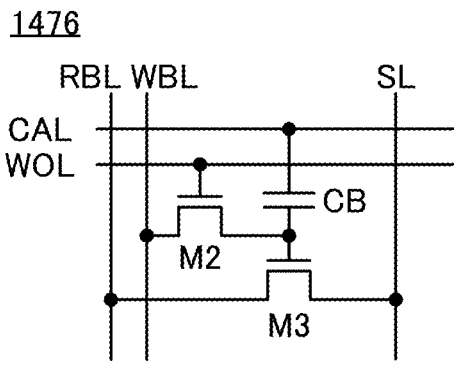
Figure 31G:
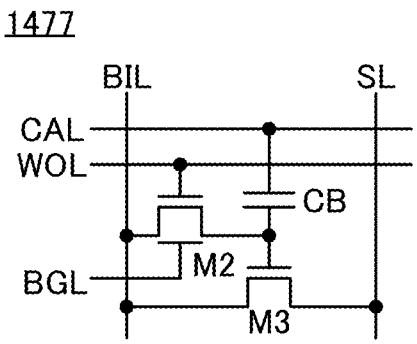

Here, the memory cell 1474 shown in FIG. 31D corresponds to the storage device shown in FIG. 23. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

In addition, the memory cell MC is not limited to the memory cell 1474, and the circuit structure can be changed as appropriate. For example, as in a memory cell 1475 shown in FIG. 31E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 shown in FIG. 31F. For example, the memory cell MC may have a structure in which the wiring WBL and the wiring RBL are combined into one wiring BIL as in a memory cell 1477 shown in FIG. 31G.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with the use of the transistor M2, written data can be retained for a long period of time, and thus the frequency of the refresh operation for the memory cell can be decreased. In addition, refresh operation for the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the storage device can be achieved.

Alternatively, the transistor M3 may be an OS transistor. When OS transistors are used as the transistor M2 and the transistor M3, the circuit of the memory cell array 1470 can be formed using only n-channel transistors.

Figure 31H:
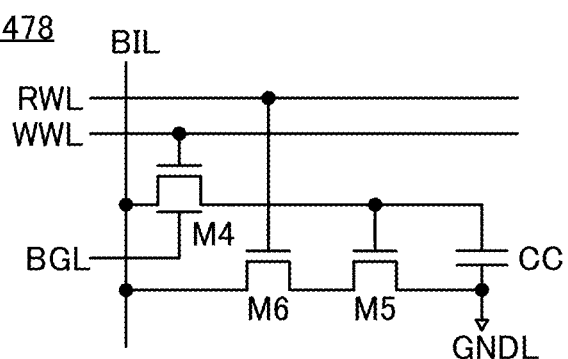

FIG. 31H shows an example of a gain-cell memory cell including three transistors and one capacitor. A memory cell 1478 shown in FIG. 31H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in the above embodiment is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

Figure 32:
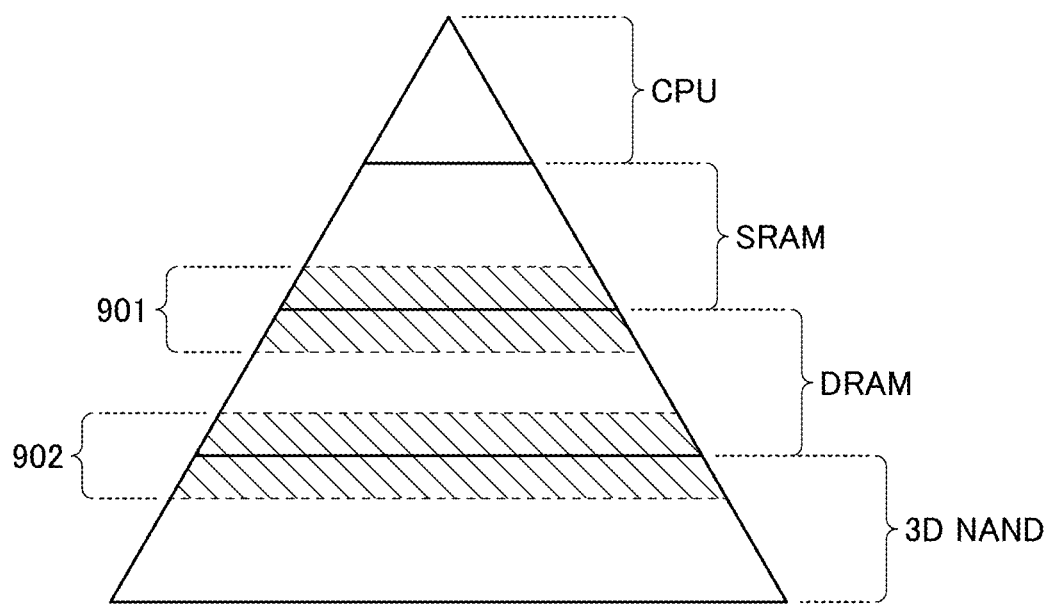
FIG. 32 is a diagram illustrating a hierarchy of storage devices.

In general, a variety of storage devices (memories) are used in semiconductor devices such as a computer in accordance with the intended use. FIG. 32 shows a hierarchy diagram showing various storage devices with different levels. The storage devices at the upper levels of the diagram require high access speeds, and the storage devices at the lower levels require large memory capacity and high record density. In FIG. 32, sequentially from the top level, a memory combined as a register in an arithmetic processing device such as a CPU, an SRAM (Static Random Access Memory), a DRAM (Dynamic Random Access Memory), and a 3D NAND memory are shown.

A memory combined as a register in an arithmetic processing device such as a CPU is used for temporary storage of arithmetic operation results, for example, and thus is very frequently accessed by the arithmetic processing device. Accordingly, rapid operation is more important than the memory capacity of the memory. The register also has a function of retaining setting information of the arithmetic processing device, for example.

An SRAM is used for a cache, for example. The cache has a function of retaining a copy of part of data retained in a main memory. By copying data which is frequently used and holding the copy of the data in the cache, the access speed to the data can be increased.

A DRAM is used for the main memory, for example. The main memory has a function of retaining a program or data which are read from a storage. The record density of a DRAM is approximately 0.1 to 0.3 Gbit/mm$^2$.

A 3D NAND memory is used for a storage, for example. The storage has a function of retaining data that needs to be retained for a long time and programs used in an arithmetic processing device, for example. Therefore, the storage needs to have a high memory capacity and a high record density rather than operating speed. The record density of a storage device used for a storage is approximately 0.6 to 6.0 Gbit/mm$^2$.

The storage device of one embodiment of the present invention operates fast and can retain data for a long time. The storage device of one embodiment of the present invention can be favorably used as a storage device in a boundary region 901 including both the level in which a cache is placed and the level in which s main memory is placed. Alternatively, the storage device of one embodiment of the present invention can be favorably used as a storage device in a boundary region 902 including both the level in which a main memory is placed and the level in which a storage is placed.

The structure described in this embodiment can be used in appropriate combination with the structures described in the other embodiments and the like.

Embodiment 5

In this embodiment, an example of a chip 1200 on which the semiconductor device of the present invention is mounted is described with reference to FIG. 33A and FIG. 33B. A plurality of circuits (systems) are mounted on the chip 1200. A technique for integrating a plurality of circuits (systems) into one chip is referred to as system on chip (SoC) in some cases.

Figure 33A:
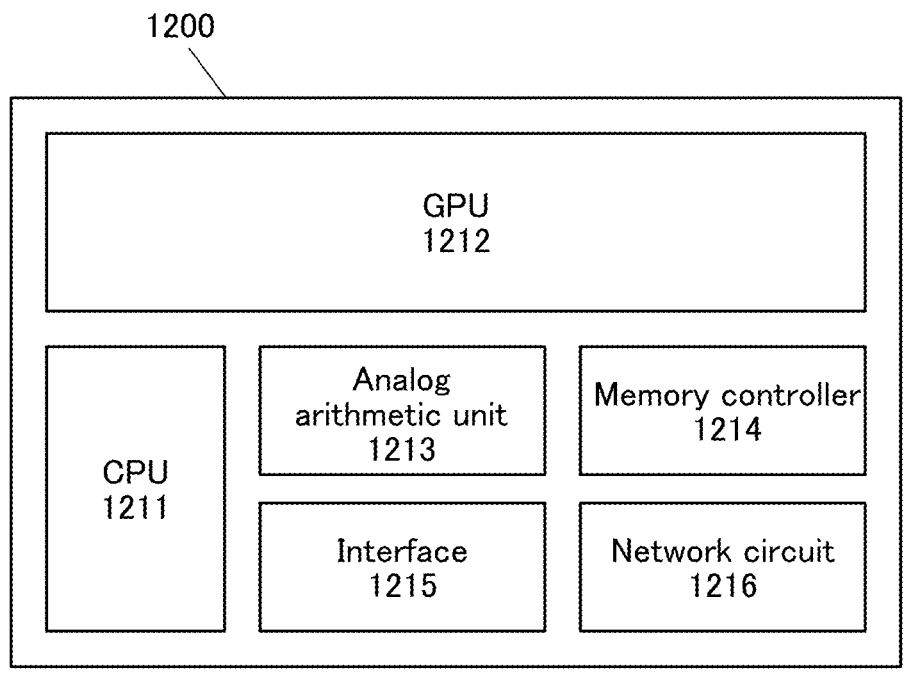
FIG. 33A and FIG. 33B are schematic diagrams of semiconductor devices of embodiments of the present invention.

As shown in FIG. 33A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 33B:
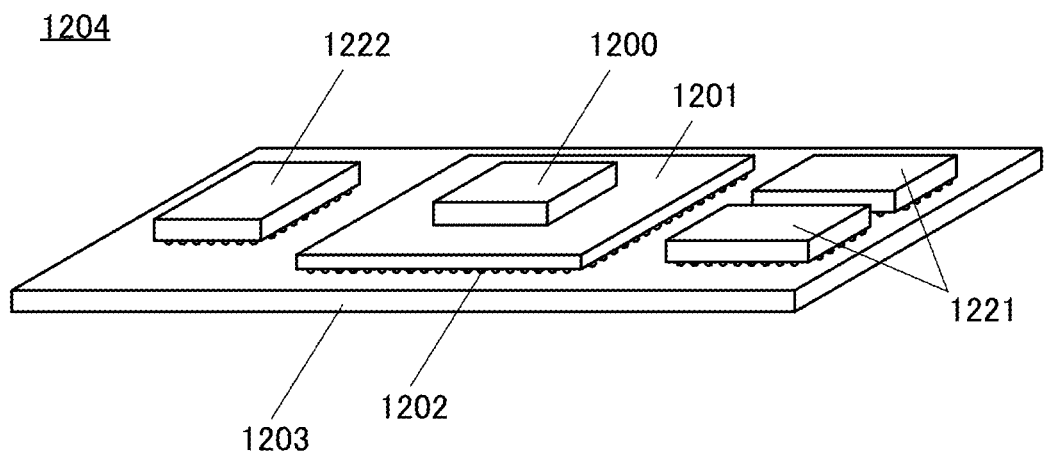

A bump (not shown) is provided on the chip 1200, and as shown in FIG. 33B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Storage devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 6

In this embodiment, examples of electronic components and electronic devices in which the storage device or the like described in the above embodiment is incorporated will be described.

<Electronic Component>

Figure 34A:
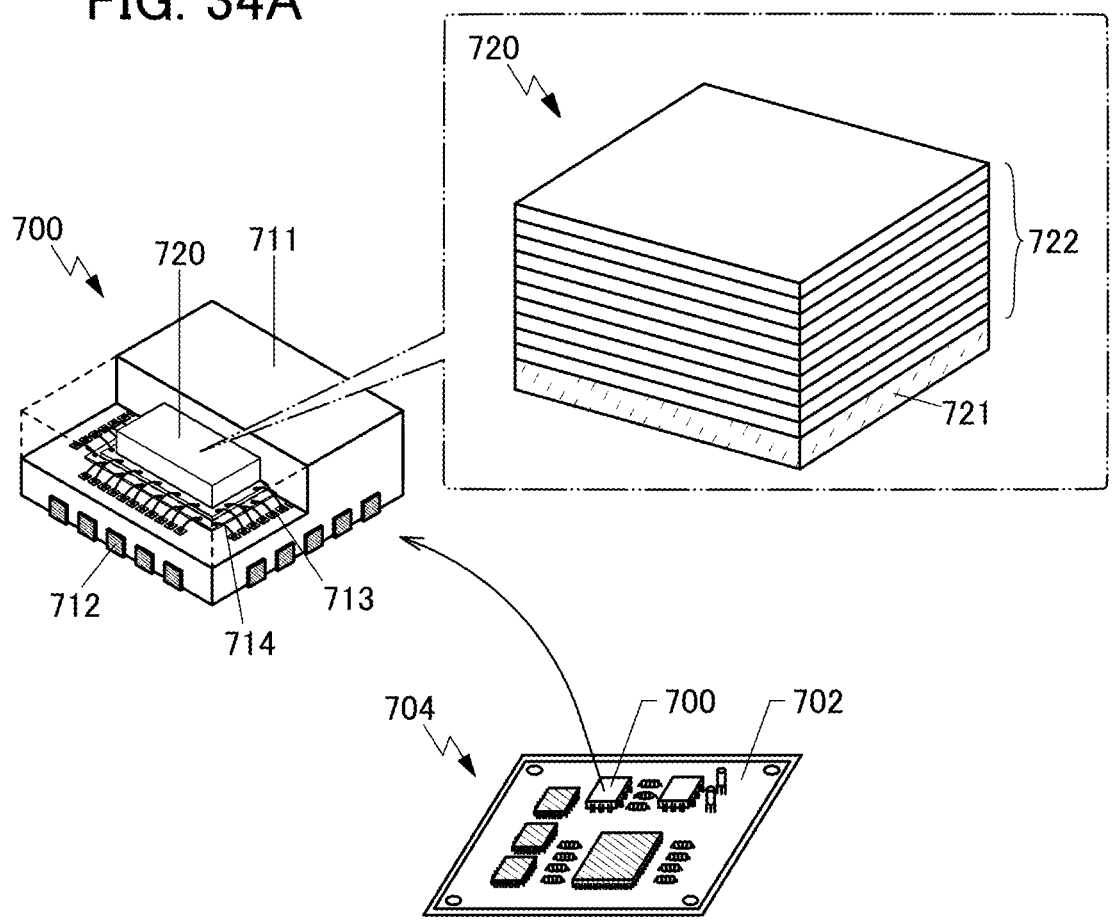
FIG. 34A and FIG. 34B are diagrams illustrating examples of electronic components.
Figure 34B:
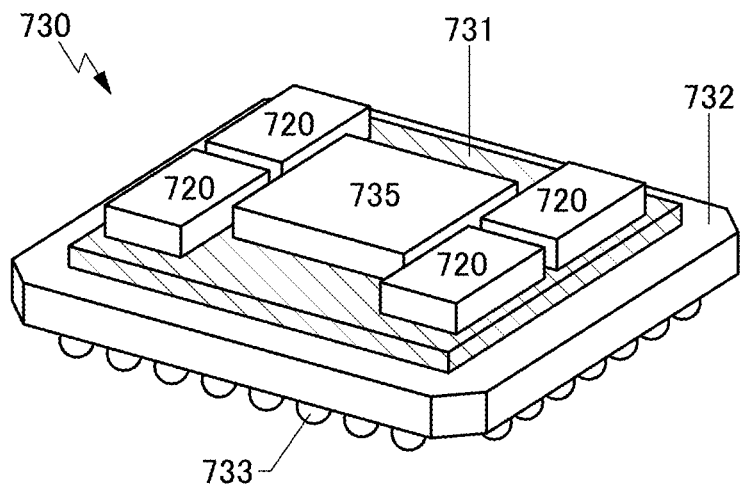

First, FIG. 34A and FIG. 34B show examples of an electronic component including a storage device 720.

FIG. 34A is a perspective view of an electronic component 700 and a substrate (circuit board 704) on which the electronic component 700 is mounted. The electronic component 700 in FIG. 34A includes the storage device 720 in a mold 711. FIG. 34A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 via a wire 714. The electronic component 700 is mounted on a printed circuit board 702, for example. A plurality of such electronic components are combined and electrically connected to each other on the printed circuit board 702, which forms the circuit board 704.

The storage device 720 includes a driver circuit layer 721 and a storage circuit layer 722.

FIG. 34B is a perspective view of an electronic component 730. The electronic component 730 is an example of a SiP (System in package) or an MCM (Multi Chip Module). In the electronic component 730, an interposer 731 is provided over a package substrate 732 (printed circuit board) and a semiconductor device 735 and a plurality of storage devices 720 are provided over the interposer 731.

The electronic component 730 using the storage device 720 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 to be used for electrically connecting the integrated circuit and the package substrate 732. In the case of using a silicon interposer, a through-silicon via (TSV) can also be used as the through electrode.

A silicon interposer is preferably used as the interposer 731. The silicon interposer can be manufactured at lower cost than an integrated circuit because the silicon interposer is not necessarily provided with an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon is less likely to occur. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In the case of providing a heat sink, the heights of integrated circuits provided on the interposer 731 are preferably equal to each other. In the electronic component 730 of this embodiment, the heights of the storage device 720 and the semiconductor device 735 are preferably equal to each other, for example.

An electrode 733 may be provided on the bottom portion of the package substrate 732 to mount the electronic component 730 on another substrate. FIG. 34B shows an example in which the electrode 733 is formed of a solder ball. Solder balls are provided in a matrix on the bottom portion of the package substrate 732, whereby a BGA (Ball Grid Array) can be achieved. Alternatively, the electrode 733 may be formed of a conductive pin. When conductive pins are provided in a matrix on the bottom portion of the package substrate 732, a PGA (Pin Grid Array) can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be implemented in combination with any of the structures described in the other embodiments and the like, as appropriate.

Embodiment 7

In this embodiment, application examples of the storage device using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 35A to FIG. 35E schematically show some structure examples of removable storage devices. The semiconductor device described in the above embodiment is processed into a packaged memory chip and used in a variety of storage devices and removable memories, for example.

Figure 35A:
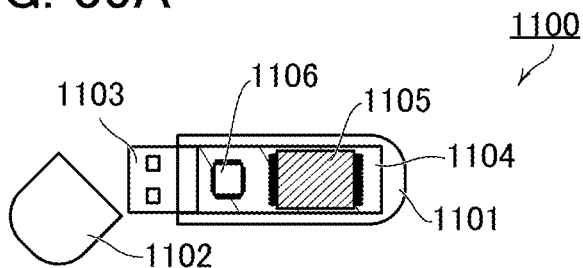
FIG. 35A to FIG. 35E are schematic diagrams of storage devices of embodiments of the present invention.

FIG. 35A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figure 35B:
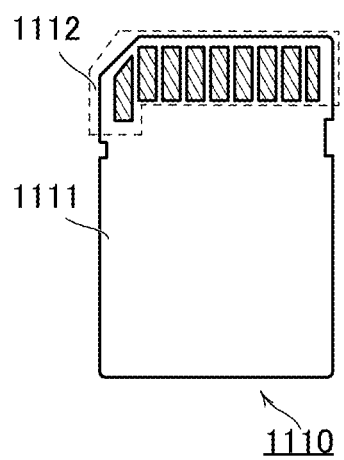
Figure 35C:
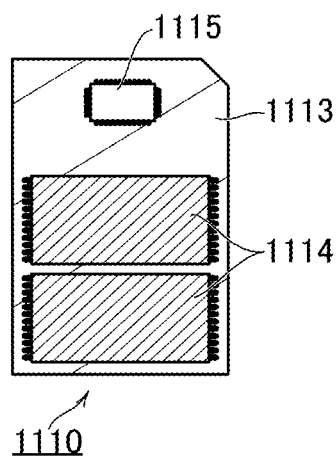

FIG. 35B is a schematic external view of an SD card, and FIG. 35C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figure 35D:
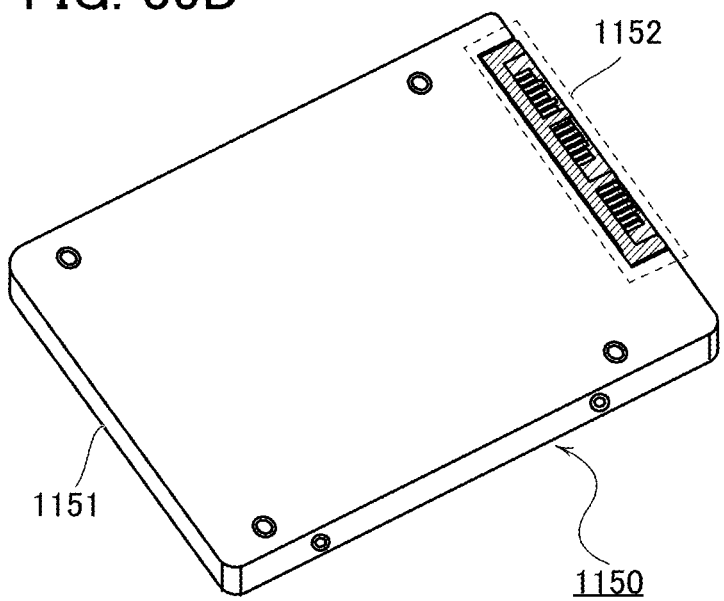
Figure 35E:
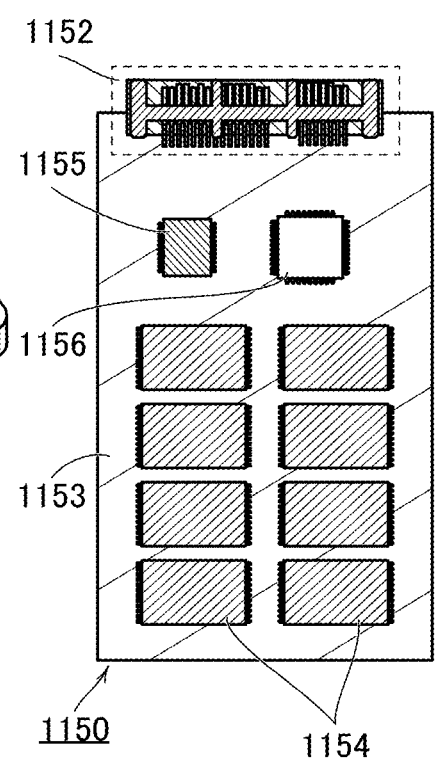

FIG. 35D is a schematic external view of an SSD, and FIG. 35E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in combination with any of the structures described in the other embodiments and the like, as appropriate.

Embodiment 8

The semiconductor device of one embodiment of the present invention can be used as a processor such as a CPU and a GPU or a chip. FIG. 36A to FIG. 36H show specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 36A to FIG. 36H show examples of electronic devices.

[Information Terminal]

Figure 36A:
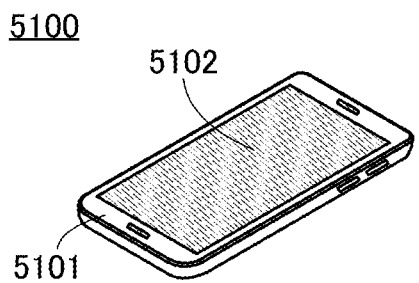
FIG. 36A to FIG. 36H are diagrams illustrating electronic devices of embodiments of the present invention.

FIG. 36A shows a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 36B:
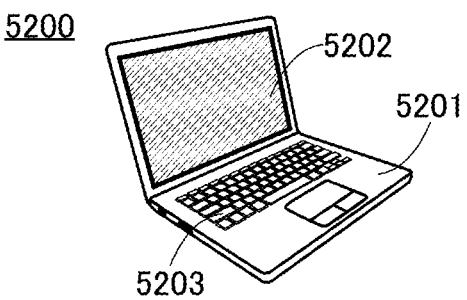

FIG. 36B shows a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 36A and FIG. 36B show a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 36C:
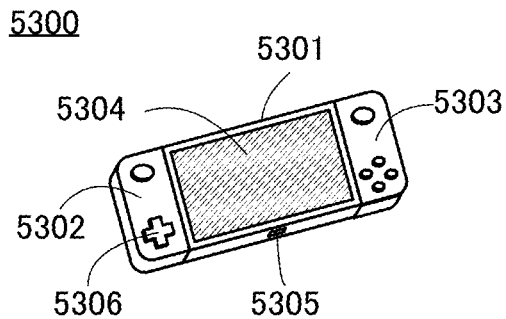

FIG. 36C shows a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to another video device (not shown). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 36D:
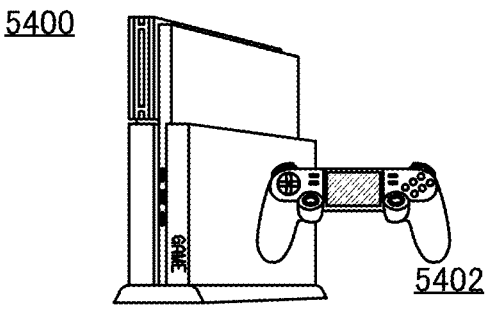

FIG. 36D shows a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 36C and FIG. 36D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 36E:
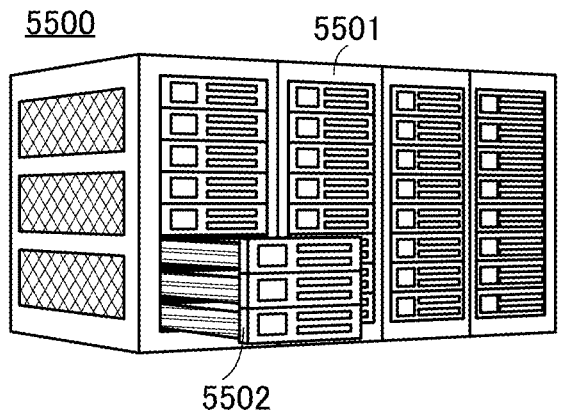
Figure 36F:
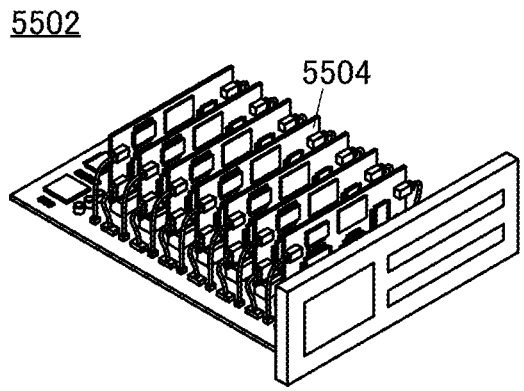

FIG. 36E shows a supercomputer 5500 as an example of a large computer. FIG. 36F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 36E and FIG. 36F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 36G:
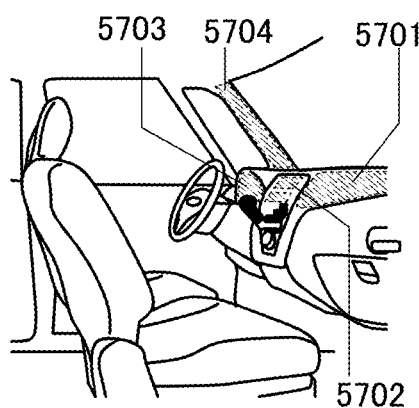

FIG. 36G shows an area around a windshield inside an automobile, which is an example of a moving vehicle. FIG. 36G shows a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 36H:
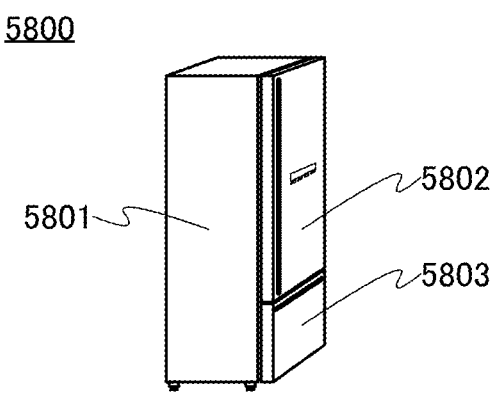

FIG. 36H shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in combination with any of the structures described in the other embodiments and the like, as appropriate.

REFERENCE NUMERALS

M1: transistor, M2: transistor, M3: transistor, M4: transistor, M5: transistor, M6: transistor, 100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, 200_n: transistor, 200_1: transistor, 200a: transistor, 200b: transistor, 200T: transistor, 205: conductor, 205a: conductor, 205b: conductor, 210: insulator, 212: insulator, 214: insulator, 216: insulator, 217: insulator, 218: conductor, 222: insulator, 224: insulator, 230: oxide, 230a: oxide, 230A: oxide film, 230b: oxide, 230B: oxide film, 230c: oxide, 230C: oxide film, 230d: oxide, 230D: oxide film, 240: conductor, 240a: conductor, 240b: conductor, 241: insulator, 241a: insulator, 241b: insulator, 242: conductor, 242a: conductor, 242A: conductive film, 242b: conductor, 242B: conductive layer, 242c: conductor, 243: oxide, 243a: oxide, 243A: oxide film, 243b: oxide, 243B: oxide layer, 246: conductor, 246a: conductor, 246b: conductor, 248: conductive layer, 248A: conductive film, 250: insulator, 250A: insulating film, 260: conductor, 260a: conductor, 260A: conductive film, 260b: conductor, 260B: conductive film, 265: sealing portion, 265a: sealing portion, 265b: sealing portion, 271: insulator, 271a: insulator, 271A: insulating film, 271b: insulator, 271B: insulating layer, 271c: insulator, 272: insulator, 274: insulator, 280: insulator, 282: insulator, 283: insulator, 286: insulator, 290: semiconductor device, 292: capacitor device, 292a: capacitor device, 292b: capacitor device, 294: conductor, 294a: conductor, 294b: conductor, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 411: element layer, 413: transistor layer, 415: memory device layer, 415_1: memory device layer, 415_3: memory device layer, 415_4: memory device layer, 420: memory device, 424: conductor, 440: conductor, 470: memory unit, 600: semiconductor device, 601: semiconductor device, 610: cell array, 610_n: cell array, 610_1: cell array, 700: electronic component, 702: printed circuit board, 704: circuit board, 711: mold, 712: land, 713: electrode pad, 714: wire, 720: storage device, 721: driver circuit layer, 722: storage circuit layer, 730: electronic component, 731: interposer, 732: package substrate, 733: electrode, 735: semiconductor device, 901: boundary region, 902: boundary region, 1001: wiring, 1002: wiring, 1003: wiring, 1004: wiring, 1005: wiring, 1006: wiring.

The invention claimed is:

1. A method for manufacturing a semiconductor device, comprising the steps of:

depositing a first insulator;

depositing a first oxide film, a second oxide film, and a third oxide film in this order over the first insulator;

performing first heat treatment;

depositing a first conductive film, a first insulating film, and a second conductive film in this order over the third oxide film;

processing the first oxide film, the second oxide film, the third oxide film, the first conductive film, the first insulating film, and the second conductive film into island shapes to form a first oxide, a second oxide, a first oxide layer, a first conductive layer, a first insulating layer, and a second conductive layer;

removing the second conductive layer;

depositing a fifth insulator over the first insulator, the first oxide, the second oxide, the first oxide layer, the first conductive layer, and the first insulating layer;

depositing a sixth insulator over the fifth insulator;

forming an opening reaching the second oxide in the first oxide layer, the first conductive layer, the first insulating layer, the fifth insulator, and the sixth insulator;

forming, through the formation of the opening, a third oxide and a fourth oxide from the first oxide layer, a first conductor and a second conductor from the first conductive layer, and a seventh insulator and an eighth insulator from the first insulating layer;

performing second heat treatment;

depositing a fourth oxide film over the sixth insulator and in the opening;

depositing a fifth oxide film over the fourth oxide film;

removing, by a dry etching method, the fourth oxide film and the fifth oxide film deposited on side surfaces of the fifth insulator to the eighth insulator in the opening;

removing the fourth oxide film and the fifth oxide film over the sixth insulator;

forming a fifth oxide and a sixth oxide by leaving the fourth oxide film and the fifth oxide film on a bottom portion of the opening;

depositing a second insulating film over the sixth oxide and the sixth insulator;

depositing a third conductive film over the second insulating film; and forming a ninth insulator and a third conductor in the opening by polishing the third conductive film and the second insulating film by a CMP method until the sixth insulator is reached.

2. The method for manufacturing a semiconductor device according to claim 1,
wherein the dry etching method is performed at a pressure of higher than or equal to 66.5 Pa.

3. A method for manufacturing a semiconductor device, comprising the steps of:

depositing a first insulator;

depositing a first oxide film, a second oxide film, and a third oxide film in this order over the first insulator;

depositing a first conductive film, a first insulating film, and a second conductive film in this order over the third oxide film;

processing the first oxide film, the second oxide film, the third oxide film, the first conductive film, the first insulating film, and the second conductive film into island shapes to form a first oxide, a second oxide, a first oxide layer, a first conductive layer, a first insulating layer, and a second conductive layer;

removing the second conductive layer;

depositing a fifth insulator over the first insulator, the first oxide, the second oxide, the first oxide layer, the first conductive layer, and the first insulating layer;

depositing a sixth insulator over the fifth insulator;

forming an opening reaching the second oxide in the first oxide layer, the first conductive layer, the first insulating layer, the fifth insulator, and the sixth insulator;

forming, through the formation of the opening, a third oxide and a fourth oxide from the first oxide layer, a first conductor and a second conductor from the first conductive layer, and a seventh insulator and an eighth insulator from the first insulating layer;

depositing a fourth oxide film over the sixth insulator and in the opening;

depositing a fifth oxide film over the fourth oxide film;

removing, by a dry etching method, the fourth oxide film and the fifth oxide film deposited on side surfaces of the fifth insulator to the eighth insulator in the opening;

removing the fourth oxide film and the fifth oxide film over the sixth insulator;

forming a fifth oxide and a sixth oxide by leaving the fourth oxide film and the fifth oxide film on a bottom portion of the opening;

depositing a second insulating film over the sixth oxide and the sixth insulator;

depositing a third conductive film over the second insulating film; and forming a ninth insulator and a third conductor in the opening by polishing the third conductive film and the second insulating film by a CMP method until the sixth insulator is reached.

4. The method for manufacturing a semiconductor device according to claim 3,
wherein the dry etching method is performed at a pressure of higher than or equal to 66.5 Pa.

* * * * *